US006992327B2

(12) United States Patent
Tone et al.

(10) Patent No.: US 6,992,327 B2
(45) Date of Patent: Jan. 31, 2006

(54) MONITOR PATTERN OF SEMICONDUCTOR DEVICE AND METHOD OF MANUFACTURING SEMICONDUCTOR DEVICE

(75) Inventors: Sachie Tone, Kawasaki (JP); Hiroyuki Uno, Kawasaki (JP); Naoki Tanahashi, Kawasaki (JP); Naoki Nishida, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 4 days.

(21) Appl. No.: 10/447,956

(22) Filed: May 30, 2003

(65) Prior Publication Data

US 2003/0222260 A1    Dec. 4, 2003

(30) Foreign Application Priority Data

Jun. 3, 2002  (JP) ............................. 2002-162061

(51) Int. Cl.
  *H01L 23/58*  (2006.01)
(52) U.S. Cl. ..................... 257/48; 257/379; 257/543; 257/536
(58) Field of Classification Search ................. 257/48, 257/379, 380, 516, 536–538, 543, 758; 438/11, 438/14, 15, 18, 200, 210, 382, 332, 383
  See application file for complete search history.

(56) References Cited

U.S. PATENT DOCUMENTS

| 5,256,589 | A | * | 10/1993 | Hozumi ..................... 438/384 |
| 5,502,431 | A | * | 3/1996 | Usui ......................... 338/308 |
| 6,172,389 | B1 | * | 1/2001 | Sakoh ........................ 257/296 |
| 6,403,979 | B1 | * | 6/2002 | Kadosh et al. ................ 257/48 |
| 6,472,701 | B2 | * | 10/2002 | Yaegashi et al. ........... 257/296 |
| 6,518,642 | B2 | * | 2/2003 | Kim et al. .................. 257/528 |
| 6,559,055 | B2 | * | 5/2003 | Tuan et al. ................. 438/692 |
| 6,611,042 | B2 | * | 8/2003 | Haruhana et al. ........... 257/536 |
| 6,784,548 | B2 | * | 8/2004 | Kouno et al. ............... 257/758 |
| 6,787,799 | B2 | * | 9/2004 | Asam et al. .................. 257/48 |

* cited by examiner

*Primary Examiner*—Eugene Lee
(74) *Attorney, Agent, or Firm*—Westerman, Hattori, Daniels & Adrian, LLP

(57) ABSTRACT

A plurality of diffused resistors and a plurality of wirings (resistive elements) are alternately disposed along a virtual line, and those diffused resistors and wirings are connected in series by contact vias. In the same wiring layer as that of the wirings, a dummy pattern is formed so as to surround a formation region of the wirings and the diffused resistors. A space between the dummy pattern and the wirings is set in accordance with, for example, a minimum space between wirings in a chip formation portion.

13 Claims, 85 Drawing Sheets

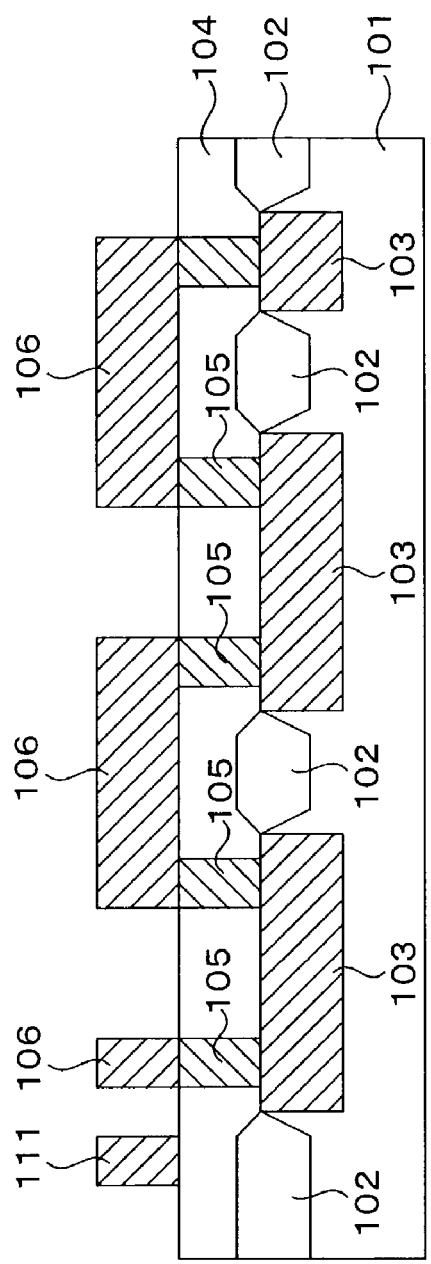
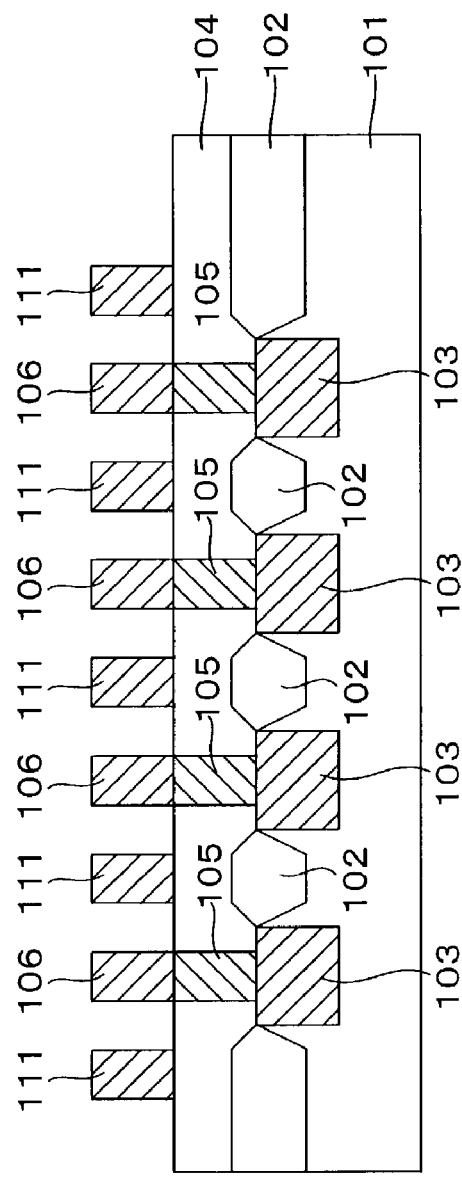
FIG. 10A
FIG. 10B

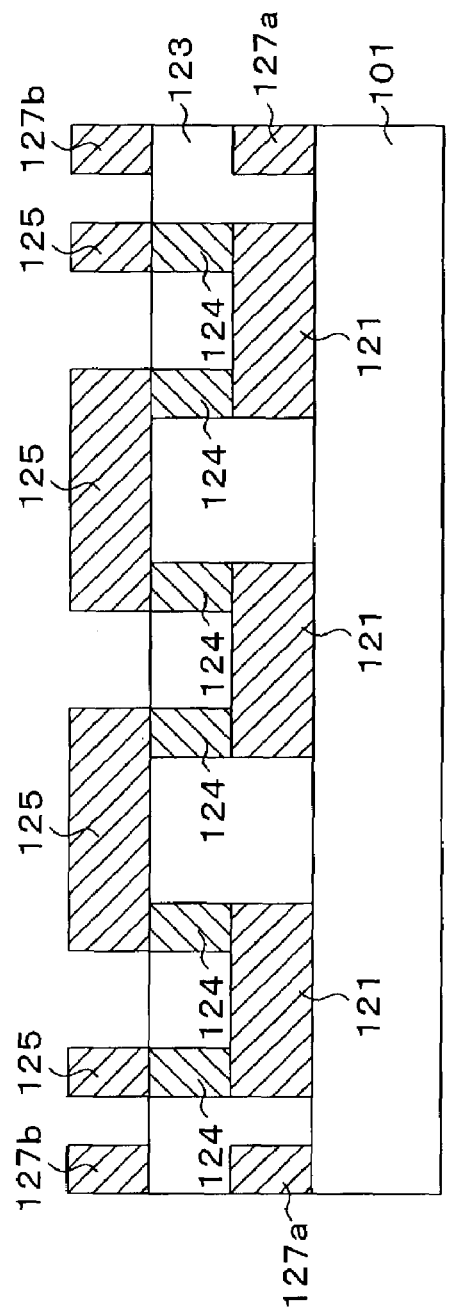
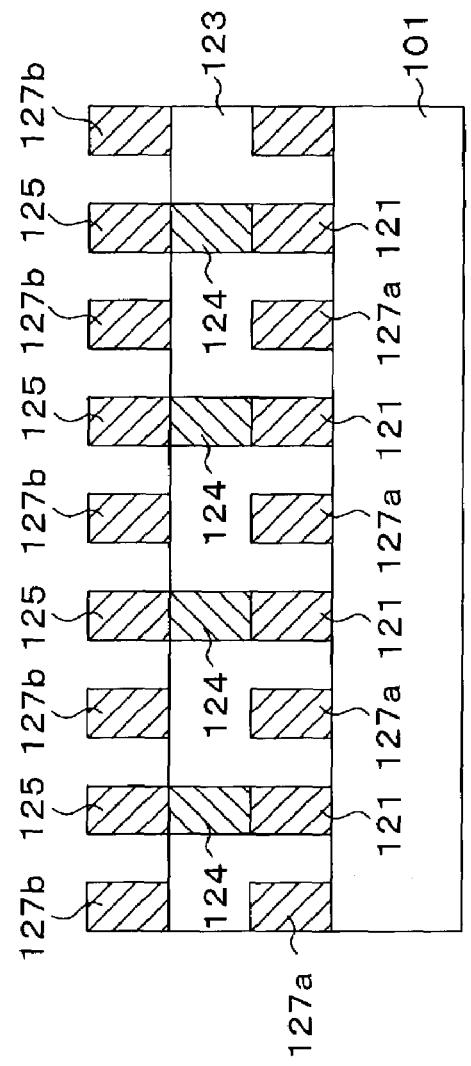
FIG. 17A
FIG. 17B

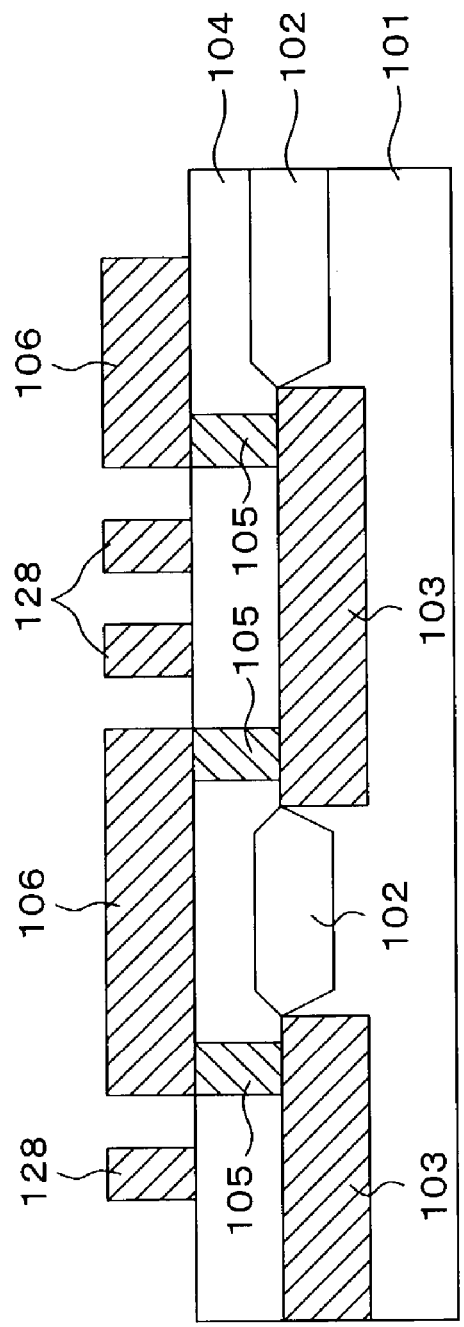
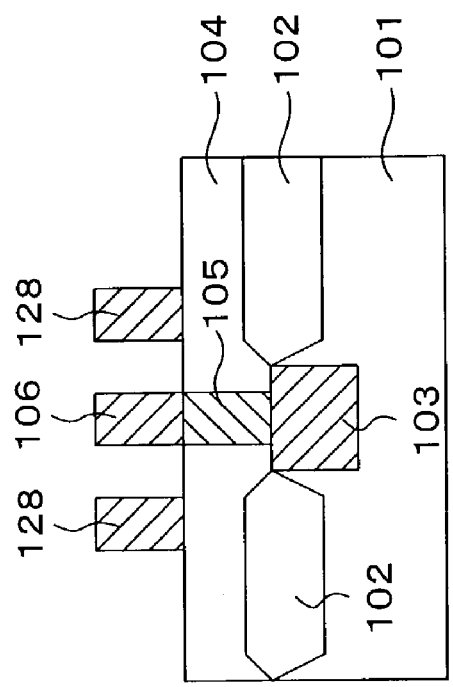
FIG. 19A
FIG. 19B

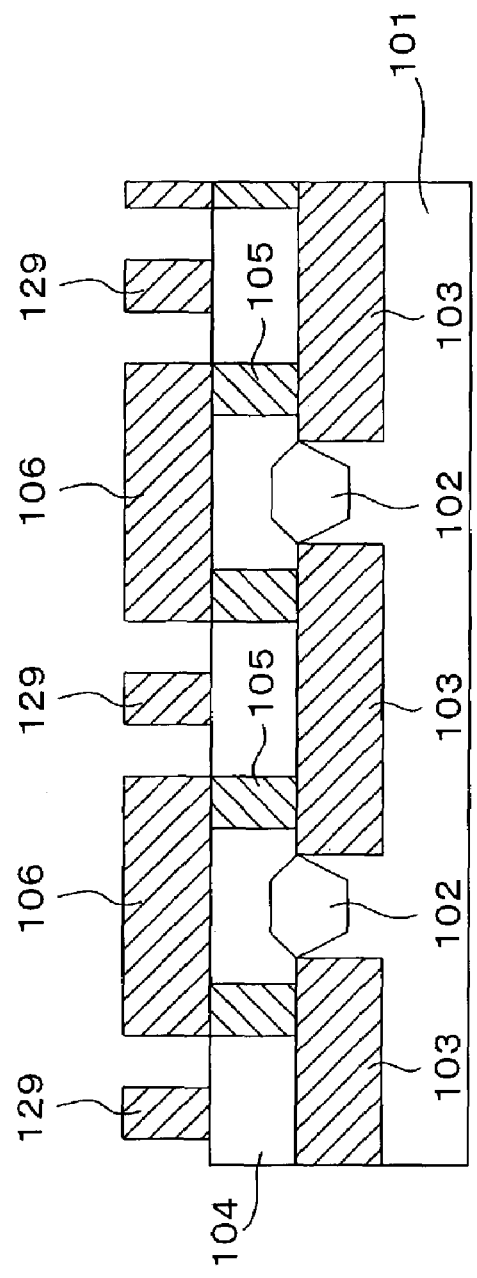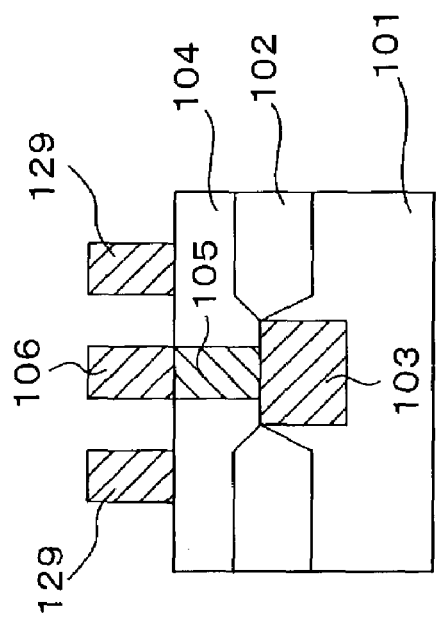
FIG. 21A
FIG. 21B

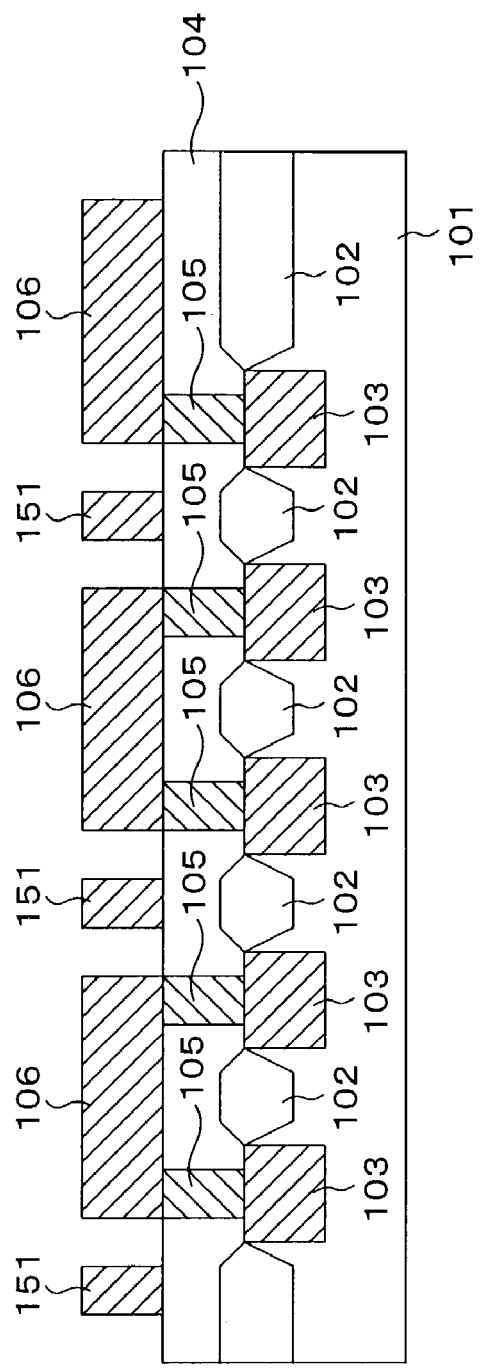
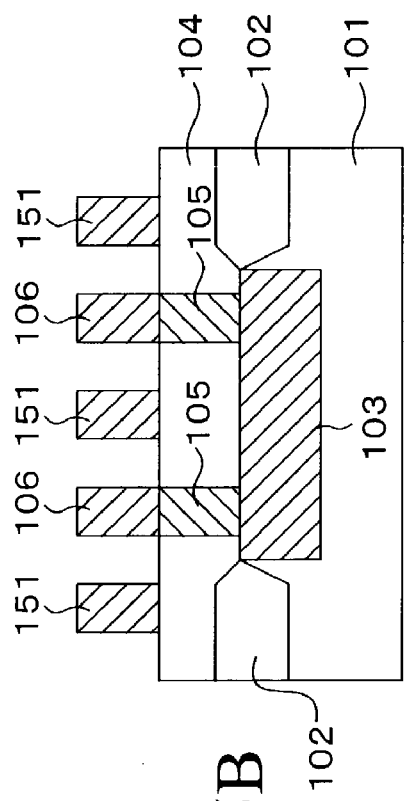
FIG. 35A
FIG. 35B

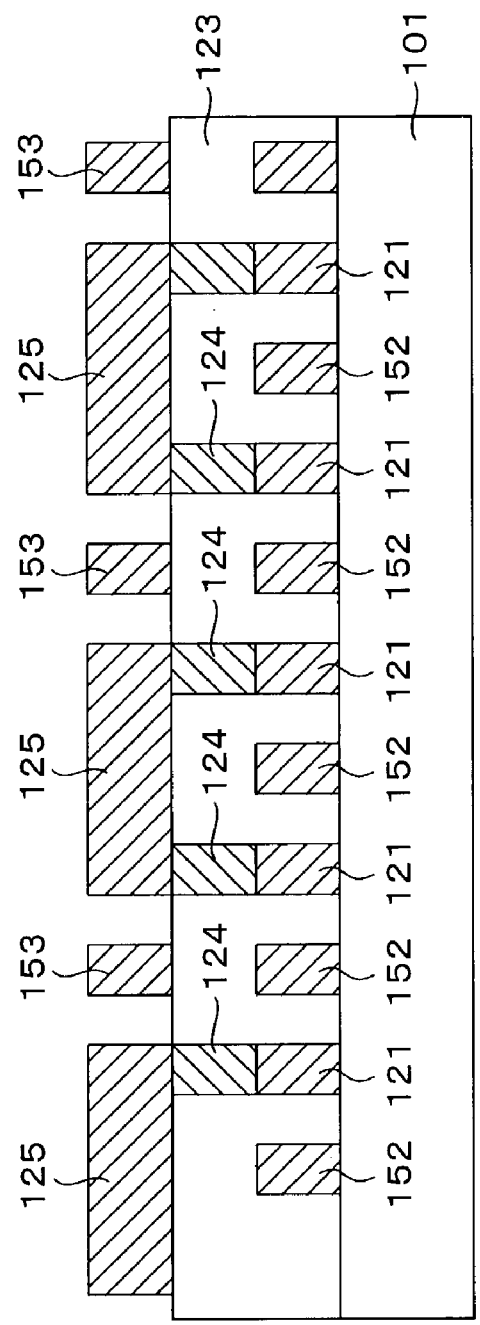
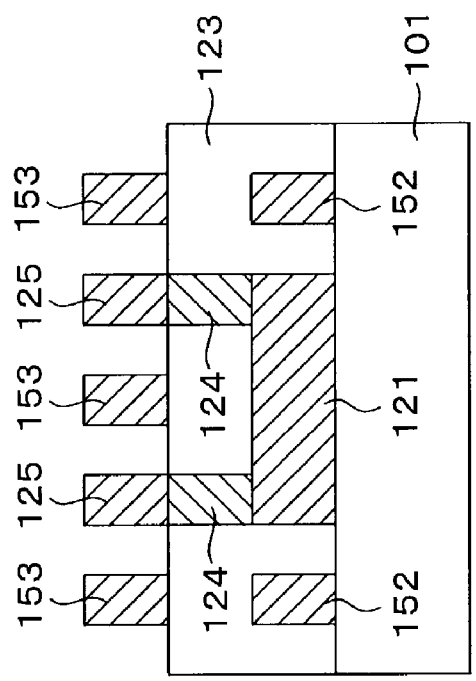
FIG. 37A
FIG. 37B

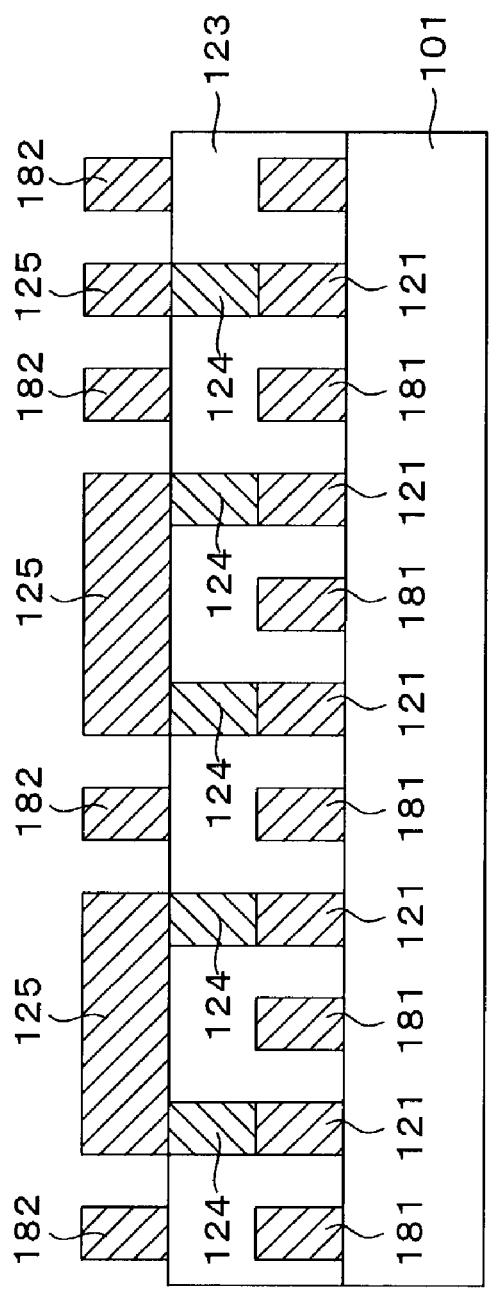
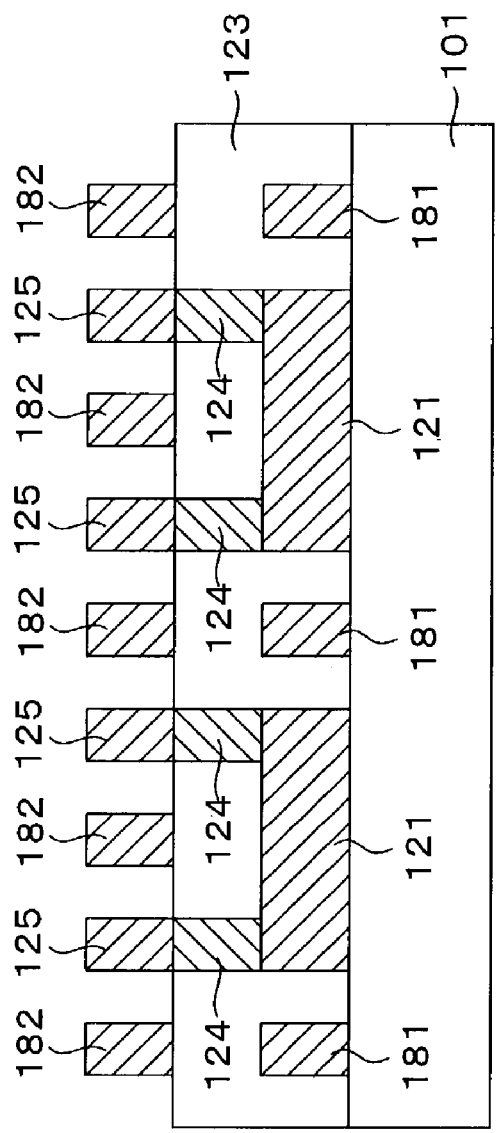
FIG. 45A
FIG. 45B

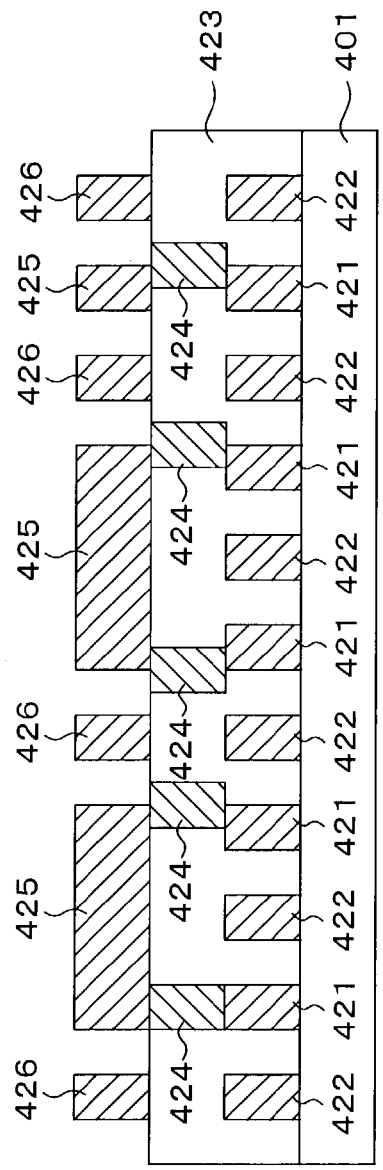
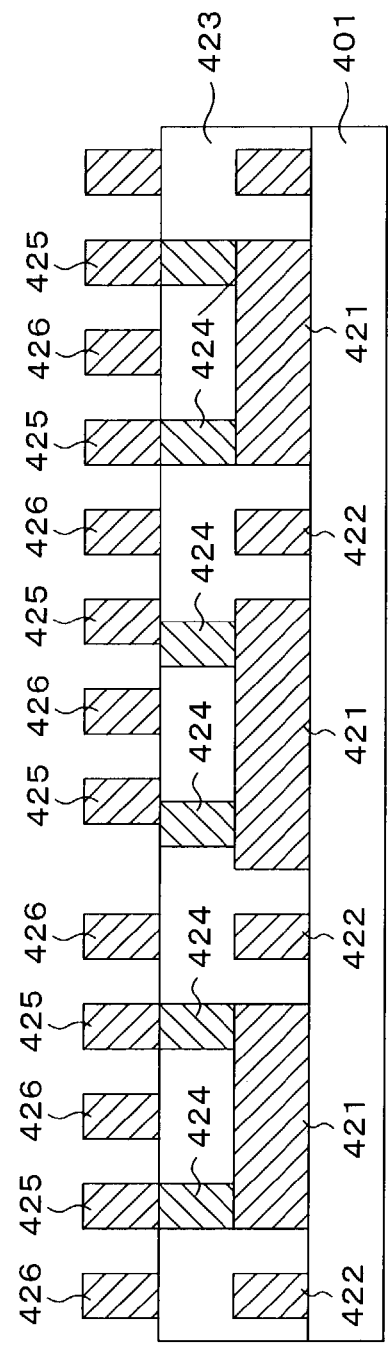
FIG. 80A
FIG. 80B

MONITOR PATTERN OF SEMICONDUCTOR DEVICE AND METHOD OF MANUFACTURING SEMICONDUCTOR DEVICE

CROSS-REFERENCE TO RELATED APPLICATIONS

This application is based upon and claims priority of Japanese Patent Application No. 2002-162061, filed on Jun. 3, 2002, the contents being incorporated herein by reference.

BACKGROUND OF THE INVENTION

1. Field of the Invention

The present invention relates to a monitor pattern of a semiconductor device, which detects abnormality of wiring (including a contact portion) occurring in manufacturing steps of the semiconductor device, and to a method of manufacturing the semiconductor device.

2. Description of the Prior Art

In recent years, along with miniaturization of a semiconductor device, demand for a system LSI has been growing. In the system LSI, because of a great difference in wiring density between a portion where the wiring is not dense and a portion where the wiring is dense, manufacturing conditions are not even between the two portions. Thus, thinning of the wiring, contact failure, disconnection, short-circuiting and the like are likely to occur. Accordingly, an electrically isolated dummy pattern is provided in the portion where the wriring is not dense, thus setting a pattern density in a constant range.

Moreover, in some cases, a monitor pattern is previously provided in a semiconductor substrate (a wafer). The monitor pattern is formed simultaneously with normal wiring and is used in order to electrically examine whether or not a pattern width exceeds its allowable range and whether or not a contact is normal.

FIG. 1A is a top plan view showing an example of a monitor pattern provided in a conventional semiconductor device, and FIG. 1B is a cross-section view thereof.

On a semiconductor substrate 10, an impurity diffusion layer (not shown) constituting elements such as a transistor and the like is formed, and a plurality of wiring layers are formed thereon while sandwiching an interlayer insulation film therebetween. An impurity diffusion region and wirings of the respective wiring layers are connected via contact vias buried in the interlayer insulation film, and thus a predetermined circuit is constituted.

As shown in FIGS. 1A and 1B, the monitor pattern is constituted by: a plurality of lower-layer wirings 11 formed in line on a first interlayer insulation film (not shown); a plurality of upper-layer wirings 14 formed in line on a second interlayer insulation film 12; and contact vias 13 buried in the second interlayer insulation film 12. The respective lower-layer wirings 11 electrically connect the upper-layer wirings 14, which are mutually adjacent with each other via the contact vias 13.

In general, widths of the lower-layer wiring 11 and of the upper-layer wiring 14 are set to be minimum line widths decided on design criteria. For example, as a monitor pattern, one having the lower-layer wiring 11 and upper-layer wiring 14, which are 0.3 $\mu$m in width, 0.9 $\mu$m in length and having the contact vias 13 of which number is set to 100 is currently used.

FIG. 2 is a top plan view showing another example of the conventional monitor pattern. This monitor pattern 16 is constituted by one wiring, which is bent repeatedly. A width of the wiring is set to a minimum line width decided on the design criteria. Conventionally, as a monitor pattern of this kind, for example, one is used, in which the width of the wiring is set to 0.3 $\mu$m and a length (a total length) thereof is set to 100 $\mu$m.

The monitor patterns described above are formed on a scribe line of the wafer, that is, in a region between chip formation portions. Electrical characteristics (such as a resistance value and the like) of the monitor pattern are measured by a detection device. When the electrical characteristics are within a predetermined range, a manufacturing condition can be determined to be appropriate. On the other hand, when the electrical characteristics of the monitor pattern are out of the predetermined range, there is a high possibility that problems occur such as thinning of the wiring, contact failure, short-circuiting, disconnection and the like.

However, the inventors of the present application and the like consider that the conventional monitor pattern described above has a problem described below.

FIG. 3A is a graph showing a relationship between a pattern occupying ratio, which is indicated by a horizontal axis, and a frequency of constrictions generated in a wiring, which is indicated by a vertical axis. In the case where a space between a wiring and a peripheral wiring of it is large (large space), even if the pattern occupying ratio is small, the constriction is not generated. However, in the case where the space between a wiring and a peripheral wiring of it is small (small space), when the pattern occupying ratio is small, a constriction (an undercut) 23 of a wiring as shown in FIG. 3B is generated. Note that, in FIG. 3B, reference numeral 21 indicates a barrier metal and reference numeral 22 indicates an Al (aluminum) wiring.

The above problem can be conceived as below. Specifically, when a wiring is formed by dry etching, an organic substance (an organic substance released from a resist film) covers a sidewall of the wiring, as the etching is performed, and protects the wiring from an etching gas. Particularly, in the case of using Al (aluminum) as a wiring material, since Al is apt to react to Cl (chlorine) in the etching gas, it is necessary to cover the entire sidewall of the wiring 22 with the organic substance.

However, when the pattern occupying ratio (a wiring occupying area) is small, an amount of the organic substance supplied from the resist film is relatively decreased. Thus, it becomes impossible to cover a lower portion of the Al wiring 22 with the organic substance. As a result, as shown in FIG. 3B, the constriction 23 is generated in the lower portion of the Al wiring 22.

Because the monitor pattern is formed in a place away from the chip formation portion, such as on the scribe line, a space between the monitor pattern and other patterns is large, thus making it difficult for the constriction to be generated. On the other hand, in the chip formation portion, the space therebetween is small, and thus the constriction is likely to be generated. Therefore, even if no abnormality is detected by the electrical examination of the monitor pattern, it cannot be completely said that there is no abnormality in the wiring in the chip formation portion.

FIGS. 4A and 4B are top plan views showing examples of patterns, respectively, in which failure is likely to occur. FIGS. 4C and 4D are perspective views thereof, respectively. As shown in the drawings, as for patterns 31a and 31b surrounded by other patterns 32a and 32b, respectively, in circled portions the constriction is likely to be generated, the constriction being dependent on the pattern occupying ratio, as shown in FIG. 3B.

A wiring structure which is considered most likely to lead to failure includes, as shown in FIG. 5, a portion where a lower-layer wiring (Al wiring) 42 and an upper-layer wiring (Al wiring) 46 are connected by use of a contact via 44. Usually, a barrier metal 41 is formed below the lower-layer wiring 42, and a reflection preventing film (for example, a TiN film) 43 is formed thereon. Moreover, a barrier metal 45 is also formed below the upper-layer wiring 46, and a reflection preventing film 47 is formed thereon. In such portions, constrictions are generated in an upper portion of the lower-layer wiring 42 (below the reflection preventing film 43) and in a lower portion of the upper-layer wiring 46 (above the barrier metal 45). Accordingly, contact resistance between the lower-layer wiring 42 and the upper-layer wiring 46 is increased, thus leading to a defective product in extreme cases.

However, as described above, the electrical examination by use of the conventional monitor pattern may not be able to detect abnormality of the wiring in the chip formation portion. Thus, necessity of cross-section observation and the like arises in order to identify the cause of the failure. Therefore, a lot time is required to examine the cause and take measures therefor, resulting in a delay of a feedback into manufacturing steps.

SUMMARY OF THE INVENTION

In consideration for the above, an object of the present invention is to provide a monitor pattern of a semiconductor device, which is capable of more accurately detecting abnormality of wiring and a contact portion in a chip formation portion, and to provide a method of manufacturing a semiconductor device using the monitor pattern.

The monitor pattern of the semiconductor device according to the present invention includes: a resistive element formed on a semiconductor substrate; and a dummy pattern formed close to the resistive element in the same wiring layer as that of the resistive element.

In the present invention, the dummy pattern is formed close to the resistive element. The resistive element and the dummy pattern are formed by use of, for example, the same material as that of the wiring in the chip formation portion. Then, a space between the resistive element and the dummy pattern is set to a minimum space between wirings (or a minimum space between wirings in the chip formation portion), which is decided based on design criteria, for example. Thus, an occurrence rate of constrictions and contact abnormality in the monitor pattern becomes equal to that in the chip formation portion. Therefore, when abnormality is detected in the wiring or in the contact portion by performing electrical examination on the monitor pattern, there is a high possibility that the abnormality of the wiring or the contact portion also occurs in the chip formation portion. Thus, the monitor pattern enables a relatively accurate conjecture as to the presence of the abnormality in the chip formation portion. Then, a result thereof is fed back to manufacturing steps, and an appropriate manufacturing condition is maintained. Thus, a quality of the semiconductor device is improved, and a manufacturing yield is also improved.

BRIEF DESCRIPTION OF THE DRAWINGS

FIG. 10A is a cross-section view along I—I line of FIG. 9, and FIG. 10B is a cross-section view along II—II line of FIG. 9.

FIG. 17A is a cross-section view along I—I line of FIG. 16, and FIG. 17B is a cross-section view along II—II line of FIG. 16.

FIG. 19A is a cross-section view along I—I line of FIG. 18, and FIG. 19B is a cross-section view along II—II line of FIG. 18.

FIG. 21A is a cross-section view along I—I line of FIG. 20, and FIG. 21B is a cross-section view along II—II line of FIG. 20.

FIG. 35A is a cross-section view along I—I line of FIG. 34, and FIG. 35B is a cross-section view along II—II line of FIG. 34.

FIG. 37A is a cross-section view along I—I line of FIG. 36, and FIG. 37B is a cross-section view along II—II line of FIG. 36.

FIG. 45A is a cross-section view along I—I line of FIG. 44, and FIG. 45B is a cross-section view along II—II line of FIG. 44.

FIG. 80A is a cross-section view along I—I line of FIG. 79, and FIG. 80B is a cross-section view along II—II line of FIG. 79.

DESCRIPTION OF THE PREFERRED EMBODIMENT

Hereinafter, description will be made for embodiments of the present invention with reference to the accompanying drawings.

(First Embodiment)

Figure 6:
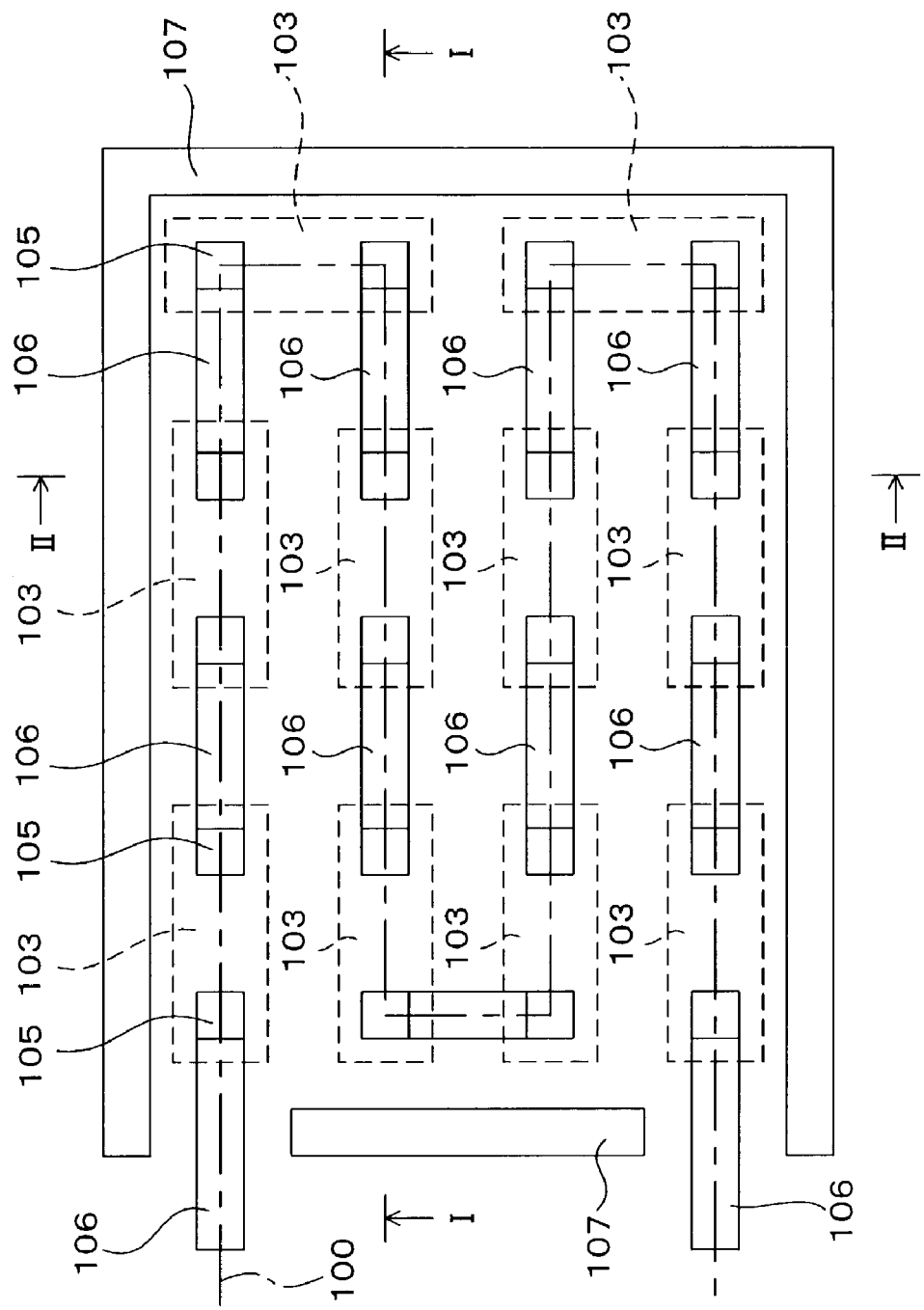
FIG. 6 is a top plan view showing a monitor pattern of a semiconductor device of a first embodiment of the present invention.
Figure 7A:
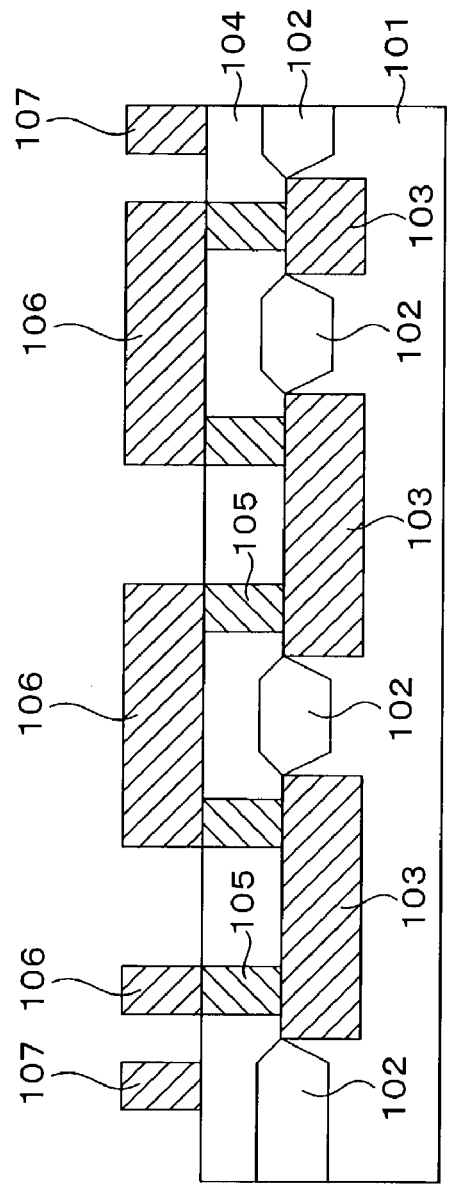
FIG. 7A is a cross-section view along I—I line of FIG. 6.
Figure 7B:
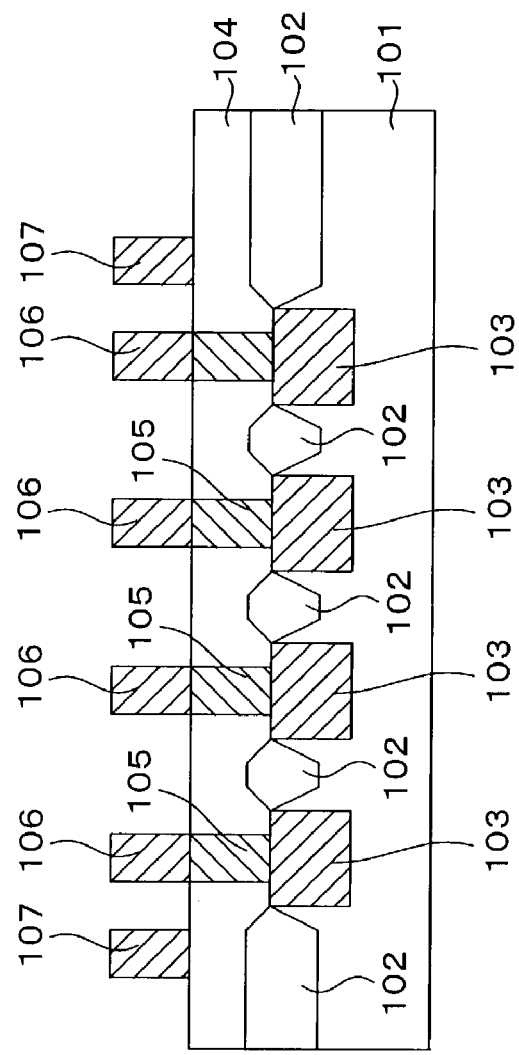
FIG. 7B is a cross-section view along II—II line of FIG. 6.

FIG. 6 is a top plan view showing a monitor pattern of a semiconductor device of a first embodiment of the present invention. FIG. 7A is a cross-section view along I—I line of FIG. 6, and FIG. 7B is a cross-section view along II—II line of FIG. 6.

A semiconductor substrate (wafer) 101 is separated into a plurality of element regions by an element separation film 102. In the element regions, a plurality of diffused resistors 103 are provided, which are formed by introducing impurities at high concentration into the semiconductor substrate 101. Moreover, on the semiconductor substrate 101, an interlayer insulation film 104 is formed. On this interlayer insulation film 104, a plurality of wirings (resistive elements) 106 are formed.

These diffused resistors 103 and wirings 106 are alternately disposed along one virtual line 100 turning more than once (three times in the drawing). Moreover, in the interlayer insulation film 104, a plurality of contact vias 105 are buried, by which the wirings 106 and the diffused resistors 103 are electrically connected in series.

Furthermore, on the interlayer insulation film 104, a dummy pattern 107 is formed so as to surround a region where such wirings 106 and diffused resistors 103 are formed. This dummy pattern 107 is formed in the same wiring layer as that of the wirings 106. Note that the wirings 106 positioned at ends of the monitor pattern extend out of the dummy pattern 107 through notched portions of the dummy pattern 107.

It is preferable that widths of the wirings 106 and the diffused resistors 103 are set in accordance with a minimum line width decided based on design criteria or a minimum space between wirings in a chip formation portion. Each of the wirings 106 has, for example, a width of 0.3 μm and a length of 0.9 μm. Moreover, each of the diffused resistors 103 has a width of 0.6 μm and a length of 0.9 μm. Furthermore, a space between the wirings 106 and the dummy pattern 107 is preferably set to the minimum space between the wirings, which is decided based on the design criteria. In this example, the space between the wirings 106 and the dummy pattern 107 is 0.3 μm.

The wiring 106 and the dummy pattern 107 are formed in such a manner, for example, that an aluminum film having a thickness of 500 nm is formed on a barrier metal having a thickness of 60 nm (Ti: 10 nm+TiN: 50 nm) and these films are etched by a photolithography method.

Note that a length of the wiring 106 needs to be longer than a minimum space between the contact vias, which is decided based on the design criteria.

Moreover, in etching the space between the wirings 106 and the dummy pattern 107, an aspect ratio to a height of a wiring material including a mask material before the etching (for example, a resist film) is set to 3 or more. When a detection sensitivity of constrictions is to be increased, an aspect ratio of the space between the wirings 106 and the dummy pattern 107 is preferably set to 4.5 or more.

For example, in the case of forming the wirings 106 and the dummy pattern 107 by forming a resist film having a thickness of 1 μm on a conductor film having a thickness of 560 nm (Ti: 10 nm+TiN: 50 nm+Al: 500 nm) and then etching the conductor film, a height of the wiring material including the mask material is 1.56 μm and the space between the wirings 106 and the dummy pattern 107 is 0.3 μm. Thus, the aspect ratio of the space between the wirings 106 and the dummy pattern 107 is 5.2.

The monitor pattern of this embodiment is formed simultaneously with elements, such as a transistor and the like, constituting a semiconductor device and with the wirings. For example, when a source/drain of the transistor is formed, the diffused resistors 103 are formed by introducing impurities also into a diffused resistor formation region. Moreover, the interlayer insulation film 104 is formed simultaneously with an interlayer insulation film covering a gate of the transistor. Furthermore, the contact vias 105 are formed simultaneously with contact vias connected to the source/drain of the transistor. The wirings 106 are formed simultaneously with wirings connecting the elements.

After forming the monitor pattern of this embodiment simultaneously with the semiconductor device as described above, the monitor pattern is electrically examined by use of an examination device, thus determining presence of abnormality in accordance with a result of the examination. Then, the determination result is fed back to manufacturing steps, and an appropriate manufacturing condition (an etching condition and the like) is maintained. Thus, a quality of the semiconductor device is improved and a manufacturing yield is also improved.

In this embodiment, since the dummy pattern 107 is disposed in the vicinity of the wirings 106 constituting the monitor pattern, the detection sensitivity of the constrictions is improved. Thus, more accurate determination of whether or not the constrictions are generated can be made with respect to the wirings formed with high density in the chip formation portion.

Figure 8:
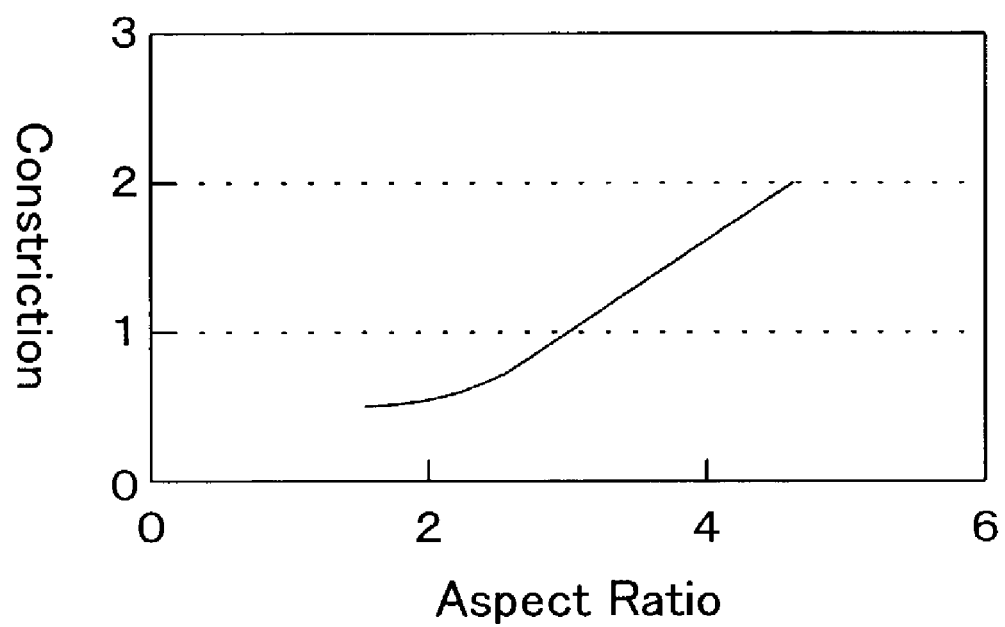
FIG. 8 is a graph showing a result obtained by numerically evaluating possibilities of constriction generation in association with an aspect ratio.

FIG. 8 is a graph showing a result obtained by numerically evaluating possibilities of constriction generation, in which an aspect ratio (an aspect ratio including a mask material before etching) is indicated by a horizontal axis and a constriction generation rate is indicated by a vertical axis. Note that, regarding the constriction generation rate, when the numerical value is 0, there is no possibility of constriction generation, and the larger the value is, the higher the possibility of the constriction generation is. Moreover, the value of 1 or more indicates that the possibility of the constriction generation is high, and the value of 2 or more indicates that the constriction is generated almost certainly. As is clear from FIG. 8, when the aspect ratio is 3, the constriction generation rate is 1, and when the aspect ratio is 4.5, the constriction generation rate is 2.

As described above, the detection sensitivity of the constriction generation can be adjusted by adjusting the space between the wirings 106 and the dummy pattern 107.

(Second Embodiment)

Figure 9:
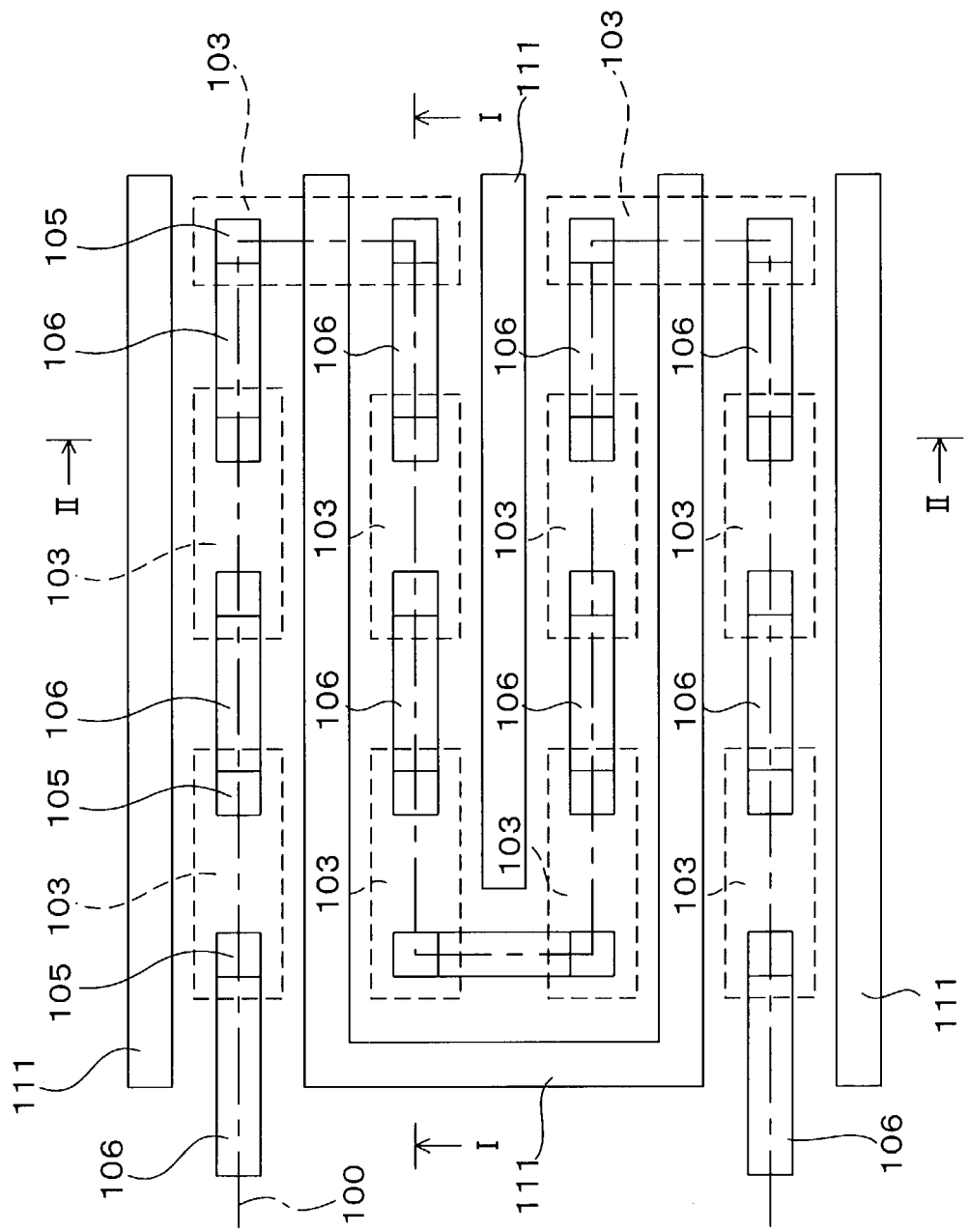
FIG. 9 is a top plan view showing a monitor pattern of a semiconductor device of a second embodiment of the present invention.

FIG. 9 is a top plan view showing a monitor pattern of a semiconductor device of a second embodiment of the present invention. FIG. 10A is a cross-section view along I—I line of FIG. 9, and FIG. 10B is a cross-section view along II—II line of FIG. 9. Note that, in FIGS. 9, 10A and 10B, identical constituent components to those of FIGS. 6, 7A and 7B are denoted by identical reference numerals.

Also in this embodiment, similarly to the first embodiment, the plurality of diffused resistors 103, which are formed by introducing impurities at high concentration into the semiconductor substrate 101, are provided in the semiconductor substrate 101. Moreover, on the interlayer insulation film 104, the plurality of wirings (resistive elements) 106 are formed in lines. These diffused resistors 103 and wirings 106 are alternately disposed along the one virtual line 100 turning more than once (three times in the drawing). Moreover, in the interlayer insulation film 104, the plurality of contact vias 105 are buried, by which the wirings 106 and the diffused resistors 103 are electrically connected in series.

Furthermore, at both sides of each of the wirings 106 in its width direction, dummy patterns 111 extending in a longitudinal direction of the wiring 106 are formed. These dummy patterns 111 are formed in the same wiring layer as that of the wirings 106.

The diffused resistors 103, the contact vias 105 and the wirings 106 are formed simultaneously with the elements and wirings in the chip formation portion.

Also in this embodiment, similarly to the first embodiment, the electrical examination on the monitor pattern makes it possible to give an effect that defects such as thinning of the wirings in the chip formation portion and the like can be detected more surely than the conventional case.

Figure 11:
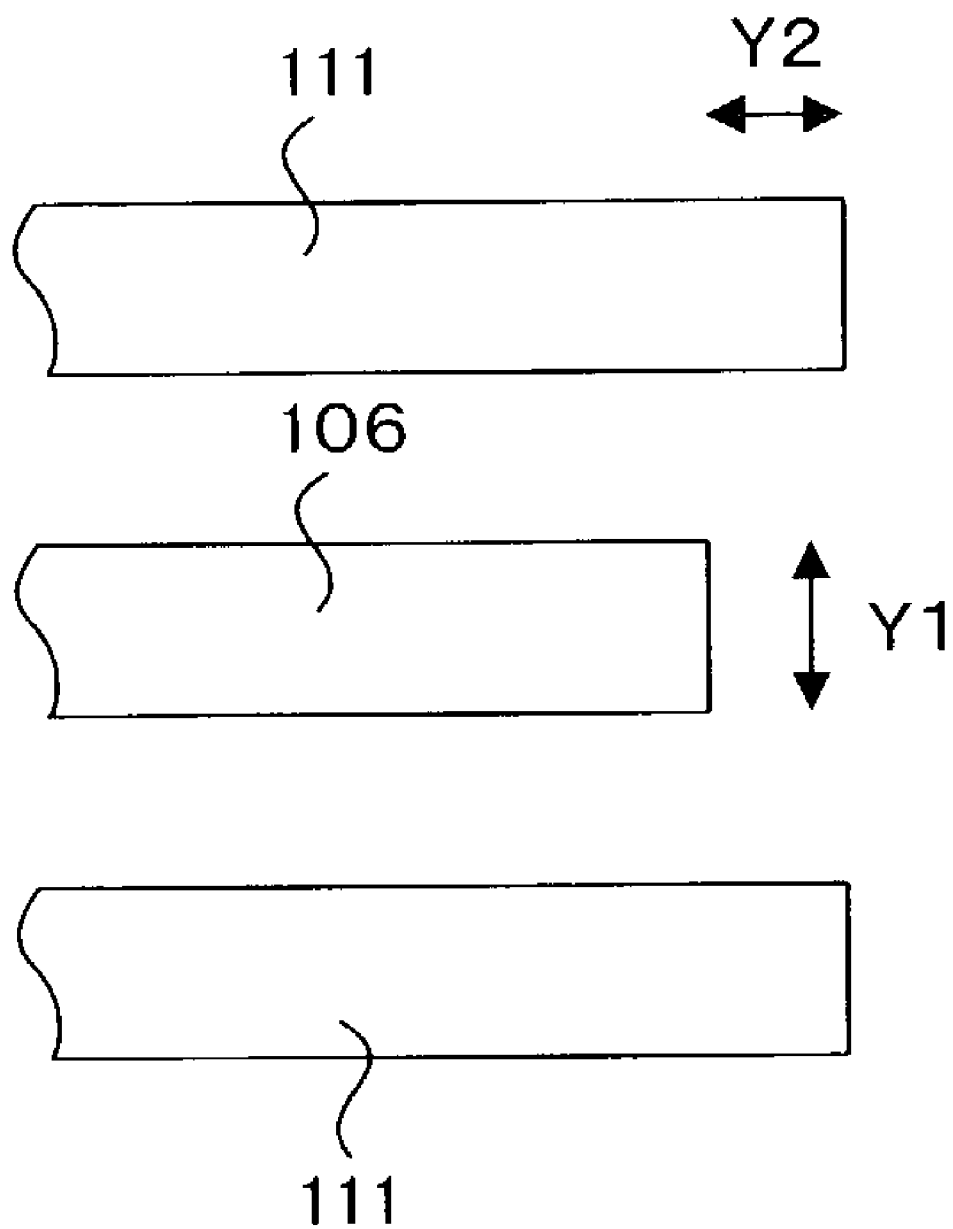
FIG. 11 is a schematic view showing a favorable relationship between a dummy pattern and a wiring in a folded-back portion of a monitor pattern.

Note that, in this embodiment, in a folded-back portion of the monitor pattern, as shown in FIG. 11, the dummy patterns 111 are preferably disposed so as to extend out of an edge of the wiring 106 by a length Y2, which is at least ½ or more of a width Y1 of the wiring 106. Accordingly, thinning of the wiring in the folded-back portion can be detected more surely.

(Third Embodiment)

Figure 12A:
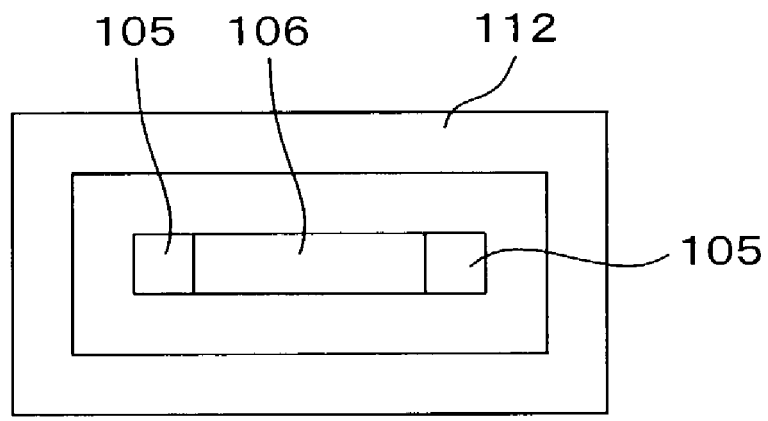
FIG. 12A is a top plan view showing a part (a cell) of a monitor pattern of a semiconductor device of a third embodiment of the present invention.
Figure 12B:
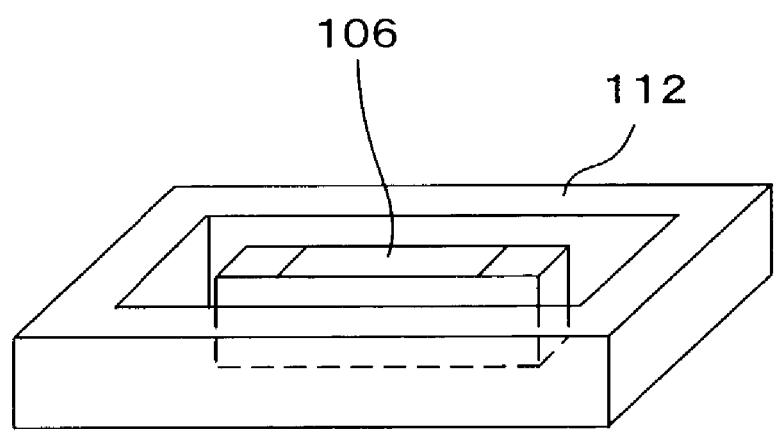
FIG. 12B is a perspective view thereof.

FIG. 12A is a top plan view showing a part (a cell) of a monitor pattern of a semiconductor device of a third embodiment of the present invention. FIG. 12B is a perspective view thereof.

In the second embodiment, the dummy patterns 111 are disposed only at the both sides of the wiring 106 in its width direction. In this embodiment, a dummy pattern 112 is disposed so as to surround the wiring 106. Note that, also in this embodiment, similarly to the second embodiment, the plurality of wirings 106 are connected in series by means of the diffused resistors (not shown) and the contact vias 105.

In this case, a space between the wiring 106 and the dummy pattern 112 is set so as to have an aspect ratio of 3 or more to a height of a wiring material including a mask material. When a detection sensitivity to a constriction is to be increased, the aspect ratio in etching between the wiring 106 and the dummy pattern 112 is preferably set to 4.5 or more.

Figure 13:
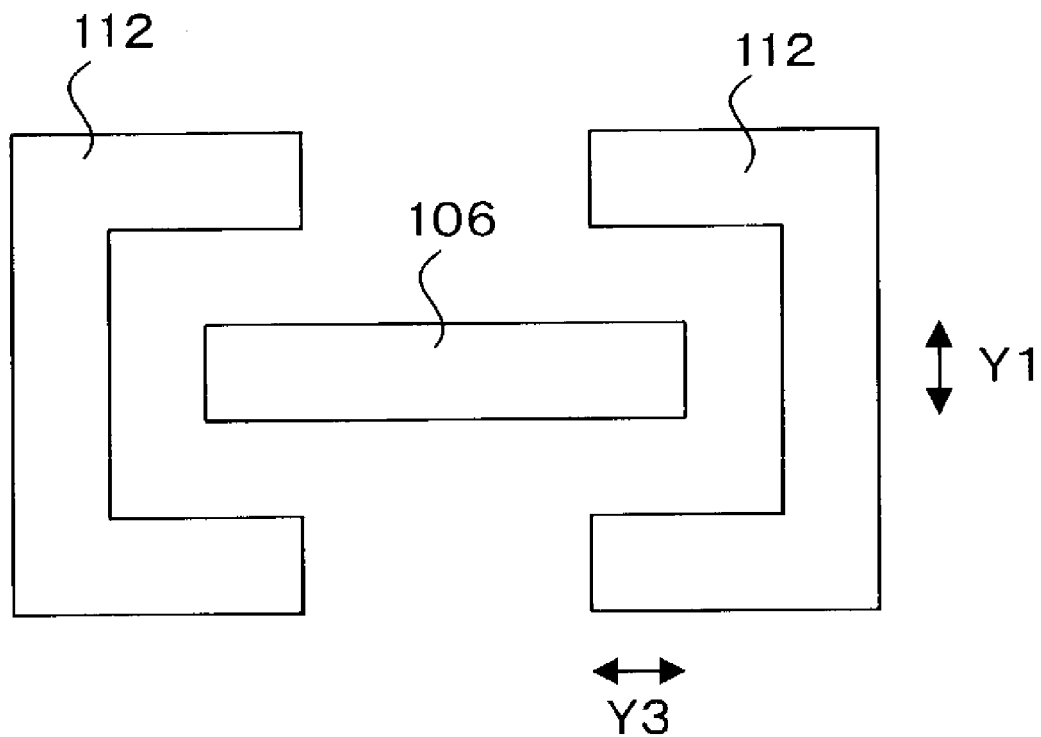
FIG. 13 is a top plan view showing a modified example of the third embodiment.

Moreover, as shown in FIG. 13, a notch may be provided in a part of the dummy pattern 112. Note that, in order to maintain the detection sensitivity to the thinning of the wiring 106, a length (overlap) Y3 from the end of the wiring 106 to the notch is preferably set to ½ or more of the width Y1 of the wiring 106.

Also in this embodiment, similarly to the first embodiment, the electrical examination on the monitor pattern is made possible to give an effect that defects such as thinning of the wirings in the chip formation portion and the like can be detected more surely than the conventional case.

(Fourth Embodiment)

Figure 14:
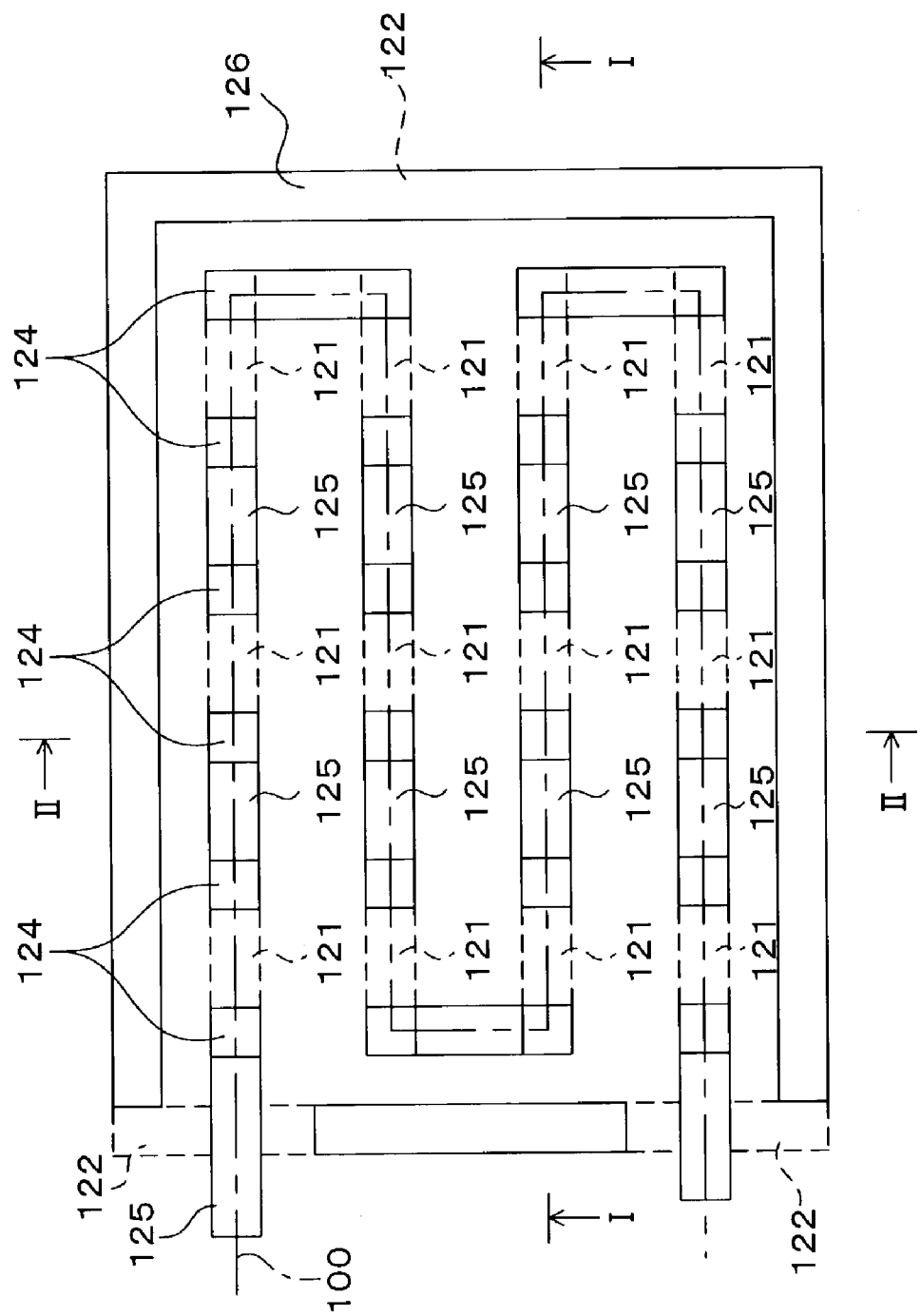
FIG. 14 is a top plan view showing a monitor pattern of a semiconductor device of a fourth embodiment of the present invention.
Figure 15A:
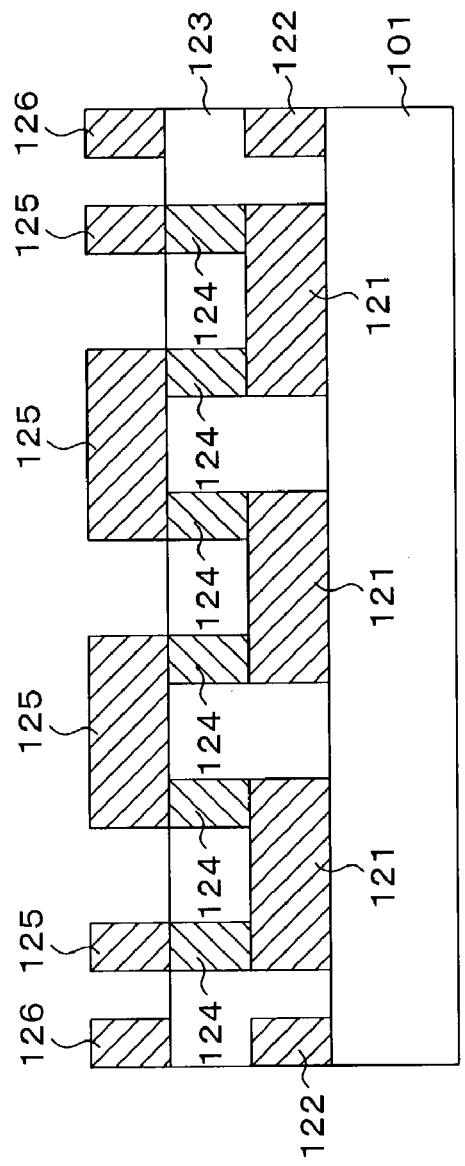
FIG. 15A is a cross-section view along I—I line of FIG. 14.
Figure 15B:
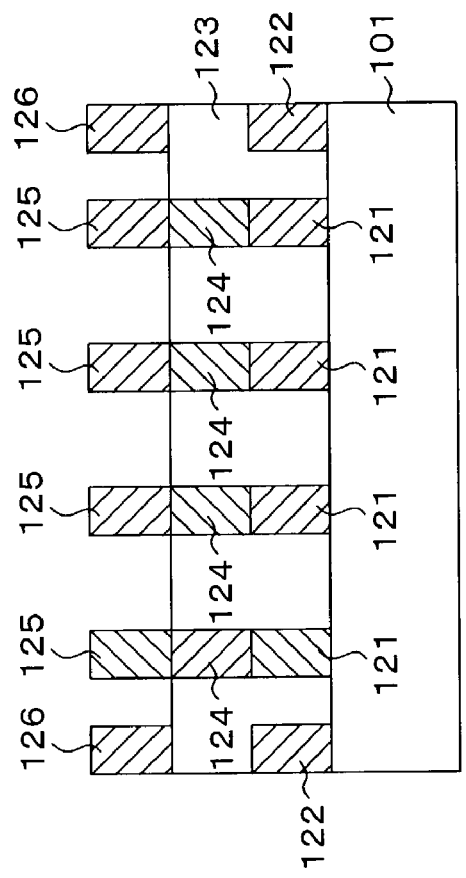
FIG. 15B is a cross-section view along II—II line of FIG. 14.

FIG. 14 is a top plan view showing a monitor pattern of a semiconductor device of a fourth embodiment of the present invention. FIG. 15A is a cross-section view along I—I line of FIG. 14, and FIG. 15B is a cross-section view along II—II line of FIG. 14.

On the semiconductor substrate 101, a plurality of lower-layer wirings (resistive elements) 121 on a first interlayer insulation film (not shown) are formed. These lower-layer wirings 121 are covered with a second interlayer insulation film 123, and a plurality of upper-layer wirings (resistive elements) 125 are formed on the second interlayer insulation film 123.

These lower-layer wirings 121 and upper-layer wirings 125 are alternately disposed along the one virtual line 100 turning more than once (three times in the drawing). Moreover, in the second interlayer insulation film 123, a plurality of contact vias 124 are buried, by which the lower-layer wirings 121 and the upper-layer wirings 125 are electrically connected in series.

In the same wiring layer as that of the lower-layer wirings 121, a lower-layer dummy pattern 122 is formed so as to surround a region where the lower-layer wirings 121 and the upper-layer wirings 125 are formed. Moreover, also in the same wiring layer as that of the upper-layer wirings 125, an upper-layer dummy pattern 126 is formed so as to surround the region where the lower-layer wirings 121 and the upper-layer wirings 125 are formed. Note that the upper-layer wirings 125 positioned at ends of the monitor pattern extend out of notched portions of the upper-layer dummy pattern 126.

It is preferable that widths of the lower-layer wiring 121 and the upper-layer wiring 125 are set to a minimum line width decided based on design criteria. For example, both of the lower-layer wiring 121 and upper-layer wiring 125 have a width of 0.3 $\mu$m and a length of 0.9 $\mu$m.

Moreover, a space between the lower-layer wiring 121 and the lower-layer dummy pattern 122 and a space between the upper-layer wiring 125 and the upper-layer dummy pattern 126 may be set in accordance with a minimum space between wirings in a chip formation portion.

The monitor pattern of this embodiment is also formed simultaneously with the elements and wirings constituting the semiconductor device. For example, the lower-layer wirings 121 and lower-layer dummy pattern 122 of the monitor pattern are formed simultaneously with formation of lower-layer wirings in the chip formation portion, the contact vias 124 of the monitor pattern are formed simultaneously with formation of contact vias in the chip formation portion, and the upper-layer wirings 125 and upper-layer dummy pattern 126 of the monitor pattern are formed simultaneously with formation of upper-layer wirings in the chip formation portion.

In etching between the wirings 121 and 125 and the dummy patterns 122 and 126, an aspect ratio to a height of a wiring material including a mask material (for example, a resist film) before the etching is set so as to be 3 or more. When a detection sensitivity of a constriction is to be increased, the aspect ratio between the wirings 121 and 125 and the dummy patterns 122 and 126 is preferably set so as to be 4.5 or more.

Also in this embodiment, similarly to the first embodiment, the electrical examination on the monitor pattern is made possible to give an effect that defects such as thinning of the wirings in the chip formation portion and the like can be detected more surely than the conventional case. Then, a result thereof is fed back to manufacturing steps, and an appropriate manufacturing condition (an etching condition and the like) is maintained. Thus, a quality of the semiconductor device is improved and a manufacturing yield is also improved.

(Fifth Embodiment)

Figure 16:
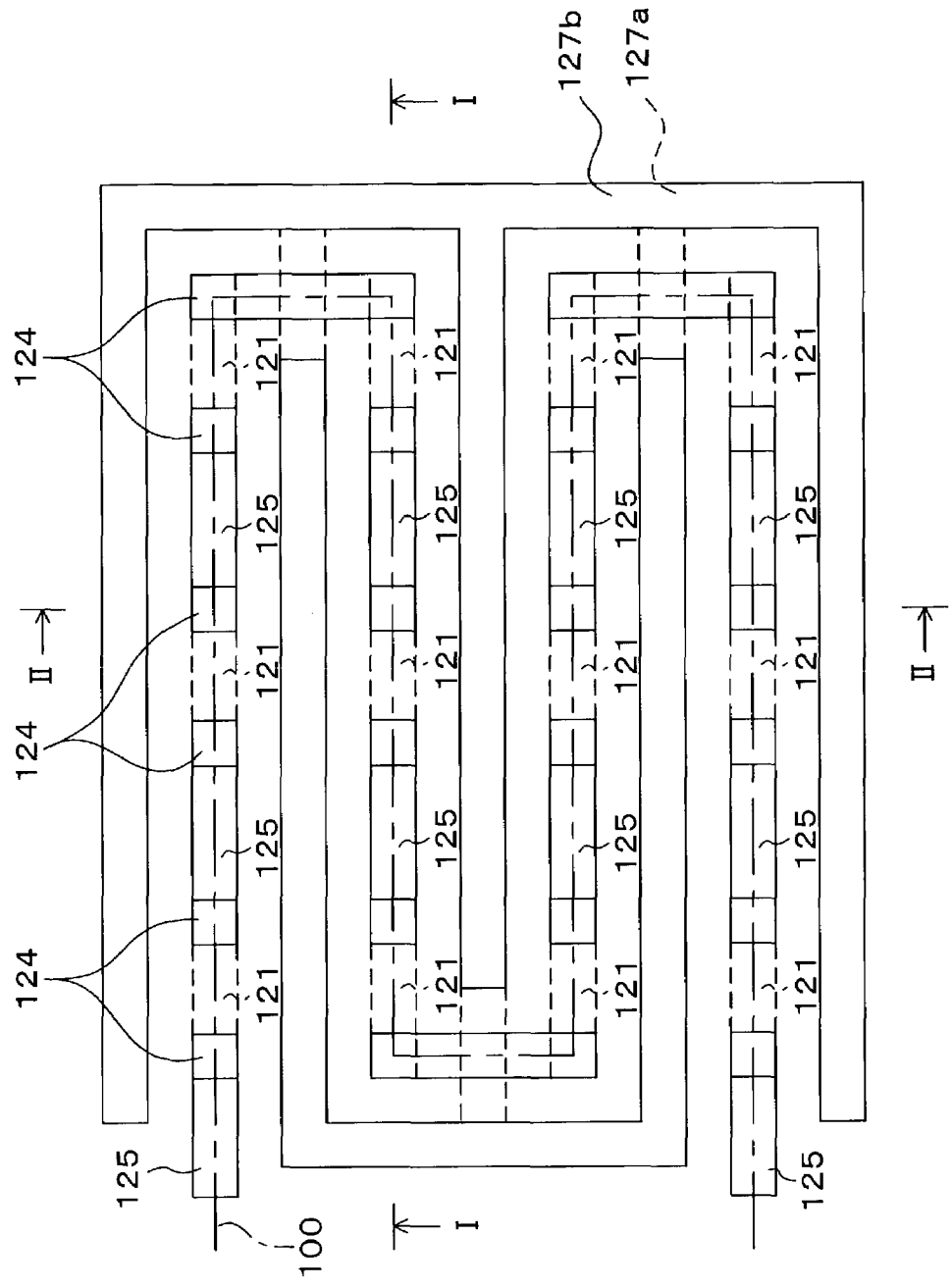
FIG. 16 is a top plan view showing a monitor pattern of a semiconductor device of a fifth embodiment of the present invention.

FIG. 16 is a top plan view showing a monitor pattern of a semiconductor device of a fifth embodiment of the present invention. FIG. 17A is a cross-section view along I—I line of FIG. 16, and FIG. 17B is a cross-section view along II—II line of FIG. 16. Note that, in FIGS. 16, 17A and 17B, identical constituent components to those of FIGS. 14, 15A and 15B are denoted by identical reference numerals.

Also in this embodiment, similarly to the fourth embodiment, on the semiconductor substrate 101, the plurality of lower-layer wirings (resistive elements) 121 on the first interlayer insulation film (not shown) are formed. Moreover, the plurality of upper-layer wirings (resistive elements) 125 are formed on the second interlayer insulation film 123. These lower-layer wirings 121 and upper-layer wirings 125 are alternately disposed along the one virtual line 100 turning more than once (three times in the drawing). Moreover, in the second interlayer insulation film 123, the plurality of contact vias 124 are buried, by which the lower-layer wirings 121 and the upper-layer wirings 125 are electrically connected in series.

In the same wiring layer as that of the lower-layer wirings 121, at both sides of the lower-layer wiring 121 in its width direction, a lower-layer dummy pattern 127a is formed, which extends along an array direction of the lower-layer wirings 121. Moreover, in the same wiring layer as that of the upper-layer wirings 125, an upper-layer dummy pattern 127b is formed along the lower-layer dummy pattern 127a. Note that, in a portion where the monitor pattern is folded back at a right angle, a notch is provided in the upper-layer dummy pattern 127b, thus preventing short-circuiting of the upper-layer wirings 125 and the upper-layer dummy pattern 127b.

In the folded-back portion of the monitor pattern, as shown in FIG. 11, the lower-layer dummy pattern 127a is preferably disposed so as to extend out of an edge of the lower-layer wiring 121 by a length at least ½ or more of a width of the lower-layer wiring 121.

Also in this embodiment, similarly to the fourth embodiment, the electrical examination on the monitor pattern is made possible to give an effect that defects such as thinning of the wirings in the chip formation portion and the like can be detected more surely than the conventional case.

(Sixth Embodiment)

Figure 18:
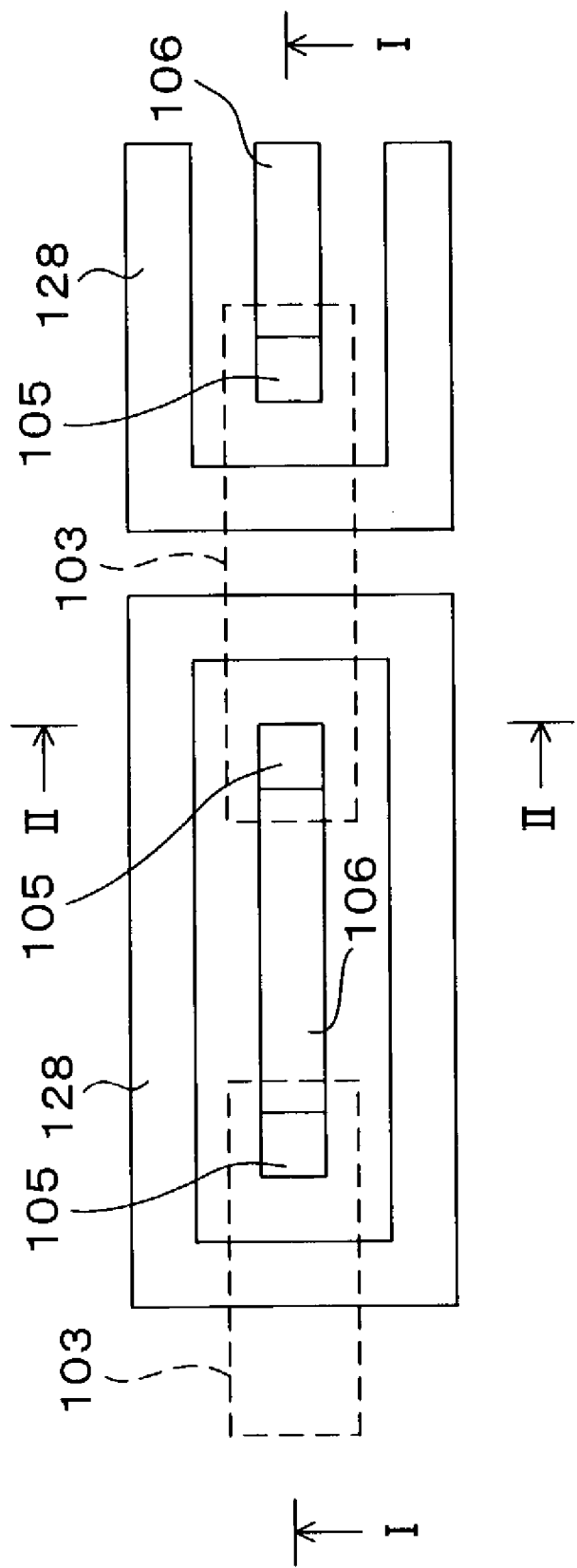
FIG. 18 is a top plan view showing a monitor pattern of a semiconductor device of a sixth embodiment of the present invention.

FIG. 18 is a top plan view showing a monitor pattern of a semiconductor device of a sixth embodiment of the present invention. FIG. 19A is a cross-section view along I—I line of FIG. 18, and FIG. 19B is a cross-section view along II—II line of FIG. 18. Note that, in FIGS. 18, 19A and 19B, identical constituent components to those of FIGS. 6, 7A and 7B are denoted by identical reference numerals.

The plurality of diffused resistors 103, which are formed by introducing impurities at high concentration into the semiconductor substrate 101, are provided in the semiconductor substrate 101. Moreover, on the interlayer insulation film 104, the plurality of wirings (resistive elements) 106 are formed in lines. Furthermore, in the interlayer insulation film 104, the plurality of contact vias 105 are buried, by which the wirings 106 and the diffused resistors 103 are electrically connected in series.

Still furthermore, on the interlayer insulation film 104, a plurality of dummy patterns 128 are formed so as to surround the respective wirings 106. These dummy patterns 128 are formed in the same wiring layer as that of the wirings 106.

Regarding a size of each of the diffused resistors 103, for example, a width thereof is 0.5 $\mu$m and a length thereof is 2.5 $\mu$m. Regarding a size of each of the wirings 106, for example, a width thereof is 0.3 $\mu$m and a length thereof is 2.5 $\mu$m. Moreover, the wiring 106 is constituted by a barrier metal (a Ti film with a thickness of 20 nm+a TiN film with a thickness of 50 nm) and an aluminum film with a thickness of 500 nm, which is formed on the barrier metal. Moreover, each of the dummy patterns 128 has a width of 0.3 $\mu$m and a space between the dummy pattern 128 and the wiring 106 is 0.3 $\mu$m. Furthermore, a diameter of each of the contact vias 105 is 0.3 $\mu$m.

Also in this embodiment, similarly to the first embodiment, the electrical examination on the monitor pattern is made possible to give an effect that defects such as thinning of the wirings in the chip formation portion and the like can be detected more surely than the conventional case.

In the case of the monitor pattern of this embodiment, when the number of the contact vias 105 is assumed to be 100, a length of one side of a pad is set to 60 μm, the pad requiring a region with a width of 10 μm and a length of 60 μtm in forming the monitor pattern. Thus, the monitor pattern of this embodiment can be formed in the same area as the pad.

Figure 20:
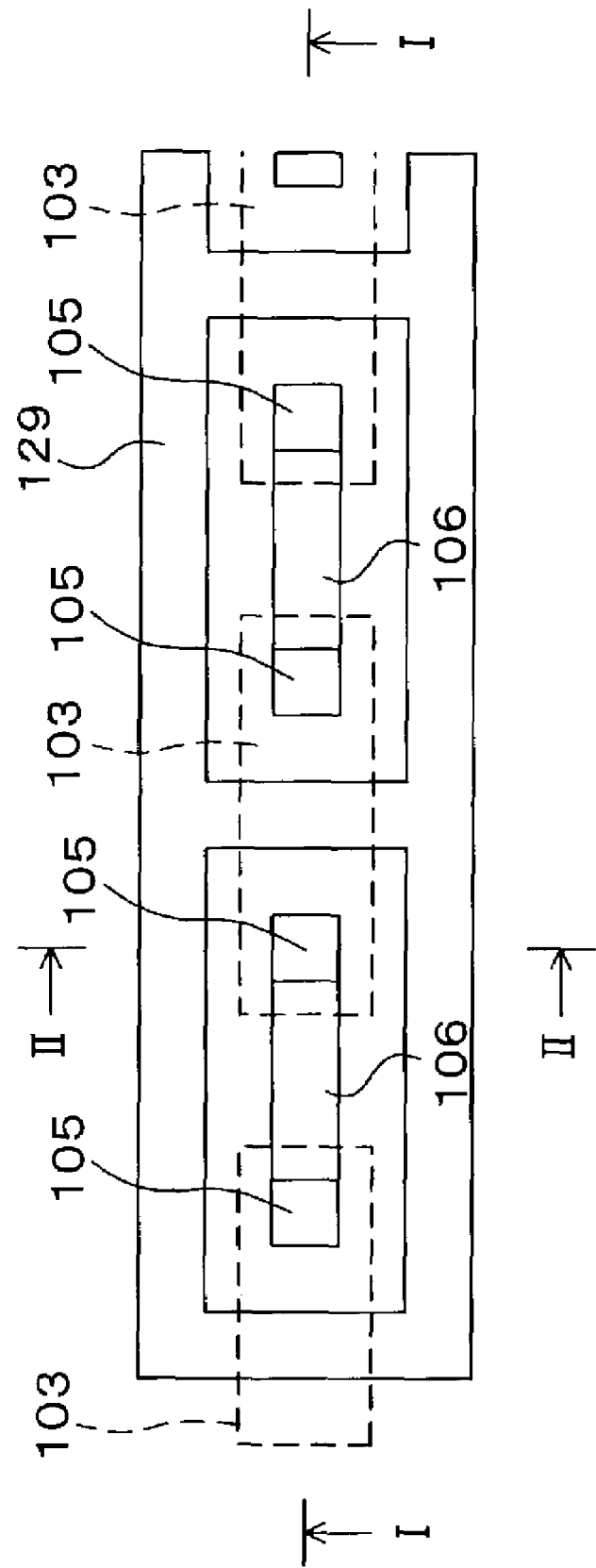
FIG. 20 is a plan view showing a monitor pattern of a modified example of the sixth embodiment.

FIG. 20 is a top plan view showing a monitor pattern of a modified example of the sixth embodiment. FIG. 21A is a cross-section view on I—I line of FIG. 20, and FIG. 21B is a cross-section view on II—II line of FIG. 20.

In the sixth embodiment, the respective wirings 106 are surrounded by the respective independent dummy patterns 128. However, as shown in FIGS. 20, 21A and 21B, the wirings 106 may be surrounded by a continuous dummy pattern 129. In this case, compared to the monitor pattern shown in FIGS. 18, 19A and 19B, the dummy pattern occupying area can be reduced by about 50%.

(Seventh Embodiment)

Figure 22:
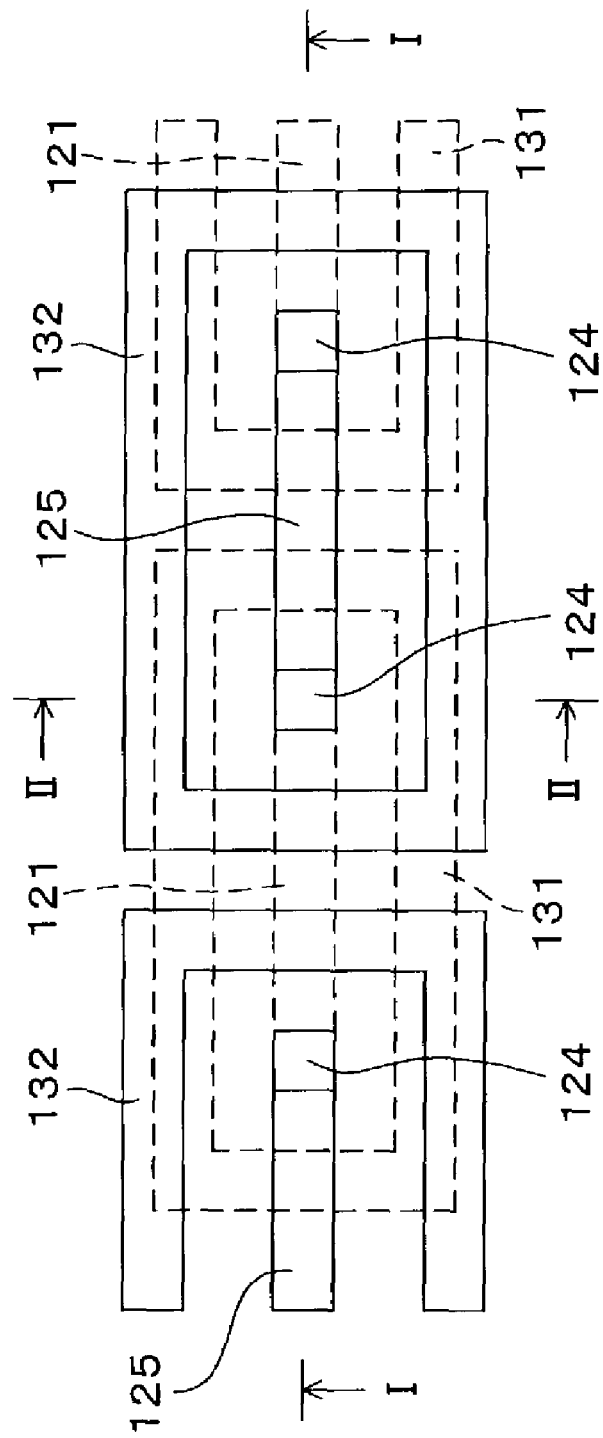
FIG. 22 is a top plan view showing a monitor pattern of a semiconductor device of a seventh embodiment of the present invention.
Figure 23A:
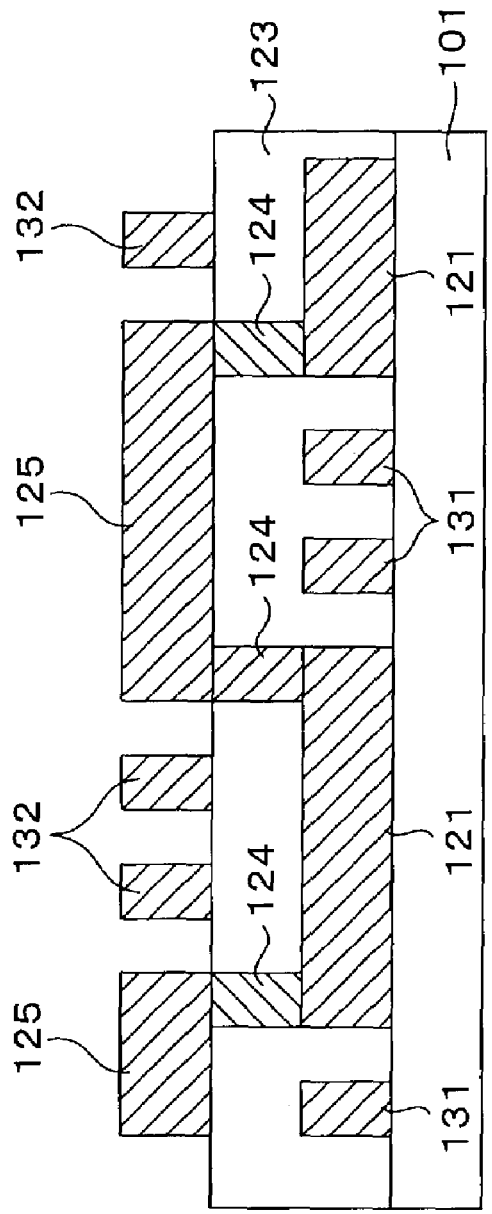
FIG. 23A is a cross-section view along I—I line of FIG. 22.
Figure 23B:
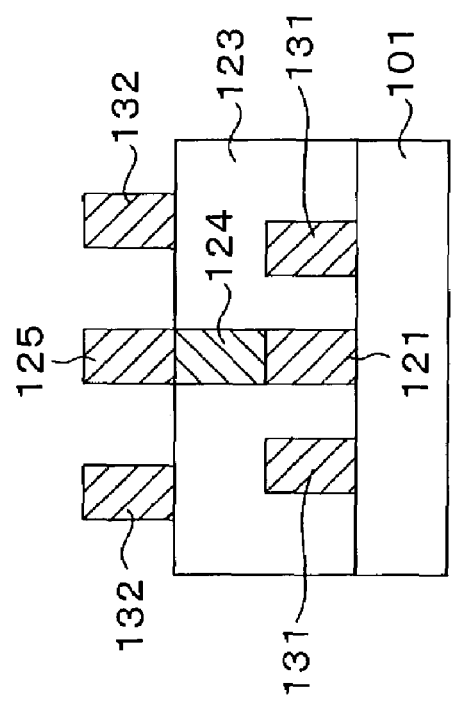
FIG. 23B is a cross-section view along II—II line of FIG. 22.

FIG. 22 is a top plan view showing a monitor pattern of a semiconductor device of a seventh embodiment of the present invention. FIG. 23A is a cross-section view along I—I line of FIG. 22, and FIG. 23B is a cross-section view along II—II line of FIG. 22. Note that, in FIGS. 22, 23A and 23B, identical constituent components to those of FIGS. 14, 15A and 15B are denoted by identical reference numerals.

On the semiconductor substrate 101, the plurality of lower-layer wirings (resistive elements) 121 on the first interlayer insulation film (not shown) are formed. These lower-layer wirings 121 are covered with the second interlayer insulation film 123, and the plurality of upper-layer wirings (resistive elements) 125 are formed on the second interlayer insulation film 123.

These lower-layer wirings 121 and upper-layer wirings 125 are alternately disposed along a straight line. Moreover, in the second interlayer insulation film 123, the plurality of contact vias 124 are buried, by which the lower-layer wirings 121 and the upper-layer wirings 125 are electrically connected in series.

In the same wiring layer as that of the lower-layer wirings 121, a plurality of lower-layer dummy patterns 131 are formed so as to surround the respective lower-layer wirings 121. Moreover, also in the same wiring layer as that of the upper-layer wirings 125, a plurality of upper-layer dummy patterns 132 are formed so as to surround the respective upper-layer wirings 125.

The lower-layer wiring 121 and the upper-layer wiring 125 have, for example, a width of 0.3 μm and a length of 1.5 μm and are constituted by a barrier metal with a thickness of 70 nm (Ti film: 20 nm+TiN film: 50 nm), an Al film with a thickness of 500 nm and a reflection preventing film with a thickness of 78 nm (Ti film: 8 nm+TiN film: 70 nm). Moreover, a space between the lower-layer wiring 121 and the lower-layer dummy pattern 131 is 0.3 μm, and between the upper-layer wiring 125 and the upper-layer dummy pattern 132 is also 0.3 μm.

Figure 1A:
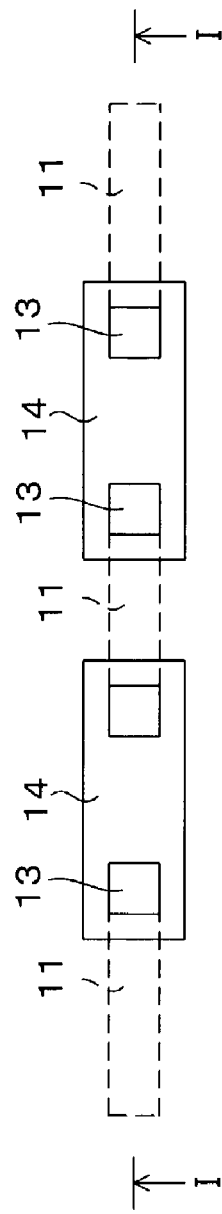
FIG. 1A is a top plan view showing an example of a monitor pattern provided in a conventional semiconductor device.
Figure 1B:
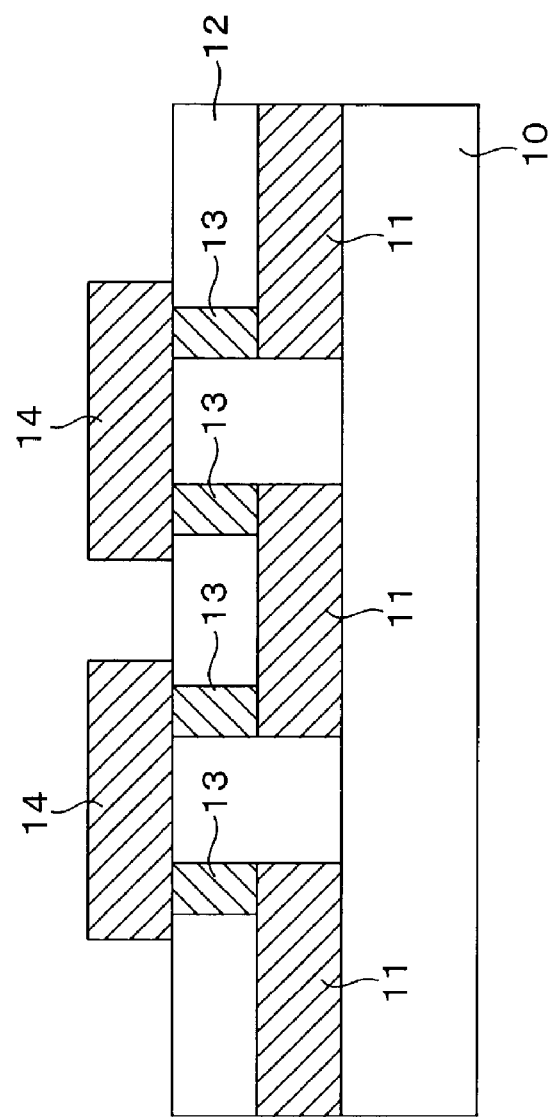
FIG. 1B is a cross-section view thereof.
Figure 2:
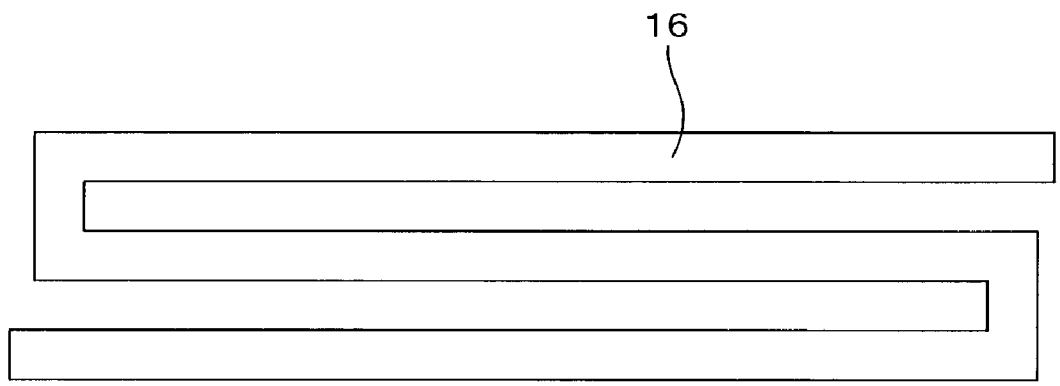
FIG. 2 is a top plan view showing another example of a conventional monitor pattern.
Figure 3A:
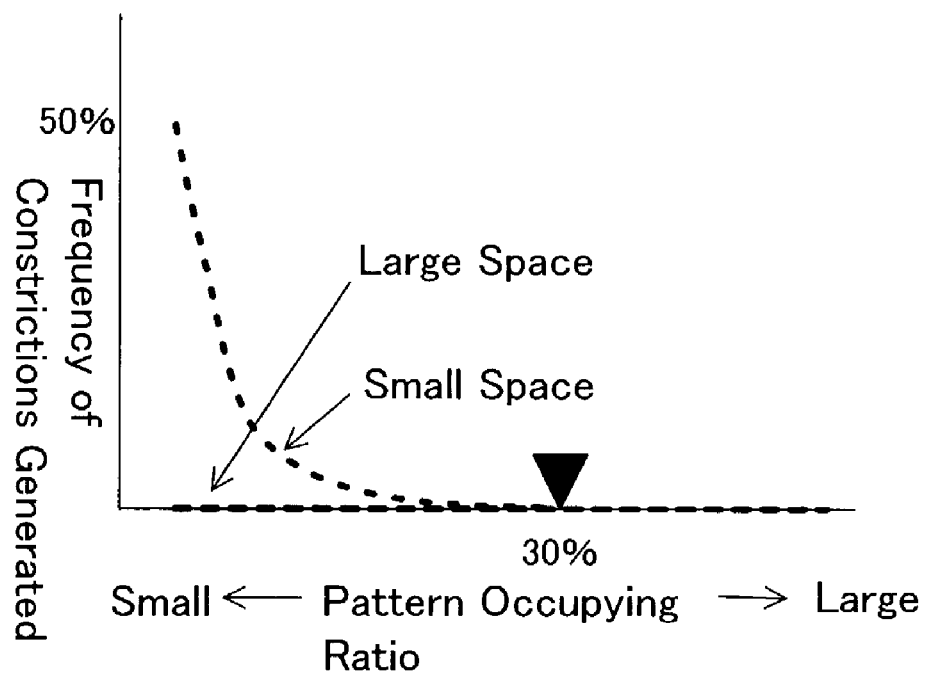
FIG. 3A is a graph showing a relationship between a pattern occupying ratio and a frequency of constrictions.
Figure 3B:
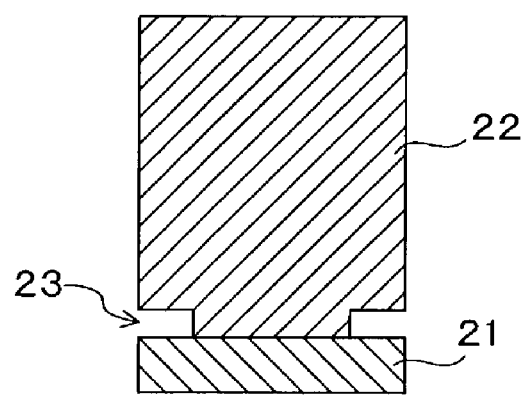
FIG. 3B is a schematic cross-section view showing a constriction (undercut) of a wiring.
Figure 4A:
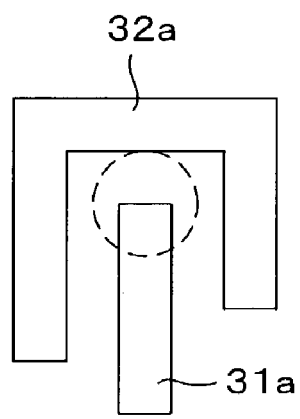
FIGS. 4A and 4B are top plan views showing pattern examples in which failure is likely to occur.
Figure 4B:
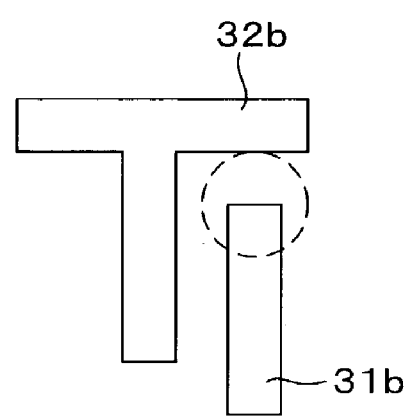
Figure 4C:
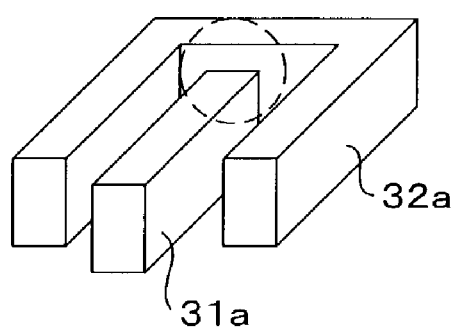
FIGS. 4C and 4D are perspective views thereof.
Figure 4D:
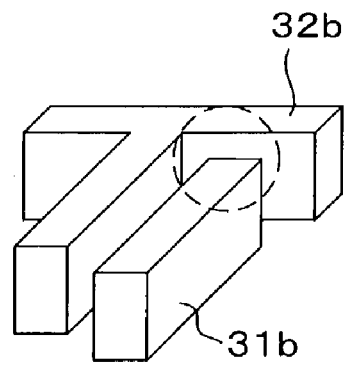
Figure 5:
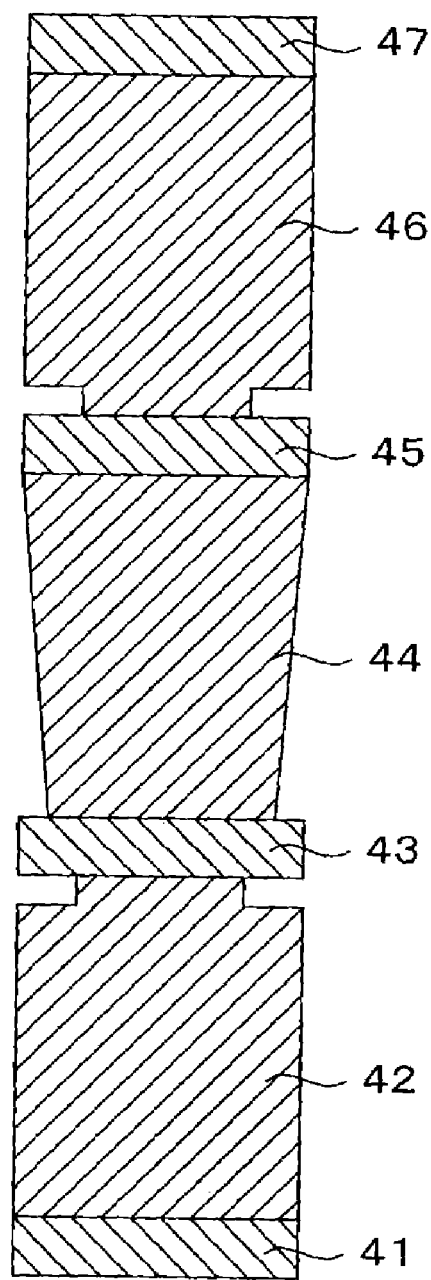
FIG. 5 is a schematic cross-section view showing an example of a wiring structure in which failure is considered to be most likely to occur.

In such a monitor pattern, constrictions are likely to be generated in a portion below the reflection preventing film of the lower-layer wiring 121 and in a portion above the barrier metal of the upper-layer wiring (see FIG. 5). An increase in resistance due to these constrictions is electrically detected, thus making it possible to identify the presence of the constrictions and a degree thereof.

Figure 24:
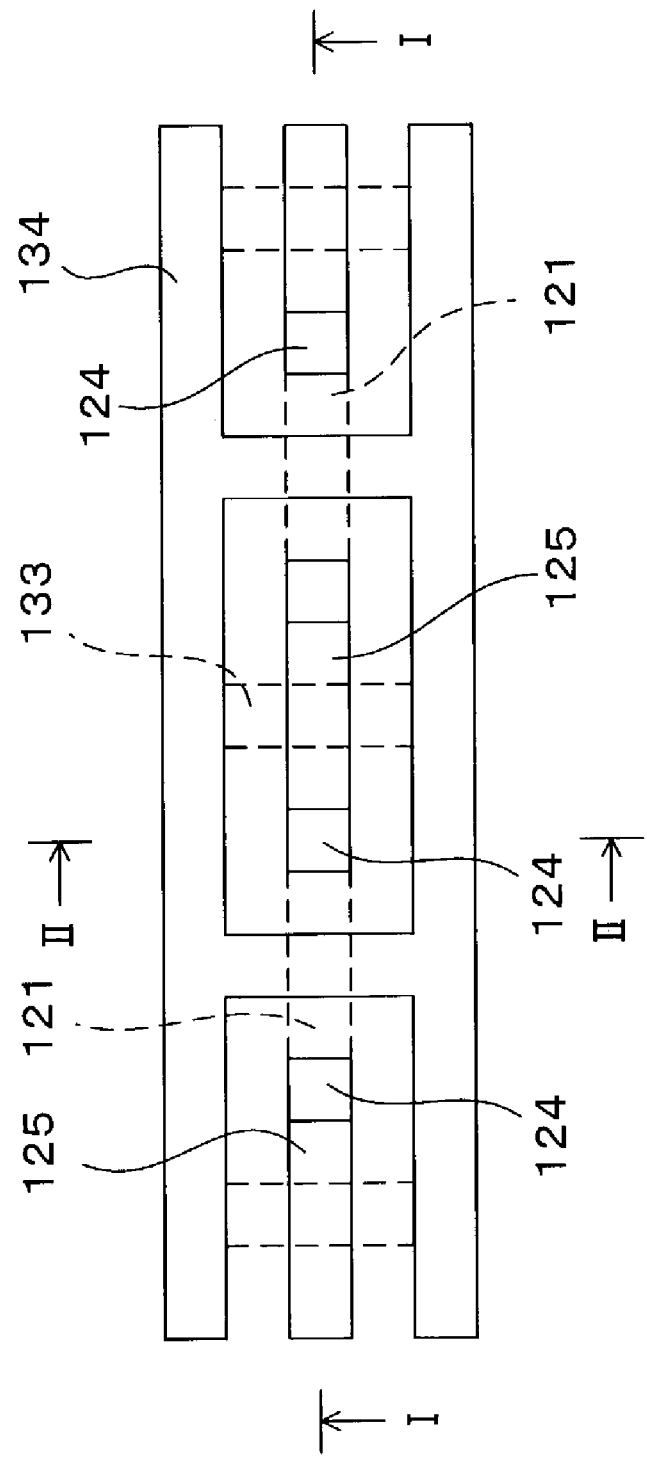
FIG. 24 is a top plan view showing a monitor pattern of a modified example of the seventh embodiment.
Figure 25A:
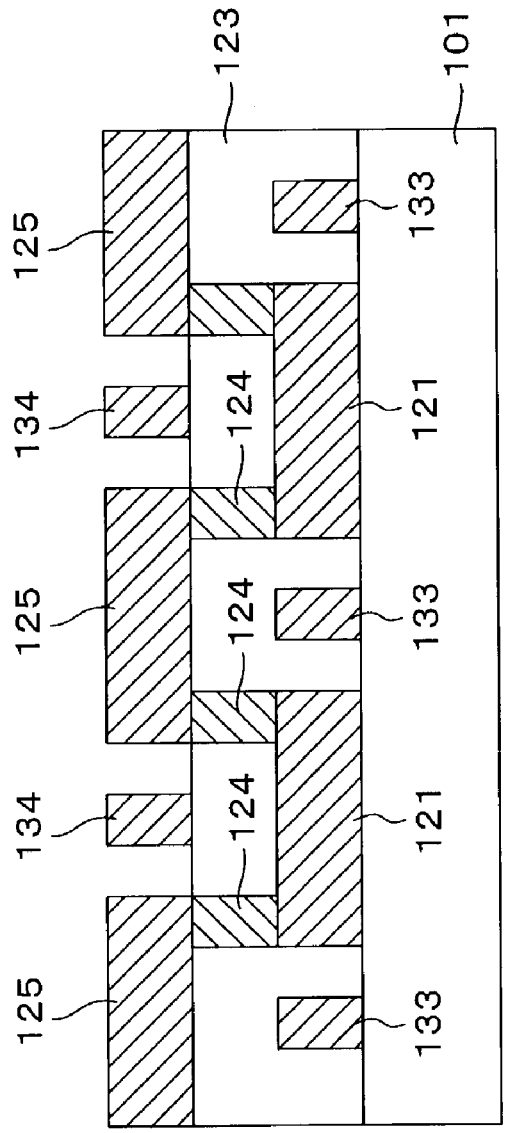
FIG. 25A is a cross-section view along I—I line of FIG. 24.
Figure 25B:
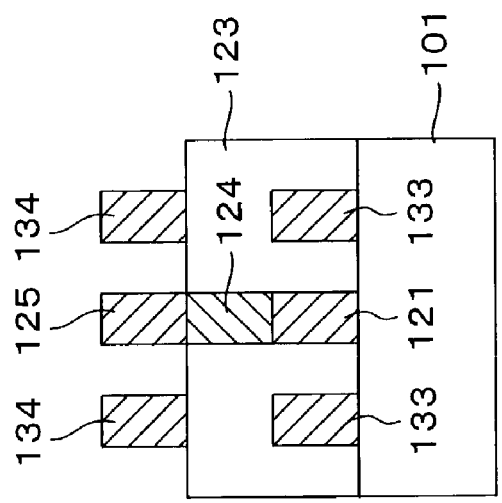
FIG. 25B is a cross-section view along II—II line of FIG. 24.

FIG. 24 is a top plan view showing a monitor pattern of a modified example of the seventh embodiment. FIG. 25A is a cross-section view on I—I line of FIG. 24, and FIG. 25B is a cross-section view on II—II line of FIG. 24.

In the seventh embodiment, the lower-layer wirings 121 are surrounded by the respective independent lower-layer dummy patterns 131 and the upper-layer wirings 125 are surrounded by the respective independent upper-layer dummy patterns 132. However, as shown in FIGS. 24, 25A and 25B, the lower-layer wirings 121 may be surrounded by a continuous lower-layer dummy pattern 133 and the upper-layer wirings 125 may be surrounded by a continuous upper-layer dummy pattern 134. Thus, compared to the monitor pattern shown in FIGS. 22, 23A and 23B, the dummy pattern occupying area can be reduced by about 50%.

(Eighth Embodiment)

Figure 26:
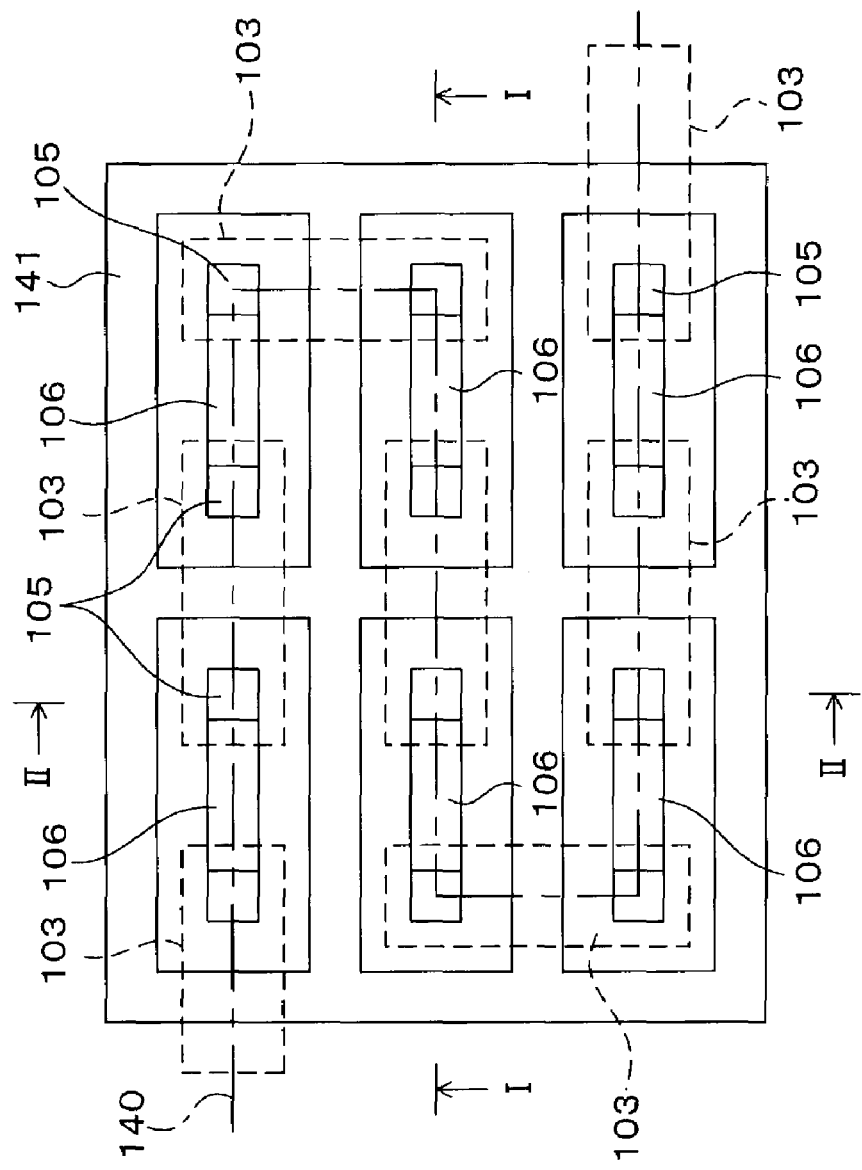
FIG. 26 is a top plan view showing a monitor pattern of a semiconductor device of an eighth embodiment of the present invention.
Figure 27A:
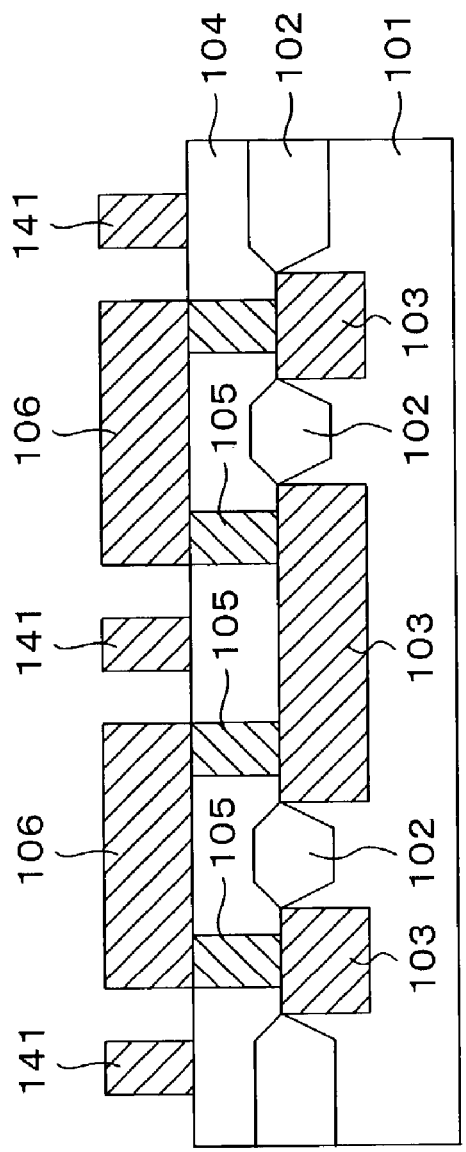
FIG. 27A is a cross-section view along I—I line of FIG. 26.
Figure 27B:
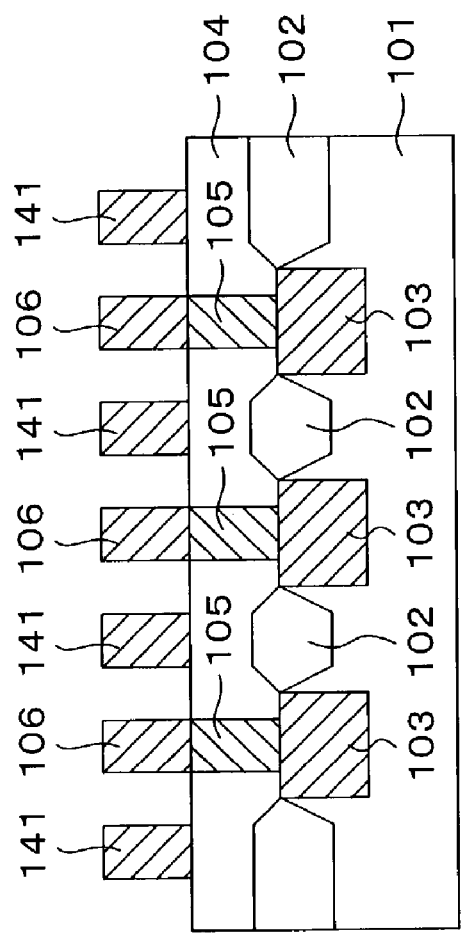
FIG. 27B is a cross-section view along II—II line of FIG. 26.

FIG. 26 is a top plan view showing a monitor pattern of a semiconductor device of an eighth embodiment of the present invention. FIG. 27A is a cross-section view along I—I line of FIG. 26, and FIG. 27B is a cross-section view along II—II line of FIG. 26. Note that, in FIGS. 26, 27A and 27B, identical constituent components to those of FIGS. 6, 7A and 7B are denoted by identical reference numerals.

Also in this embodiment, the plurality of diffused resistors 103, which are formed by introducing impurities at high concentration into the semiconductor substrate 101, are provided in the semiconductor substrate 101. Moreover, on the interlayer insulation film 104, the plurality of wirings (resistive elements) 106 are formed. These diffused resistors 103 and wirings 106 are alternately disposed along one virtual line 140 turning more than once (twice in the drawing). Moreover, in the interlayer insulation film 104, the plurality of contact vias 105 are buried, by which the diffused resistors 103 and the wirings 106 are electrically connected in series.

Furthermore, on the interlayer insulation film 104, a lattice dummy pattern 141 is formed, which surrounds the respective wirings 106 individually. This dummy pattern 141 is formed in the same wiring layer as that of the wirings 106. Moreover, a space between the dummy pattern 141 and each of the wirings 106 is set to, for example, 0.3 μm.

Also in this embodiment, similarly to the first embodiment, since the dummy pattern 141 is formed in the vicinity of the wirings 106, the presence and the degree of the constrictions and the like can be detected with high sensibility.

(Ninth Embodiment)

Figure 28:
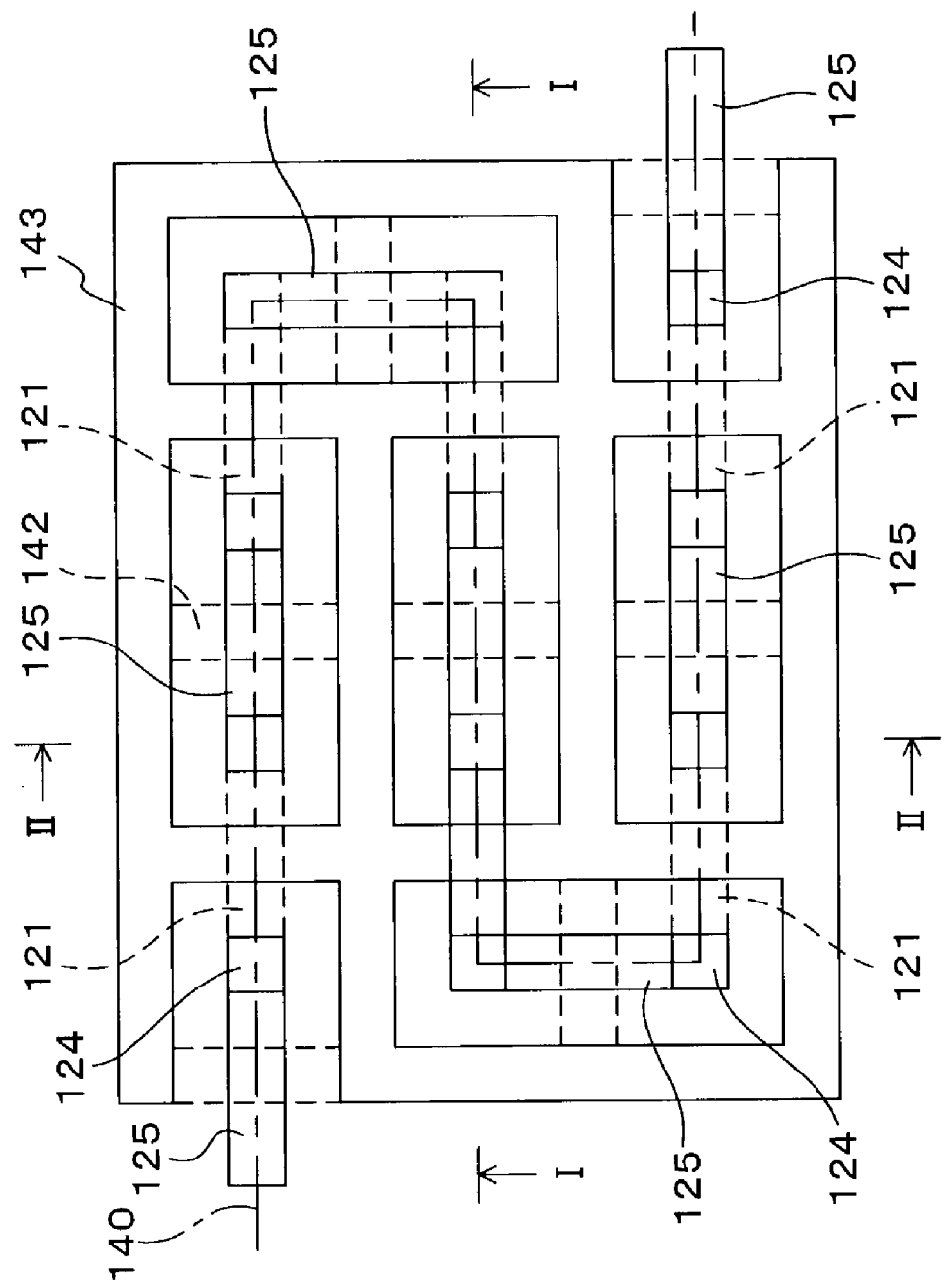
FIG. 28 is a top plan view showing a monitor pattern of a semiconductor device of a ninth embodiment of the present invention.
Figure 29A:
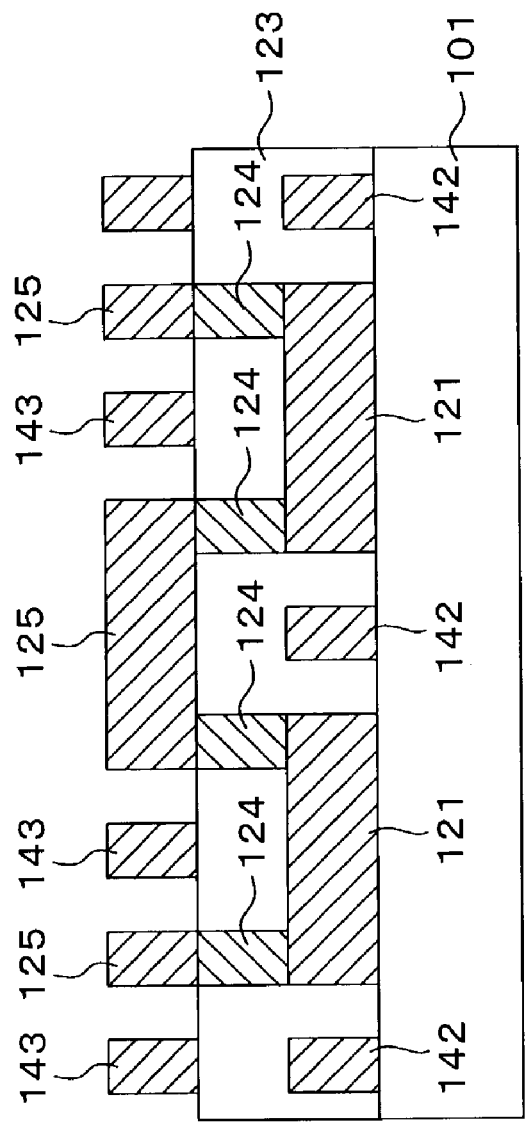
FIG. 29A is a cross-section view along I—I line of FIG. 28.
Figure 29B:
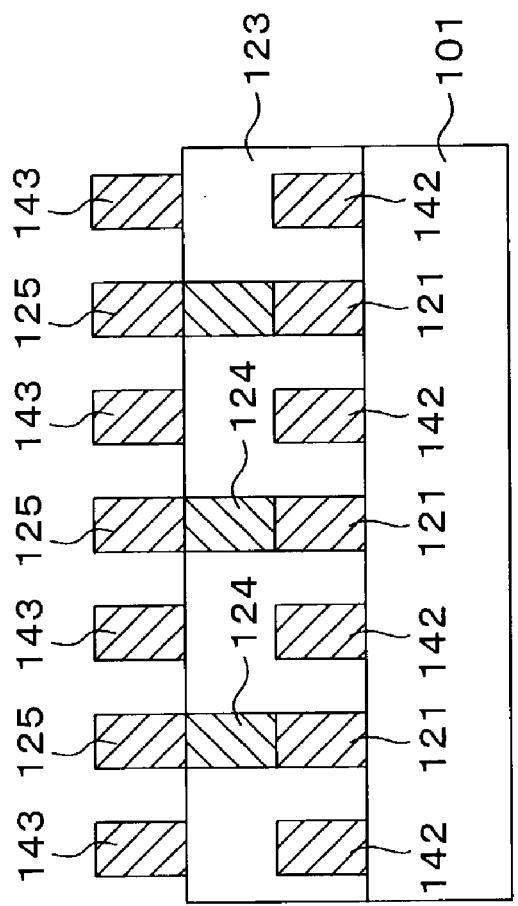
FIG. 29B is a cross-section view along II—II line of FIG. 28.

FIG. 28 is a top plan view showing a monitor pattern of a semiconductor device of a ninth embodiment of the present invention. FIG. 29A is a cross-section view along I—I line of FIG. 28, and FIG. 29B is a cross-section view along II—II line of FIG. 28. Note that, in FIGS. 28, 29A and 29B, identical constituent components to those of FIGS. 14, 15A and 15B are denoted by identical reference numerals.

On the semiconductor substrate 101, the plurality of lower-layer wirings (resistive elements) 121 on the first interlayer insulation film (not shown) are formed. These lower-layer wirings 121 are covered with the second interlayer insulation film 123.

On the second interlayer insulation film 123, the plurality of upper-layer wirings (resistive elements) 125 are formed. These lower-layer wirings 121 and upper-layer wirings 125 are alternately disposed along the one virtual line 140 turning more than once (twice in the drawing). Moreover, in the second interlayer insulation film 123, the plurality of contact vias 124 are buried, by which the lower-layer wirings 121 and the upper-layer wirings 125 are electrically connected in series.

In the same wiring layer as that of the lower-layer wirings 121, a lattice lower-layer dummy pattern 142 is formed, which surrounds the respective lower-layer wirings 121 individually. Moreover, in the same wiring layer as that of the upper-layer wirings 125, a lattice upper-layer dummy pattern 143 is formed, which surrounds the respective upper-layer wirings 125 individually. Note that the upper-layer wirings 125 positioned at ends of the monitor pattern extend out of the upper-layer dummy pattern 143 through notched portions of the upper-layer dummy pattern 143.

Also in this embodiment, a space between the lower-layer wirings 121 and the lower-layer dummy pattern 142 and a space between the upper-layer wirings 125 and the upper-layer dummy pattern 143 are set, for example, in accordance with the minimum space between the wirings in the chip formation portion. Thus, an effect similar to that of the fourth embodiment can be obtained.

(Tenth Embodiment)

Figure 30:
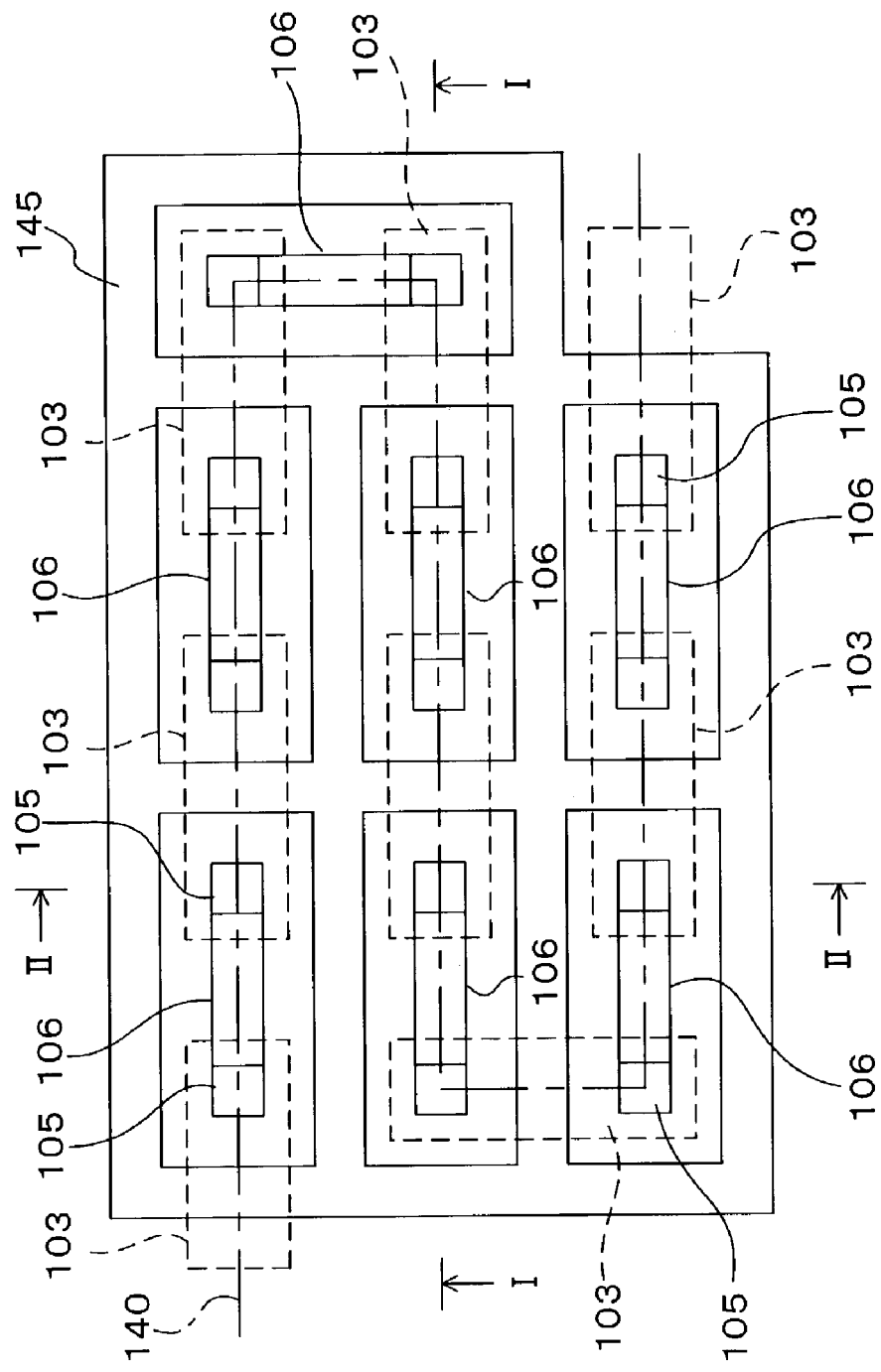
FIG. 30 is a top plan view showing a monitor pattern of a semiconductor device of a tenth embodiment of the present invention.
Figure 31A:
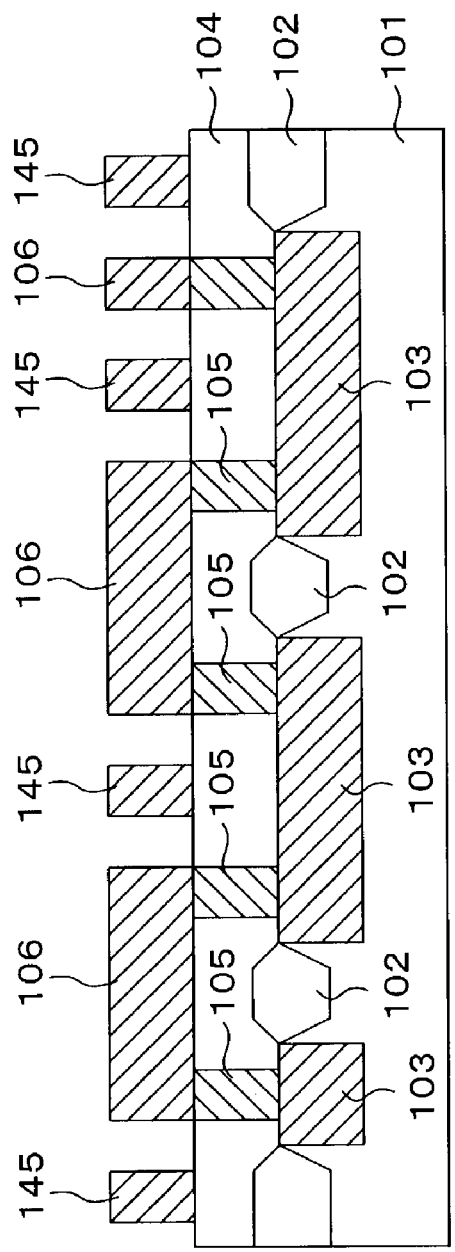
FIG. 31A is a cross-section view along I—I line of FIG. 30.
Figure 31B:
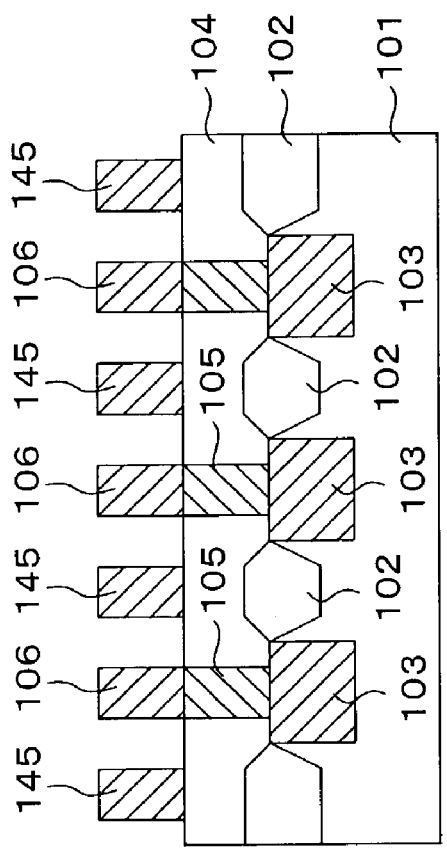
FIG. 31B is a cross-section view along II—II line of FIG. 30.

FIG. 30 is a top plan view showing a monitor pattern of a semiconductor device of a tenth embodiment of the present invention. FIG. 31A is a cross-section view along I—I line of FIG. 30, and FIG. 31B is a cross-section view along II—II line of FIG. 30. Note that, in FIGS. 30, 31A and 31B, identical constituent components to those of FIGS. 6, 7A and 7B are denoted by identical reference numerals.

Also in this embodiment, the plurality of diffused resistors 103, which are formed by introducing impurities at high concentration into the semiconductor substrate 101, are provided in the semiconductor substrate 101. Moreover, on the interlayer insulation film 104, the plurality of wirings (resistive elements) 106 are formed. These diffused resistors 103 and wirings 106 are alternately disposed along the one virtual line 140 turning more than once (twice in the drawing). Moreover, in the interlayer insulation film 104, the plurality of contact vias 105 are buried, by which the wirings 106 and the diffused resistors 103 are electrically connected in series.

Furthermore, on the interlayer insulation film 104, a lattice dummy pattern 145 is formed, which surrounds the respective wirings 106 individually. This dummy pattern 145 is formed in the same wiring layer as that of the wirings 106.

Also in this embodiment, a space between the wirings 106 and the dummy pattern 145 is set, for example, in accordance with the minimum space between the wirings in the chip formation portion. Thus, an effect similar to that of the first embodiment can be obtained.

(Eleventh Embodiment)

Figure 32:
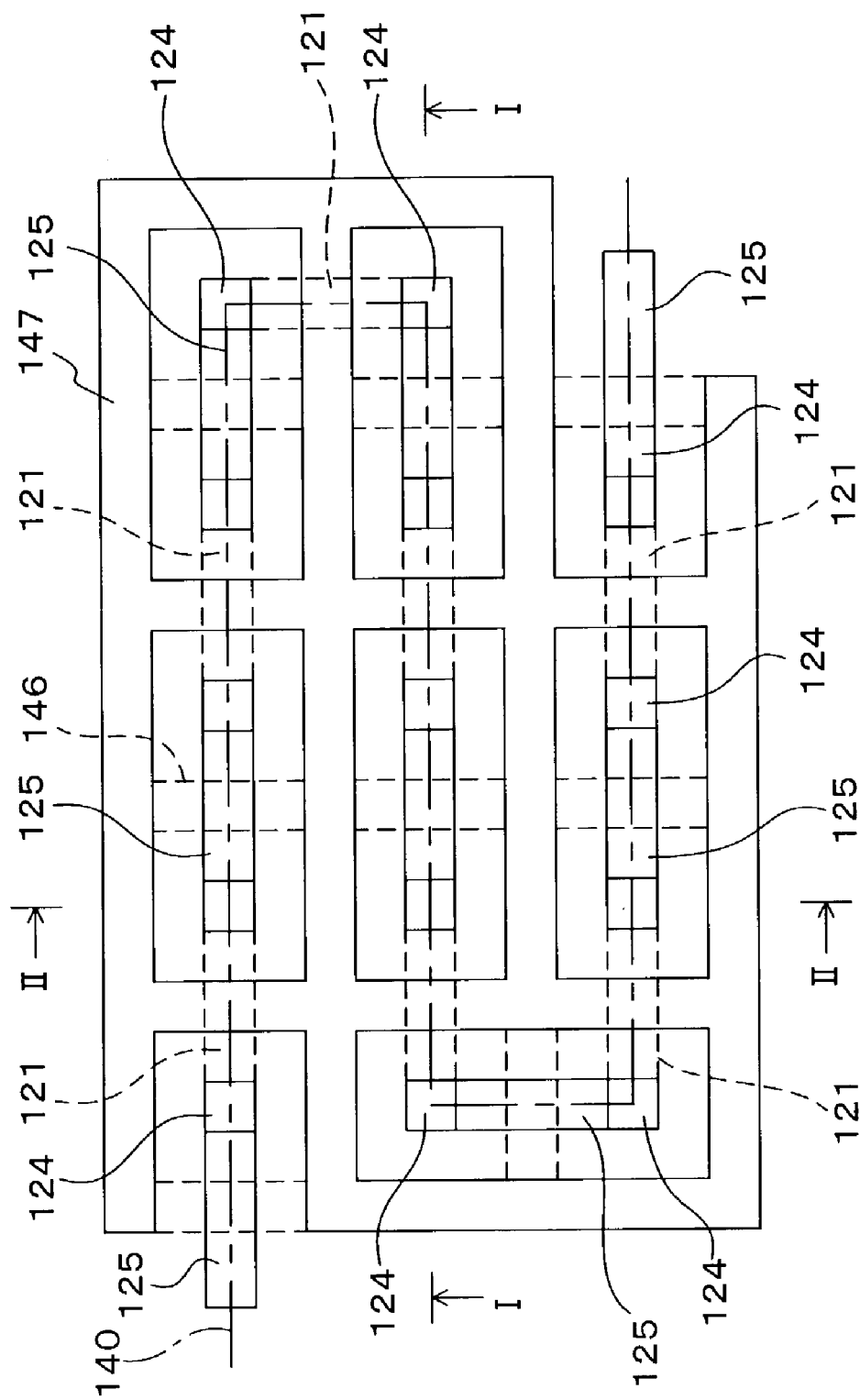
FIG. 32 is a top plan view showing a monitor pattern of a semiconductor device of an eleventh embodiment of the present invention.
Figure 33A:
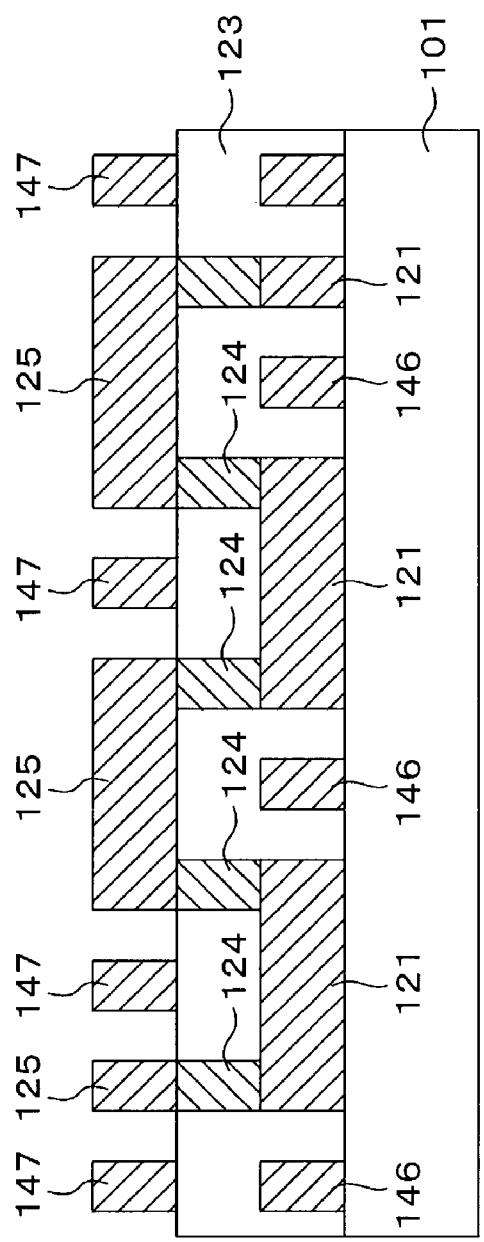
FIG. 33A is a cross-section view along I—I line of FIG. 32.
Figure 33B:
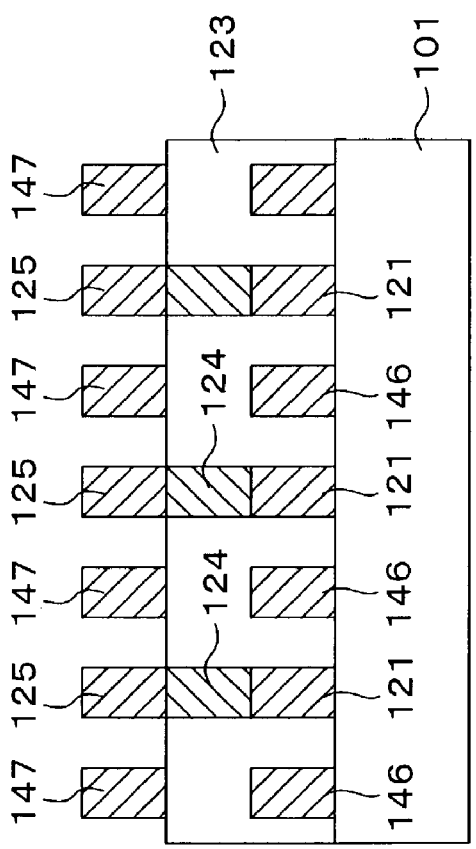
FIG. 33B is a cross-section view along II—II line of FIG. 32.

FIG. 32 is a top plan view showing a monitor pattern of a semiconductor device of an eleventh embodiment of the present invention. FIG. 33A is a cross-section view along I—I line of FIG. 32, and FIG. 33B is a cross-section view along II—II line of FIG. 32. Note that, in FIGS. 32, 33A and 33B, identical constituent components to those of FIGS. 14, 15A and 15B are denoted by identical reference numerals.

On the semiconductor substrate 101, the plurality of lower-layer wirings (resistive elements) 121 on the first interlayer insulation film (not shown) are formed. These lower-layer wirings 121 are covered with the second interlayer insulation film 123, and on the second interlayer insulation film 123, the plurality of upper-layer wirings (resistive elements) 125 are formed.

These lower-layer wirings 121 and upper-layer wirings 125 are alternately disposed along one virtual line 140 turning more than once (twice in the drawing). Moreover, in the second interlayer insulation film 123, the plurality of contact vias 124 are buried, by which the lower-layer wirings 121 and the upper-layer wirings 125 are electrically connected in series.

In the same wiring layer as that of the lower-layer wirings 121, a lattice lower-layer dummy pattern 146 is formed, which surrounds the respective lower-layer wirings 121 individually. Moreover, in the same wiring layer as that of the upper-layer wirings 125, a lattice upper-layer dummy pattern 147 is formed, which surrounds the respective upper-layer wirings 125 individually.

Also in this embodiment, a space between the lower-layer wirings 121 and the lower-layer dummy pattern 146 and a space between the upper-layer wirings 125 and the upper-layer dummy pattern 147 are set, for example, in accordance with the minimum space between the wirings in the chip formation portion. Thus, an effect similar to that of the fourth embodiment can be obtained.

(Twelfth Embodiment)

Figure 34:
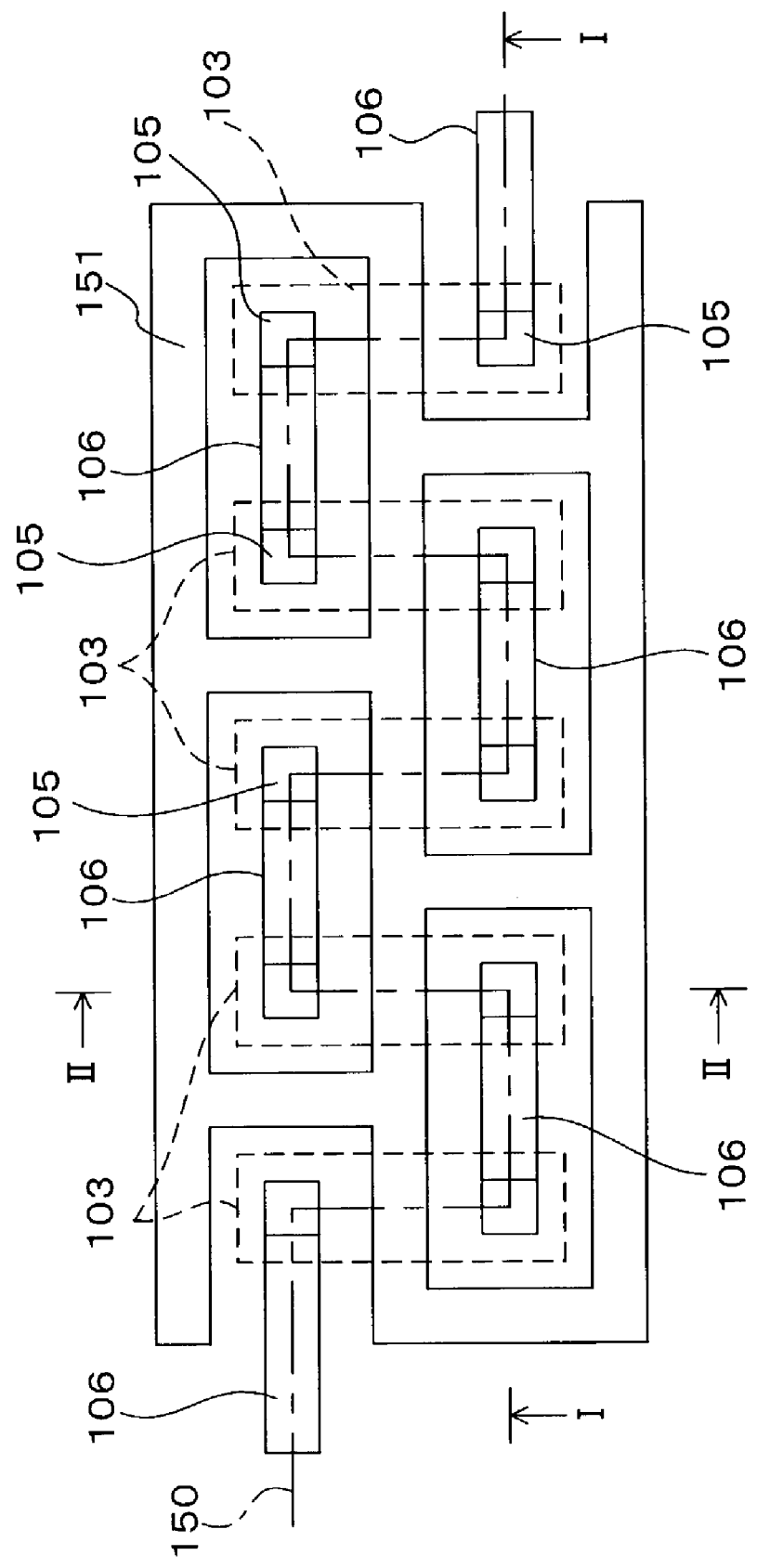
FIG. 34 is a top plan view showing a monitor pattern of a semiconductor device of a twelfth embodiment of the present invention.

FIG. 34 is a top plan view showing a monitor pattern of a semiconductor device of a twelfth embodiment of the present invention. FIG. 35A is a cross-section view along I—I line of FIG. 34, and FIG. 35B is a cross-section view along II—II line of FIG. 34. Note that, in FIGS. 34, 35A and 35B, identical constituent components to those of FIGS. 6, 7A and 7B are denoted by identical reference numerals.

The plurality of diffused resistors 103, which are formed by introducing impurities at high concentration into the semiconductor substrate 101, are provided in the semiconductor substrate 101. Moreover, on the interlayer insulation film 104, the plurality of wirings (resistive elements) 106 are formed. These diffused resistors 103 and wirings 106 are alternately disposed along a zigzag virtual line 150. Specifically, the wirings 106 are disposed aligning its longitudinal direction with a horizontal direction, and the diffused resistors 103 are disposed aligning its longitudinal direction with a vertical direction. Moreover, in the second interlayer insulation film 104, the plurality of contact vias 105 are buried, by which the wirings 106 and the diffused resistors 103 are electrically connected in series.

Furthermore, on the interlayer insulation film 104, a lattice dummy pattern 151 is formed, which surrounds the respective wirings 106 individually.

Also in this embodiment, a space between the lower-layer wirings 121 and a lower-layer dummy pattern 152 and a space between the upper-layer wirings 125 and an upper-layer dummy pattern 153 are set, for example, in accordance with the minimum space between the wirings in the chip formation portion. Thus, an effect similar to that of the first embodiment can be obtained.

(Thirteenth Embodiment)

Figure 36:
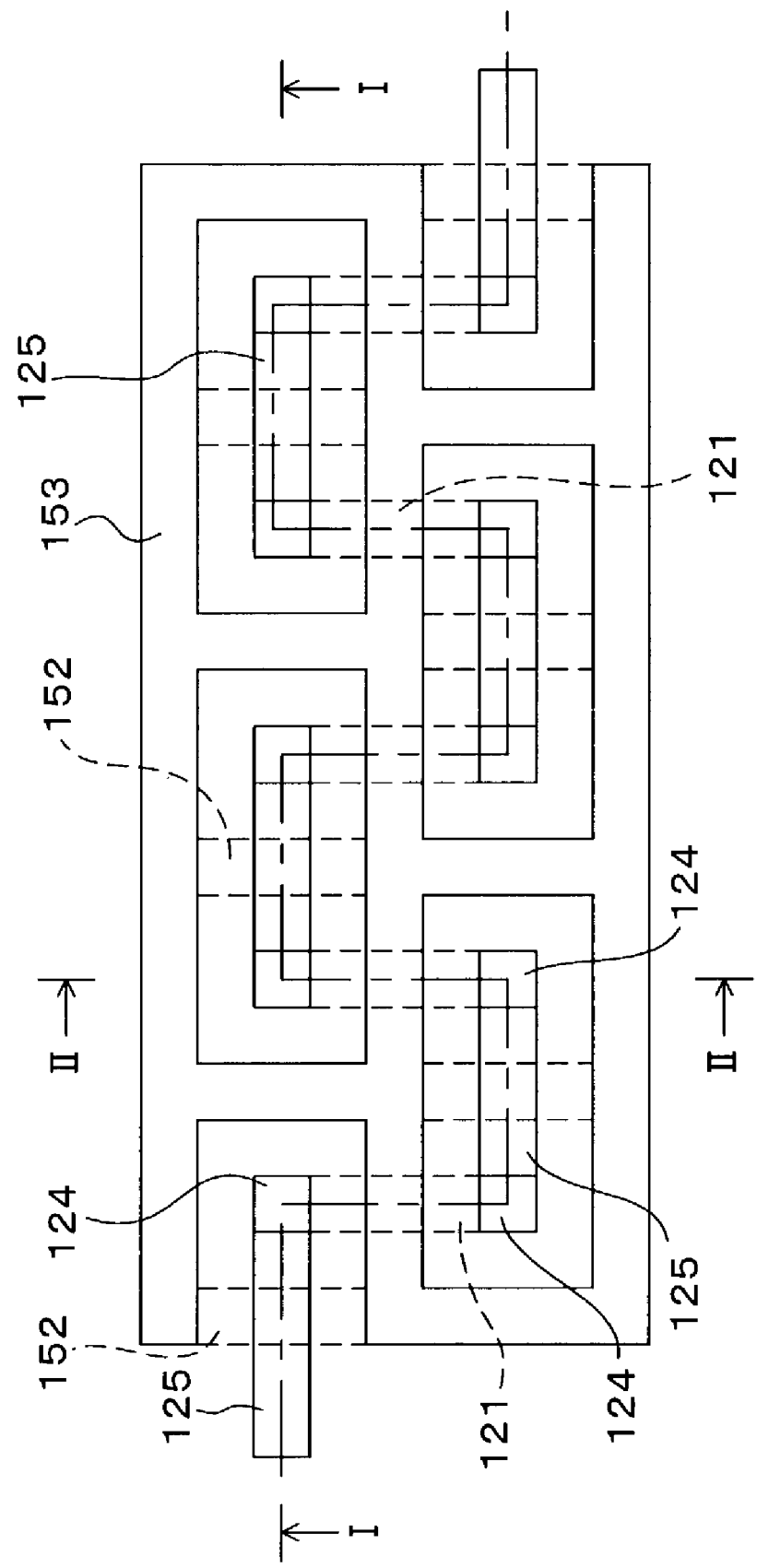
FIG. 36 is a top plan view showing a monitor pattern of a semiconductor device of a thirteenth embodiment of the present invention.

FIG. 36 is a top plan view showing a monitor pattern of a semiconductor device of a thirteenth embodiment of the present invention. FIG. 37A is a cross-section view along I—I line of FIG. 36, and FIG. 37B is a cross-section view along II—II line of FIG. 36. Note that, in FIGS. 36, 37A and 37B, identical constituent components to those of FIGS. 14, 15A and 15B are denoted by identical reference numerals.

On the semiconductor substrate 101, the plurality of lower-layer wirings (resistive elements) 121 on the first interlayer insulation film (not shown) are formed. Moreover, on the second interlayer insulation film 123, the plurality of upper-layer wirings (resistive elements) 125 are formed. These lower-layer wirings 121 and the upper-layer wirings 125 are alternately disposed along the zigzag virtual line 150. Specifically, the upper-layer wirings 125 are disposed aligning its longitudinal direction with a horizontal direction, and the lower-layer wirings 121 are disposed aligning its longitudinal direction with a vertical direction.

Moreover, in the second interlayer insulation film 123, the plurality of contact vias 124 are buried, by which the lower-layer wirings 121 and the upper-layer wirings 125 are electrically connected in series.

In the same wiring layer as that of the lower-layer wirings 121, a lattice lower-layer dummy pattern 152 is formed, which surrounds the respective lower-layer wirings 121 individually. Moreover, in the same wiring layer as that of the upper-layer wirings 125, a lattice upper-layer dummy pattern 153 is formed, which surrounds the respective upper-layer wirings 125 individually.

Also in this embodiment, a space between the lower-layer wirings 121 and the lower-layer dummy pattern 152 and a space between the upper-layer wirings 125 and the upper-layer dummy pattern 153 are set, for example, in accordance with the minimum space between the wirings in the chip formation portion. Thus, an effect similar to that of the fourth embodiment can be obtained.

(Fourteenth Embodiment)

Figure 38:
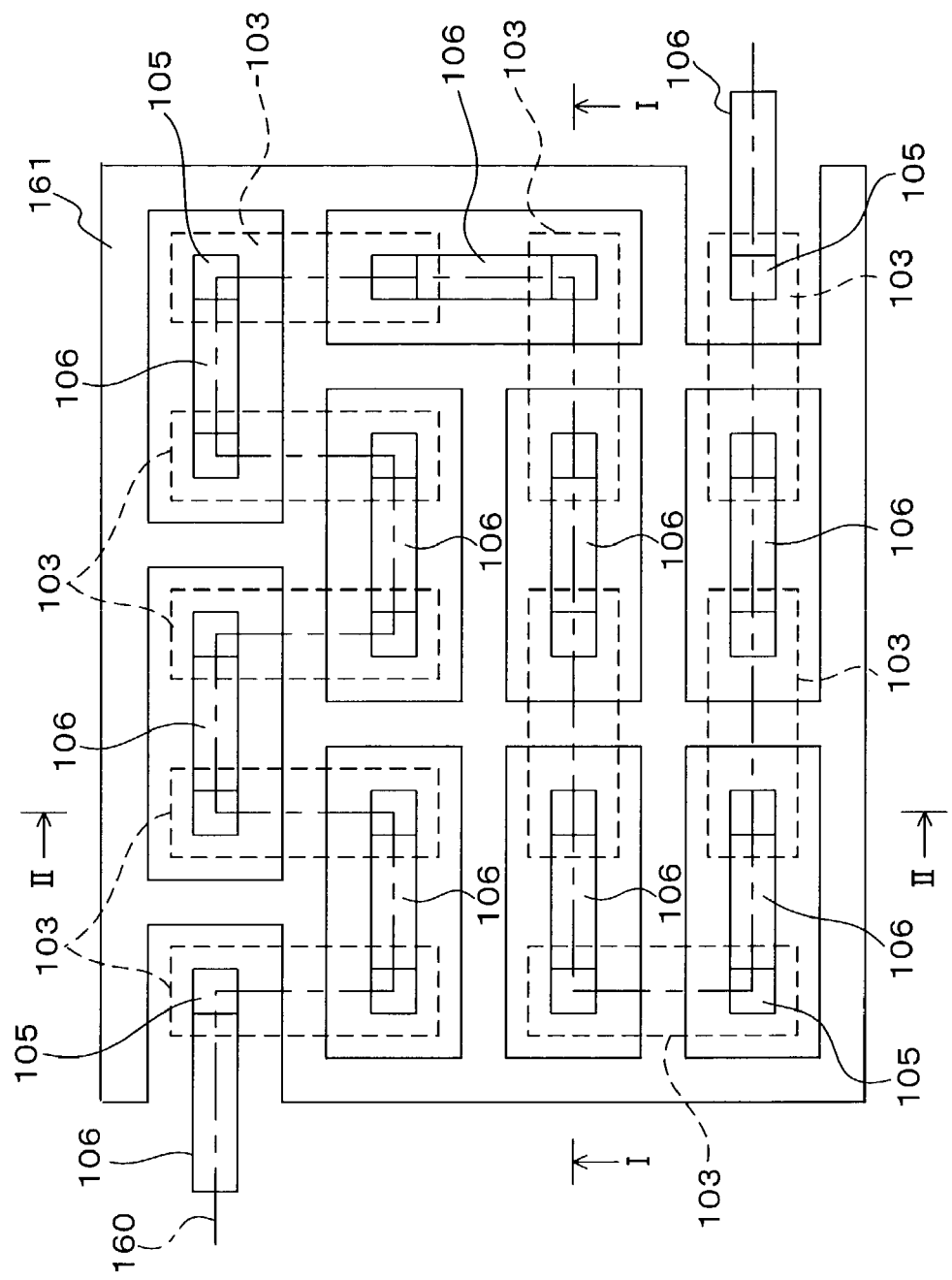
FIG. 38 is a top plan view showing a monitor pattern of a semiconductor device of a fourteenth embodiment of the present invention.
Figure 39A:
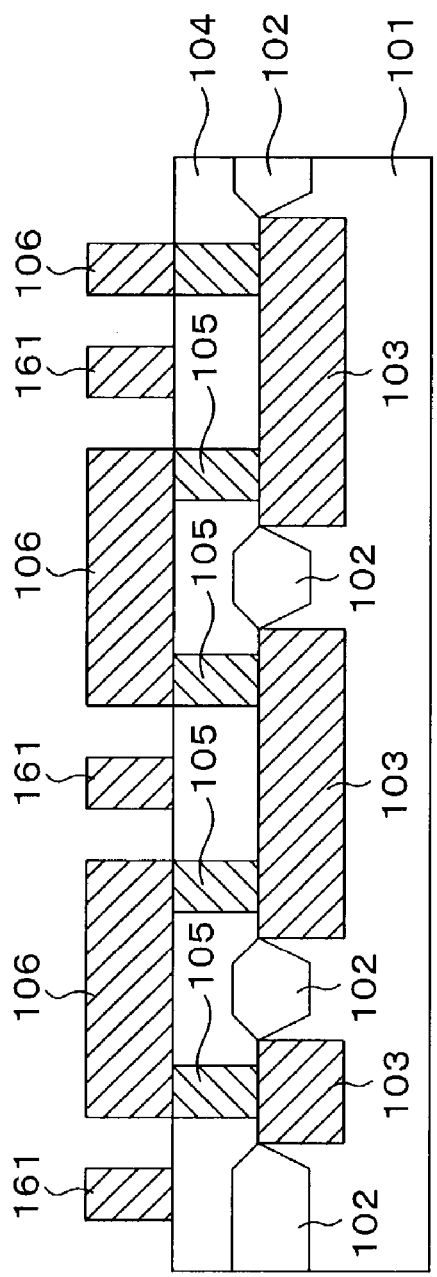
FIG. 39A is a cross-section view along I—I line of FIG. 38.
Figure 39B:
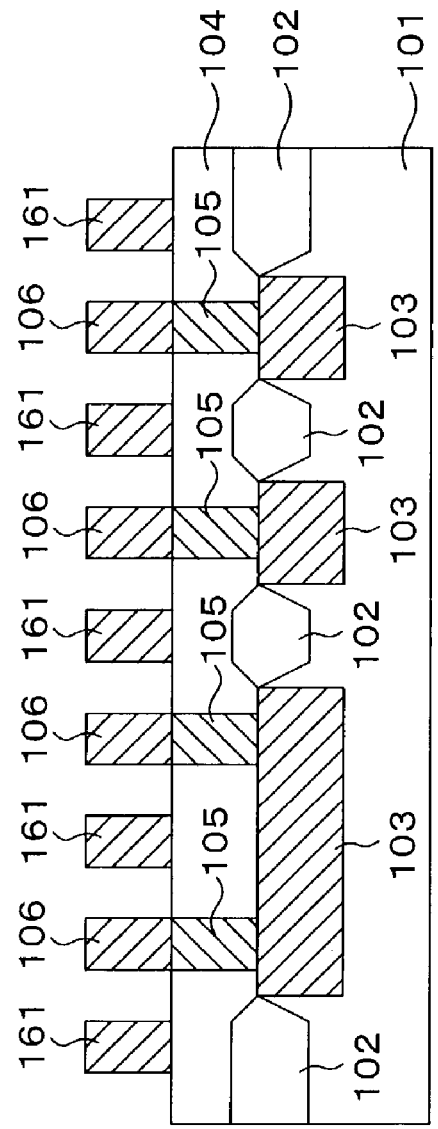
FIG. 39B is a cross-section view along II—II line of FIG. 38.

FIG. 38 is a top plan view showing a monitor pattern of a semiconductor device of a fourteenth embodiment of the present invention. FIG. 39A is a cross-section view along I—I line of FIG. 38, and FIG. 39B is a cross-section view along II—II line of FIG. 38. Note that, in FIGS. 38, 39A and 39B, identical constituent components to those of FIGS. 6, 7A and 7B are denoted by identical reference numerals.

The plurality of diffused resistors 103, which are formed by introducing impurities at high concentration into the semiconductor substrate 101, are provided in the semiconductor substrate 101. Moreover, on the interlayer insulation film 104, the plurality of wirings (resistive elements) 106 are formed. These diffused resistors 103 and wirings 106 are alternately disposed along one virtual line 160 having a number of flections. Moreover, in the interlayer insulation film 104, the plurality of contact vias 105 are buried, by which the wirings 106 and the diffused resistors 103 are electrically connected in series.

Furthermore, in the same wiring layer as that of the wirings 106, a lattice dummy pattern 161 is formed, which surrounds the respective wirings 106 individually.

Also in this embodiment, a space between the wirings 106 and the dummy pattern 161 is set, for example, in accordance with the minimum space between the wirings in the chip formation portion. Thus, an effect similar to that of the first embodiment can be obtained. Moreover, in this embodiment, a change in a resistance value due to positional changes of the diffused resistors 103 and the wirings 106 in the horizontal and vertical directions can be detected.

(Fifteenth Embodiment)

Figure 40:
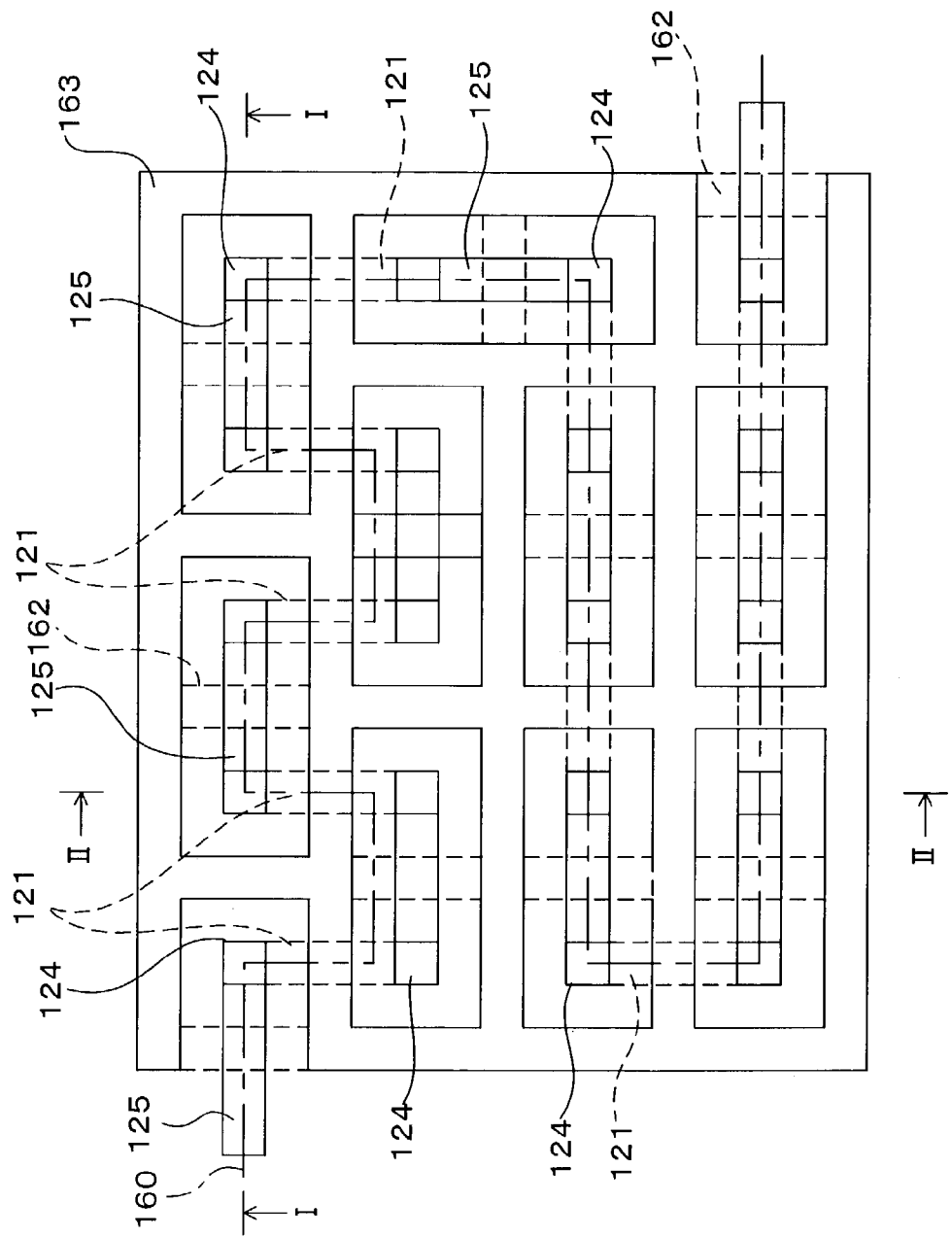
FIG. 40 is a top plan view showing a monitor pattern of a semiconductor device of a fifteenth embodiment of the present invention.
Figure 41A:
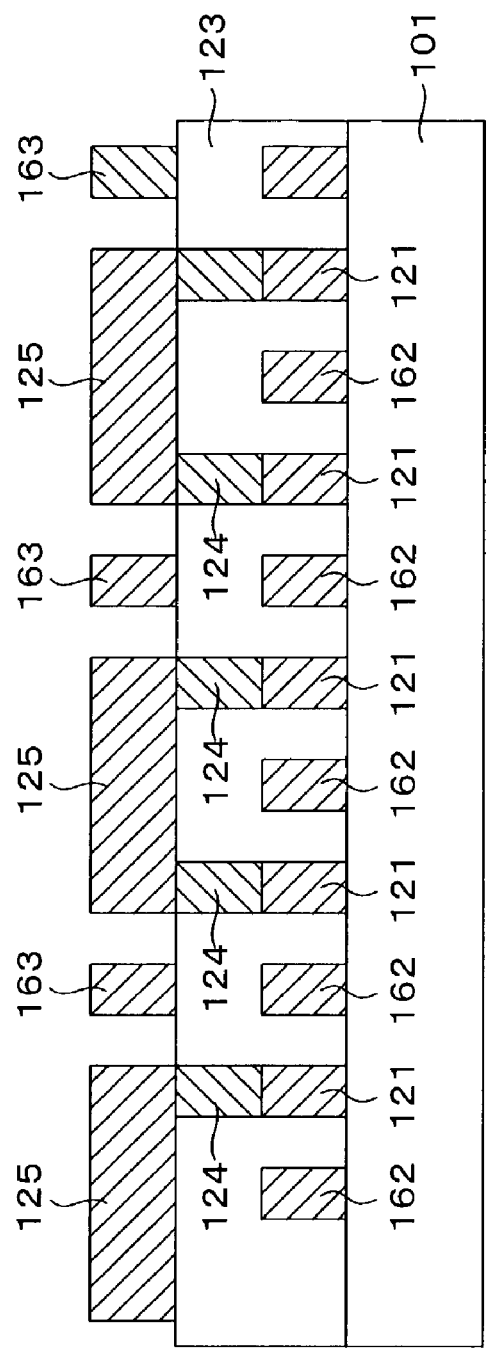
FIG. 41A is a cross-section view along I—I line of FIG. 40.
Figure 41B:
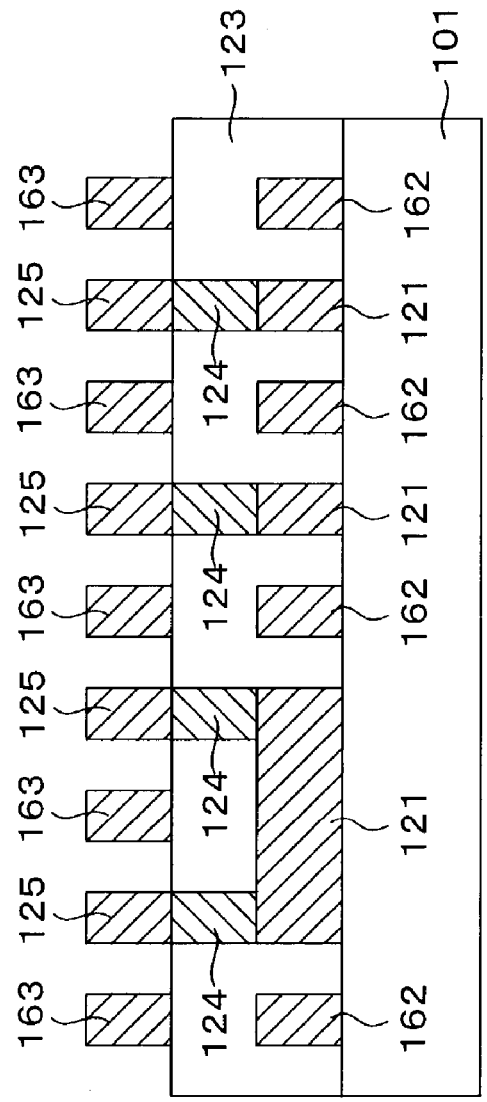
FIG. 41B is a cross-section view along II—II line of FIG. 40.

FIG. 40 is a top plan view showing a monitor pattern of a semiconductor device of a fifteenth embodiment of the present invention. FIG. 41A is a cross-section view along I—I line of FIG. 40, and FIG. 41B is a cross-section view along II—II line of FIG. 40. Note that, in FIGS. 40, 41A and 41B, identical constituent components to those of FIGS. 14, 15A and 15B are denoted by identical reference numerals.

On the semiconductor substrate 101, the plurality of lower-layer wirings (resistive elements) 121 on the first interlayer insulation film (not shown) are formed. These lower-layer wirings 121 are covered with the second interlayer insulation film 123, and on the second interlayer insulation film 123, the plurality of upper-layer wirings (resistive elements) 125 are formed.

These lower-layer wirings 121 and upper-layer wirings 125 are alternately disposed along the one virtual line 160 having a number of flections. Moreover, in the second interlayer insulation film 123, the plurality of contact vias 124 are buried, by which the lower-layer wirings 121 and the upper-layer wirings 125 are electrically connected in series.

In the same wiring layer as that of the lower-layer wirings 121, a lattice lower-layer dummy pattern 162 is formed, which surrounds the respective lower-layer wirings 121 individually. Moreover, in the same wiring layer as that of the upper-layer wirings 125, a lattice upper-layer dummy pattern 163 is formed, which surrounds the respective upper-layer wirings 125 individually. Note that the upper-layer wirings 125 positioned at ends of the monitor pattern extend out of the upper-layer dummy pattern 163 through notched portions of the upper-layer dummy pattern 163.

Also in this embodiment, a space between the lower-layer wirings 121 and the lower-layer dummy pattern 162 and a space between the upper-layer wirings 125 and the upper-layer dummy pattern 163 are set, for example, in accordance with the minimum space between the wirings in the chip formation portion. Thus, an effect similar to that of the fourth embodiment can be obtained. Moreover, in this embodiment, a change in a resistance value due to positional changes of the lower-layer wirings 121 and the upper-layer wirings 125 in the horizontal and vertical directions can be detected.

(Sixteenth Embodiment)

Figure 42:
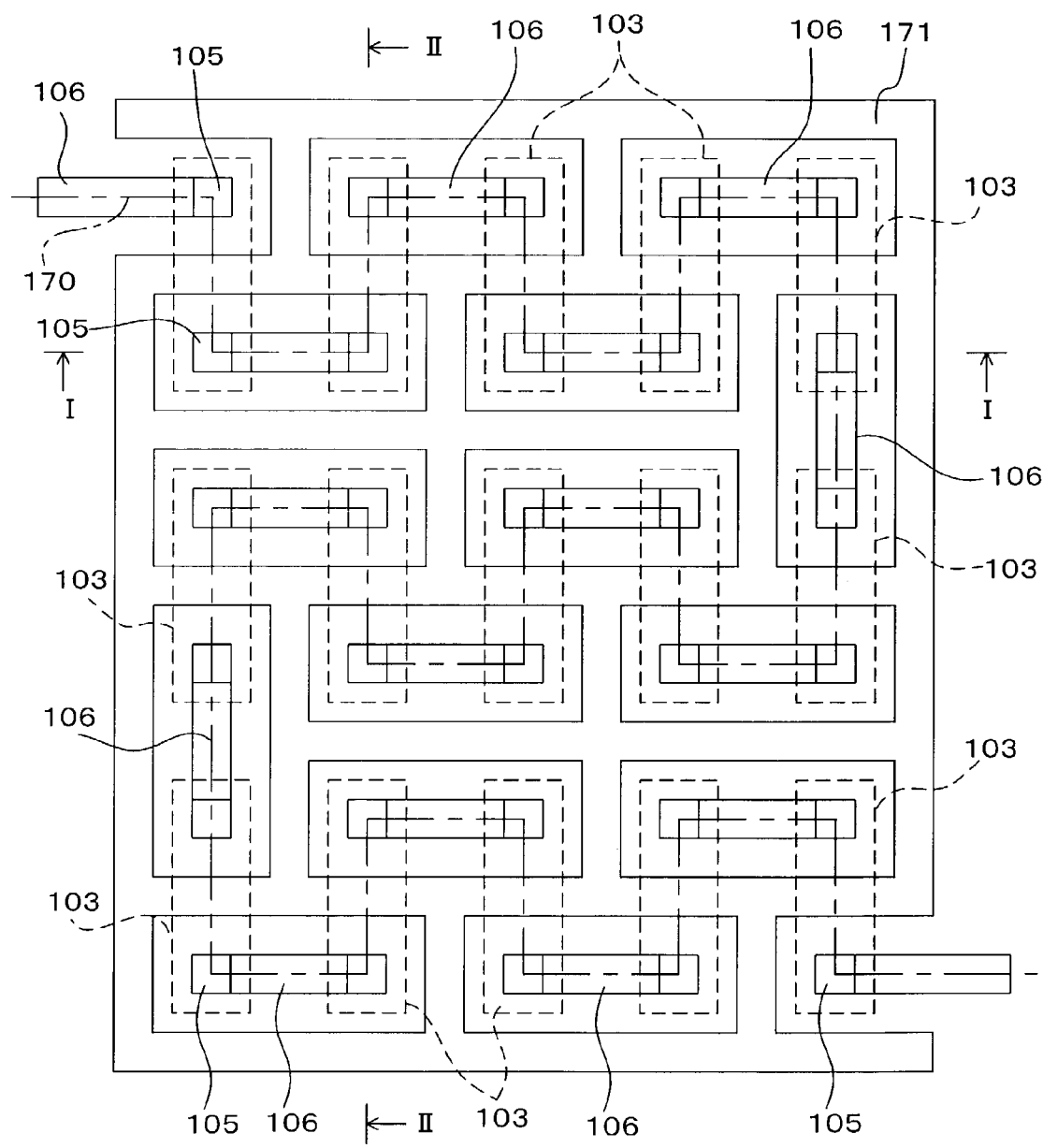
FIG. 42 is a top plan view showing a monitor pattern of a semiconductor device of a sixteenth embodiment of the present invention.
Figure 43A:
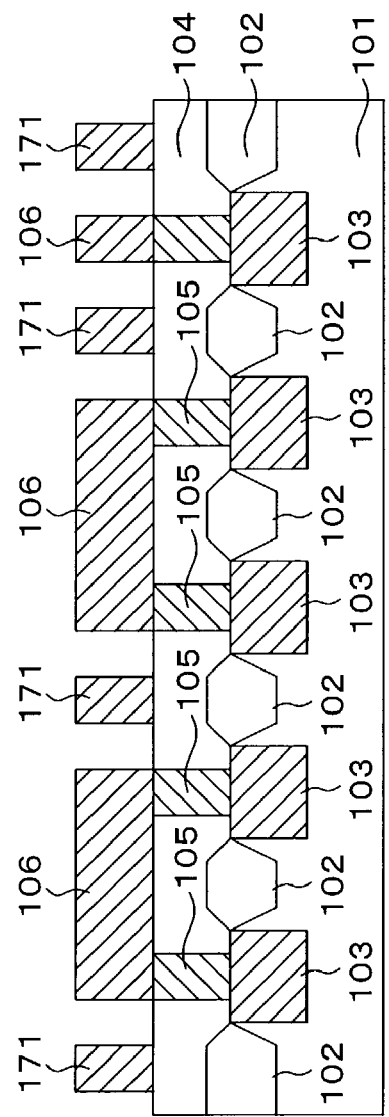
FIG. 43A is a cross-section view along I—I line of FIG. 42.
Figure 43B:
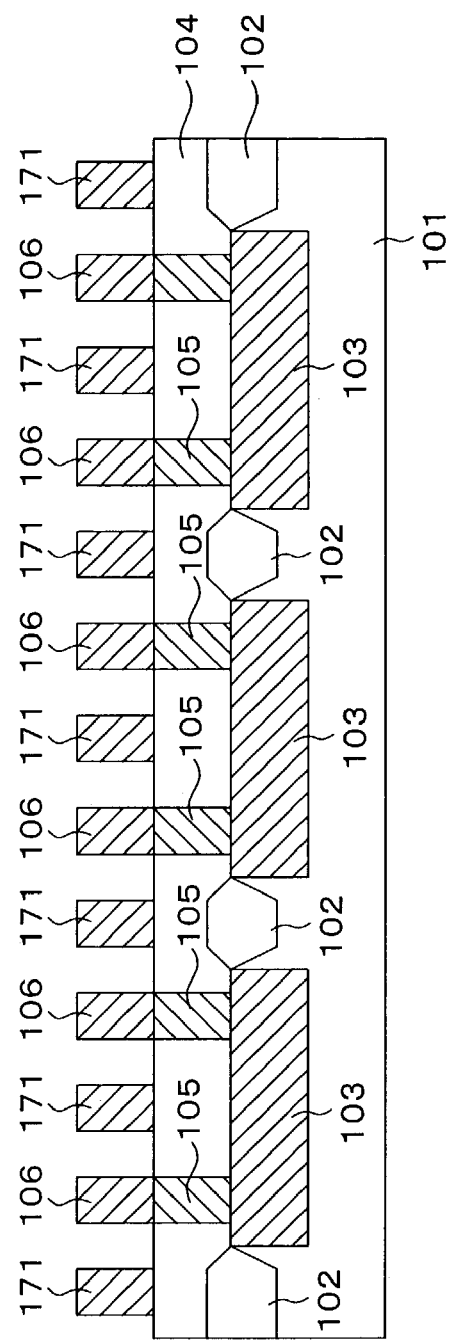
FIG. 43B is a cross-section view along II—II line of FIG. 42.

FIG. 42 is a top plan view showing a monitor pattern of a semiconductor device of a sixteenth embodiment of the present invention. FIG. 43A is a cross-section view along I—I line of FIG. 42, and FIG. 43B is a cross-section view along II—II line of FIG. 42. Note that, in FIGS. 42, 43A and 43B, identical constituent components to those of FIGS. 6, 7A and 7B are denoted by identical reference numerals.

The plurality of diffused resistors 103, which are formed by introducing impurities at high concentration into the semiconductor substrate 101, are provided in the semiconductor substrate 101. Moreover, on the interlayer insulation film 104, the plurality of wirings (resistive elements) 106 are formed. These diffused resistors 103 and wirings 106 are alternately disposed along one virtual line 170 having a number of flections. Moreover, in the interlayer insulation film 104, the plurality of contact vias 105 are buried, by which the wirings 106 and the diffused resistors 103 are electrically connected in series.

Furthermore, in the same wiring layer as that of the wirings 106, a lattice dummy pattern 171 is formed, which surrounds the respective wirings 106 individually.

Also in this embodiment, a space between the wirings 106 and the dummy pattern 171 is set, for example, in accordance with the minimum space between the wirings in the chip formation portion. Thus, an effect similar to that of the first embodiment can be obtained.

(Seventeenth Embodiment)

Figure 44:
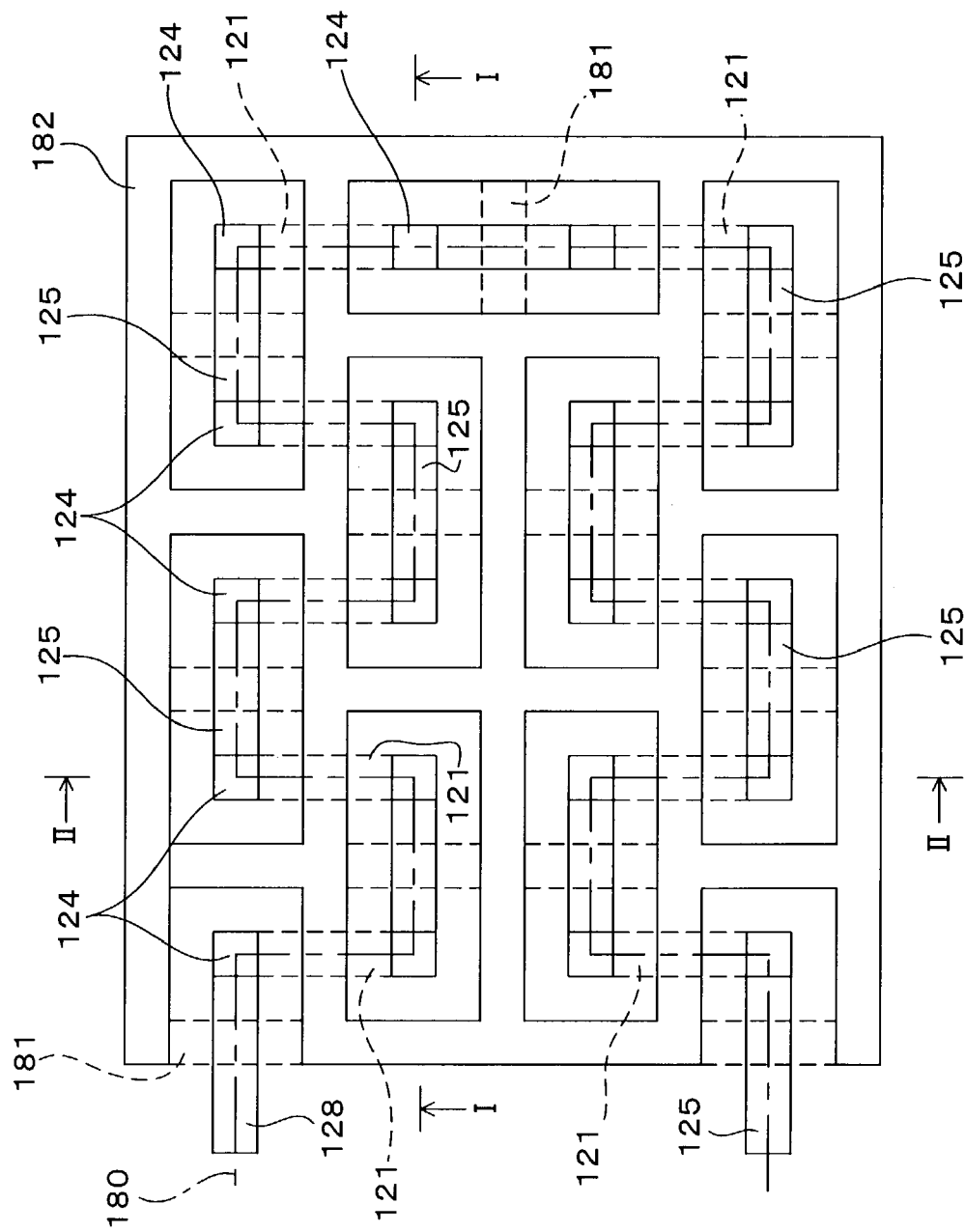
FIG. 44 is a top plan view showing a monitor pattern of a semiconductor device of a seventeenth embodiment of the present invention.

FIG. 44 is a top plan view showing a monitor pattern of a semiconductor device of a seventeenth embodiment of the present invention. FIG. 45A is a cross-section view along I—I line of FIG. 44, and FIG. 45B is a cross-section view along II—II line of FIG. 44. Note that, in FIGS. 44, 45A and 45B, identical constituent components to those of FIGS. 14, 15A and 15B are denoted by identical reference numerals.

On the semiconductor substrate 101, the plurality of lower-layer wirings (resistive elements) 121 on the first interlayer insulation film (not shown) are formed. These lower-layer wirings 121 are covered with the second interlayer insulation film 123, and on the second interlayer insulation film 123, the plurality of upper-layer wirings (resistive elements) 125 are formed.

These lower-layer wirings 121 and upper-layer wirings 125 are alternately disposed along one virtual line 180 having a number of flections. Moreover, in the second interlayer insulation film 123, the contact vias 124 are buried, by which the lower-layer wirings 121 and the upper-layer wirings 125 are electrically connected in series.

In the same wiring layer as that of the lower-layer wirings 121, a lattice lower-layer dummy pattern 181 is formed, which surrounds the respective lower-layer wirings 121 individually. Moreover, also in the same wiring layer as that of the upper-layer wirings 125, a lattice upper-layer dummy pattern 182 is formed, which surrounds the respective upper-layer wirings 125 individually. Note that the upper-layer wirings 125 positioned at ends of the monitor pattern extend out of the upper-layer dummy pattern 182 through notched portions of the upper-layer dummy pattern 182.

Also in this embodiment, a space between the lower-layer wirings 121 and the lower-layer dummy pattern 181 and a space between the upper-layer wirings 125 and the upper-layer dummy pattern 182 are set, for example, in accordance with the minimum space between the wirings in the chip formation portion. Thus, an effect similar to that of the fourth embodiment can be obtained.

(Eighteenth Embodiment)

Hereinafter, description will be made for an eighteenth embodiment of the present invention.

Figure 46:
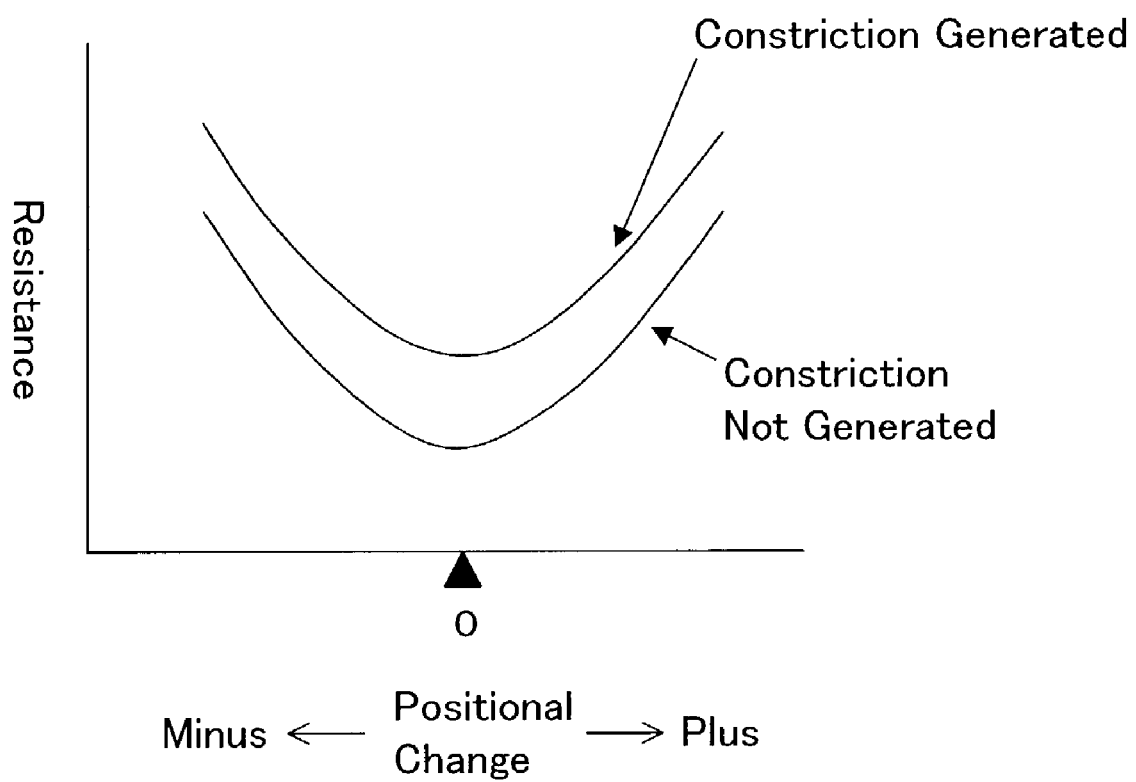
FIG. 46 is a graph showing changes in a resistance value in accordance with a degree of a positional change and presence of a constriction.

In all of the above-described first to seventeenth embodiments, described is the monitor pattern for detecting the abnormality caused mainly by the constrictions. As shown in a graph of FIG. 46, a resistance value of a monitor pattern having contact vias is influenced by both a positional change of the contact vias and a constriction of a wiring (a resistive element). When there is neither any constriction nor any positional change of the contact vias, the resistance of the contact has the lowest value. When the positional change occurs, the resistance value changes in accordance with a contact area between the wiring and the contact vias. When the constriction is generated, the resistance value increases as a whole.

In either of the first to seventeenth embodiments, it is impossible to determine whether the increase in the resistance value is caused by the constriction or by the positional change of the contact vias. Thus, in this embodiment, three kinds of monitor patterns, that is, first to third monitor patterns are formed on one semiconductor substrate (wafer), and a cause of abnormality is identified based on resistance values of the respective monitor patterns.

Figure 47:
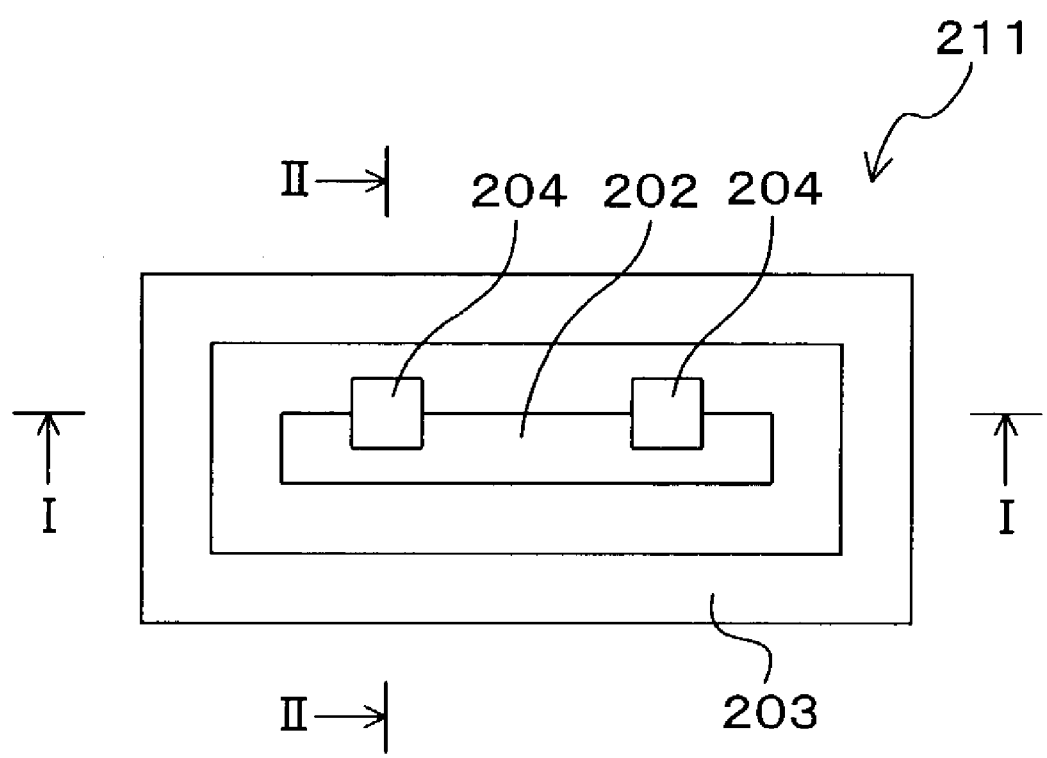
FIG. 47 is a top plan view showing one cell of a first monitor pattern according to an eighteenth embodiment of the present invention.
Figure 48A:
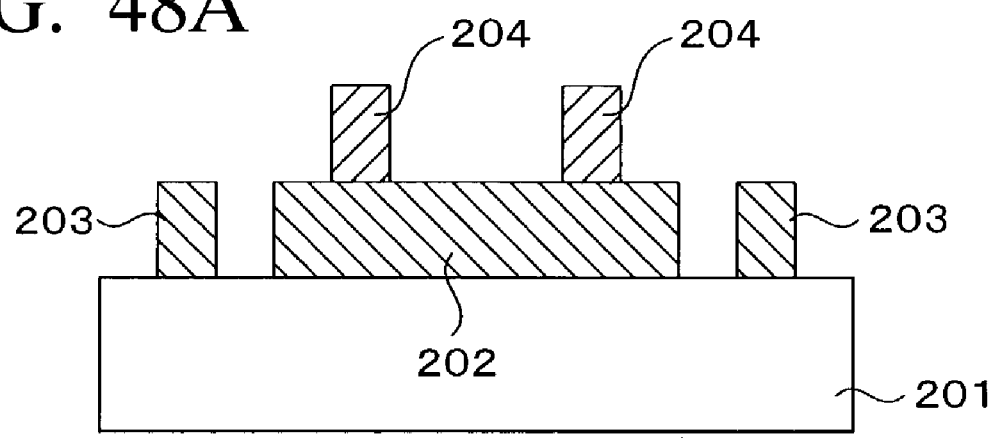
FIG. 48A is a cross-section view along I—I line of FIG. 47.
Figure 48B:
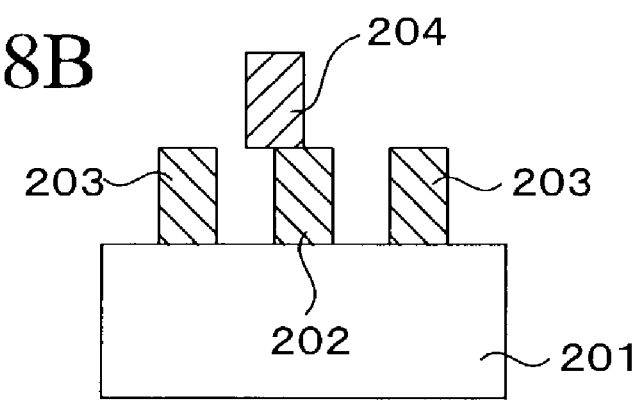
FIG. 48B is a cross-section view along II—II line of FIG. 47.
Figure 49:
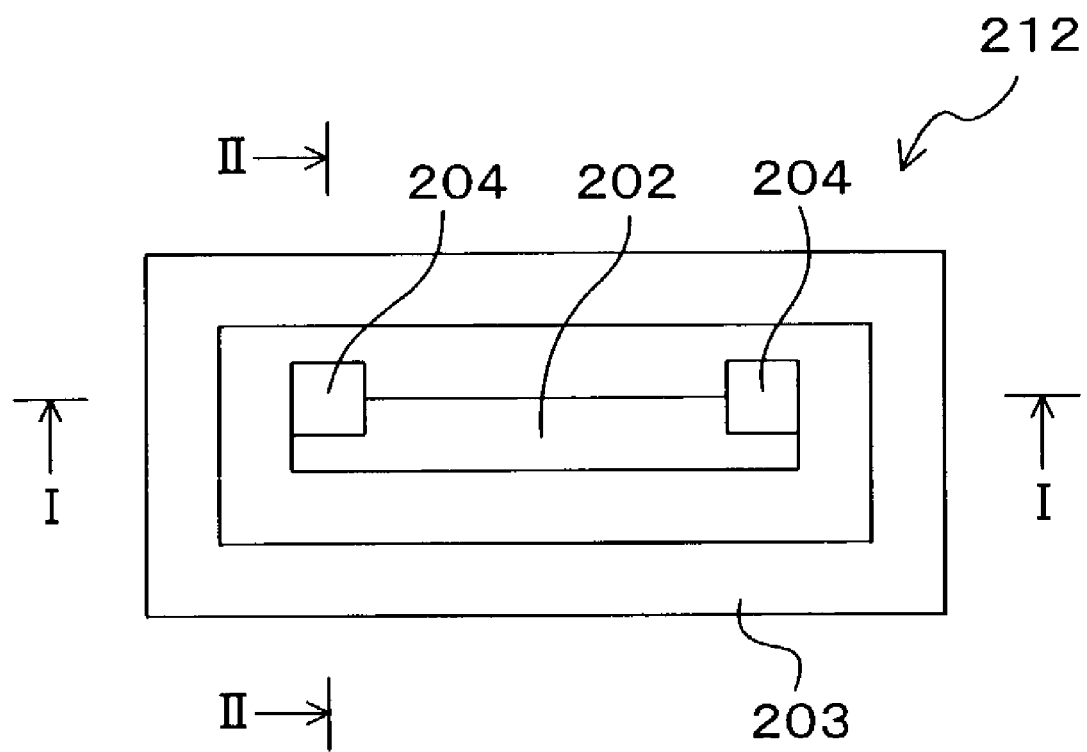
FIG. 49 is a top plan view showing one cell of a second monitor pattern according to the eighteenth embodiment.
Figure 50A:
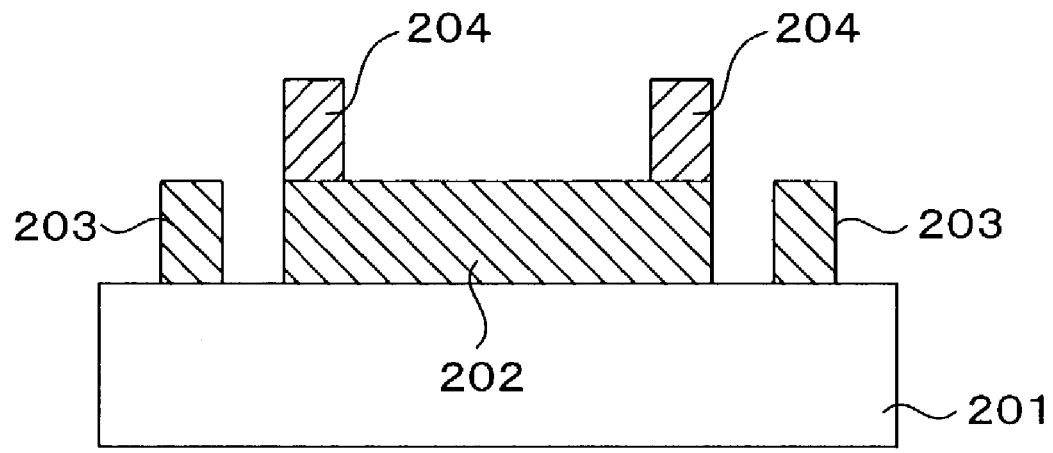
FIG. 50A is a cross-section view along I—I line of FIG. 49.
Figure 50B:
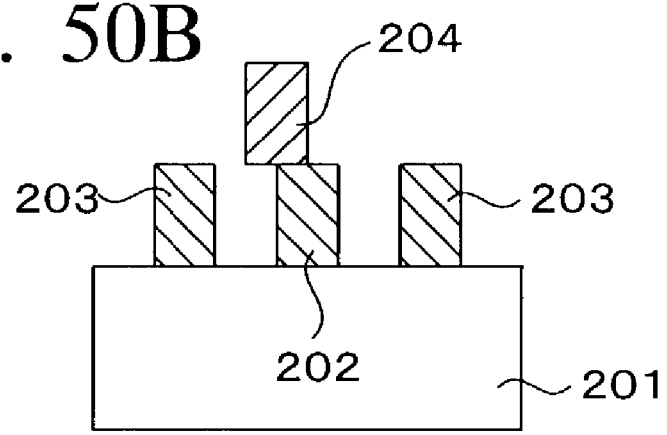
FIG. 50B is a cross-section view along II—II line of FIG. 49.
Figure 51:
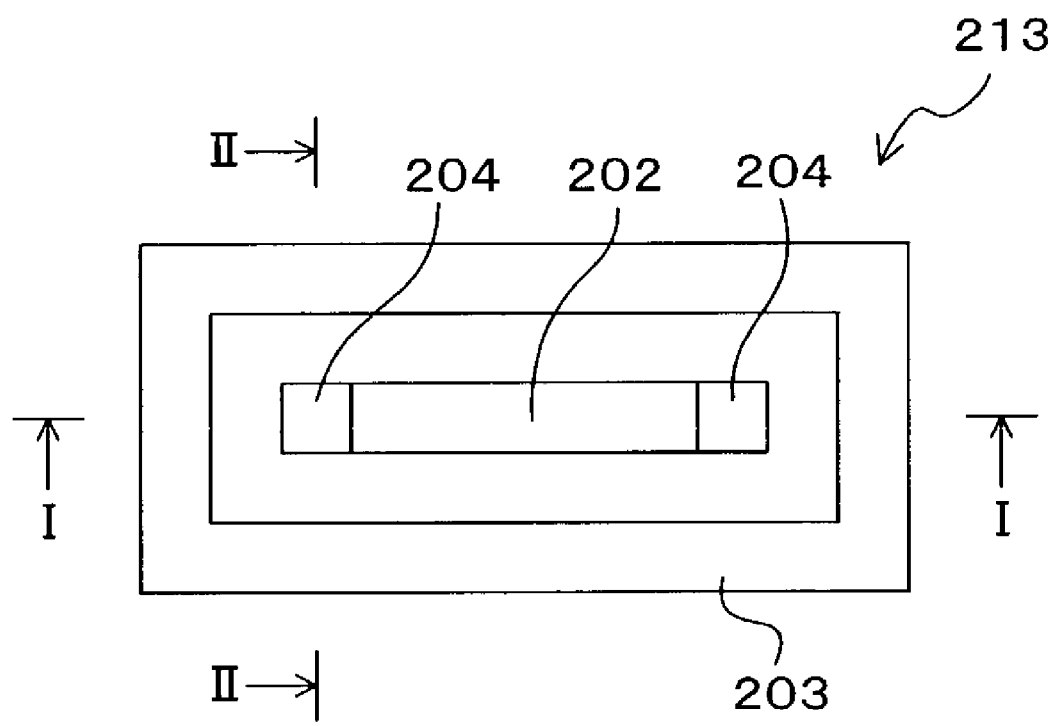
FIG. 51 is a top plan view showing one cell of a third monitor pattern according to the eighteenth embodiment.
Figure 52A:
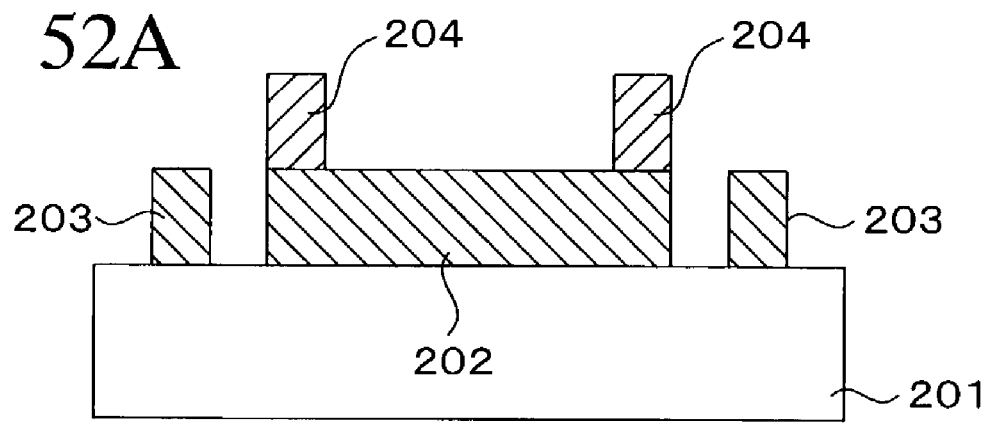
FIG. 52A is a cross-section view along I—I line of FIG. 51.
Figure 52B:
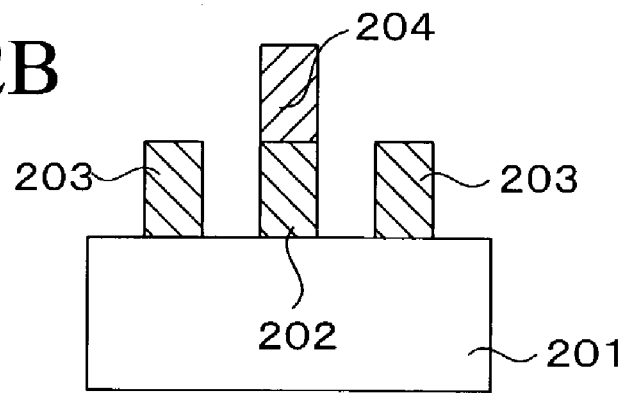
FIG. 52B is a cross-section view along II—II line of FIG. 51.

FIG. 47 is a top plan view showing one cell of a first monitor pattern, FIG. 48A is a cross-section view along I—I line of FIG. 47 and FIG. 48B is a cross-section view along II—II line of FIG. 47. Moreover, FIG. 49 is a top plan view showing one cell of a second monitor pattern, FIG. 50A is a cross-section view along I—I line of FIG. 49 and FIG. 50B is a cross-section view along II—II line of FIG. 49. Furthermore, FIG. 51 is a top plan view showing one cell of a third monitor pattern, FIG. 52A is a cross-section view along I—I line of FIG. 51 and FIG. 52B is a cross-section view along II—II line of FIG. 51. Note that illustration of upper-layer wirings is omitted in any of the above drawings.

A first monitor pattern 211 shown in FIGS. 47, 48A and 48B is a pattern for detecting positional changes of contact vias 204 (positional changes in up and down directions of FIG. 47). This first monitor pattern 211 is constituted by: a plurality of lower-layer wirings (resistive elements) 202 on a first interlayer insulation film (not shown) formed above a semiconductor substrate 201; dummy patterns surrounding the respective lower-layer wirings 202 independently; upper-layer wirings formed on a second interlayer insulation film covering these lower-layer wirings 202 and dummy patterns 203; and the contact vias 204 connecting the lower-layer wirings 202 and the upper-layer wirings.

Similarly to the fourth embodiment (see FIG. 14), the lower-layer wirings 202 and the upper-layer wirings are formed alternately along the virtual line. The contact vias 204 are disposed at positions inward by a specific distance from ends of the wiring 202 in its longitudinal direction, that is, at positions shifted toward an upper side of the page space of FIG. 49 in a width direction of the lower-layer wiring 202 by, for example, a half of the width of the lower-layer wiring 202. Therefore, when the contact vias 204 are shifted in the up and down directions of FIG. 47, a contact resistance changes, and when the contact vias 204 are shifted in right and left directions of FIG. 47, the contact resistance does not change.

A second monitor pattern 212 shown in FIGS. 49, 50A and 50B is a pattern for detecting effects of both the positional changes of the contact vias 204 and constrictions. In this second monitor pattern 212, the contact vias 204 are disposed at the both ends of the lower-layer wiring 202 in its longitudinal direction, that is, at positions shifted in the width direction of the lower-layer wiring 202 by, for example, a half of the width of the lower-layer wiring 202. The ends of the lower-layer wiring 202 are places where the constrictions are likely to be generated. Therefore, in the second monitor pattern 212, occurrence of at least any of the constrictions and the positional changes of the contact vias 204 increases the contact resistance.

A third monitor pattern 213 shown in FIGS. 51, 52A and 52B is a pattern for detecting constrictions. In this third monitor pattern 213, the contact vias 204 are disposed at positions aligned with the both ends of the lower-layer wiring 202 in its longitudinal direction.

In this embodiment, a width of the lower-layer wiring 202 of the first monitor pattern 211 is 0.3 µm and a length thereof is 1.8 µm. Moreover, the contact vias 204 are disposed at positions apart from the both ends of the lower-layer wiring 202 by 0.15 µm and shifted in the width direction of the lower-layer wiring 202 by 0.15 µm.

A width of the lower-layer wiring 202 of the second monitor pattern 212 is 0.3 µm and a length thereof is 1.5 µm. Moreover, the contact vias 204 are disposed at positions shifted in the width direction of the lower-layer wiring 202 by 0.15 µm. A width of the lower-layer wiring 202 of the third monitor pattern 213 is 0.3 µm and a length thereof is 1.8 µm.

A width of each of the dummy patterns 203 is 0.3 µm and a space between the dummy pattern 203 and the lower-layer wiring 202 is 0.3 µm.

In this embodiment, 50 of the lower-layer wirings 202 of the first monitor pattern 211 and 51 of the upper-layer wirings thereof are alternately connected to each other by use of 100 of the contact vias 204. Similarly to the above, 50 of the lower-layer wirings 202 of the second monitor pattern 212 and 51 of the upper-layer wirings thereof are alternately connected to each other by use of 100 of the contact vias 204, and 50 of the lower-layer wirings 202 of the third monitor pattern 213 and 51 of the upper-layer wirings thereof are alternately connected to each other by use of 100 of the contact vias 204.

In this case, assuming that a resistance value of the third monitor pattern 213 when there is no positional change or constriction is 0.23 Ω, resistance values of the first and second monitor patterns 211 and 212 are 0.3 Ω.

For example, when the positions of the contact vias 204 are shifted in the longitudinal direction of the lower-layer wiring 202 (note that an amount of the positional change is 0.15 µm or less), the resistance value of the first monitor pattern 211 does not change, the resistance value of the second monitor pattern 212 increases by, for example, about 0.39 Ω, and the resistance value of the third monitor pattern 213 increases by about 0.3 Ω.

When the positions of the contact vias 204 are shifted in the width direction of the lower-layer wiring 202, the resistance values of the first to third monitor patterns 211, 212 and 213 change, respectively, in accordance with the amount of the positional changes.

Moreover, the resistance values of the second and third monitor patterns 212 and 213 increase in response to the generated constrictions. For example, the resistance value of the second monitor pattern 212 becomes 440 Ω, and the resistance value of the third monitor pattern 213 becomes 360 Ω. In the first monitor pattern 211, the contact vias 204 are disposed at the positions apart from the ends of the wiring 202. Thus, even when the constrictions are generated in the second and third monitor patterns 212 and 213, generation of the constrictions is avoided in the first monitor pattern 211.

Therefore, when the examination device detects abnormality of the resistance values, it is possible to infer from the resistance values of the first to third monitor patterns 211, 212 and 213 that the abnormality results from the positional changes of the contact vias or from the generation of the constrictions.

(Nineteenth Embodiment)

Figure 53:
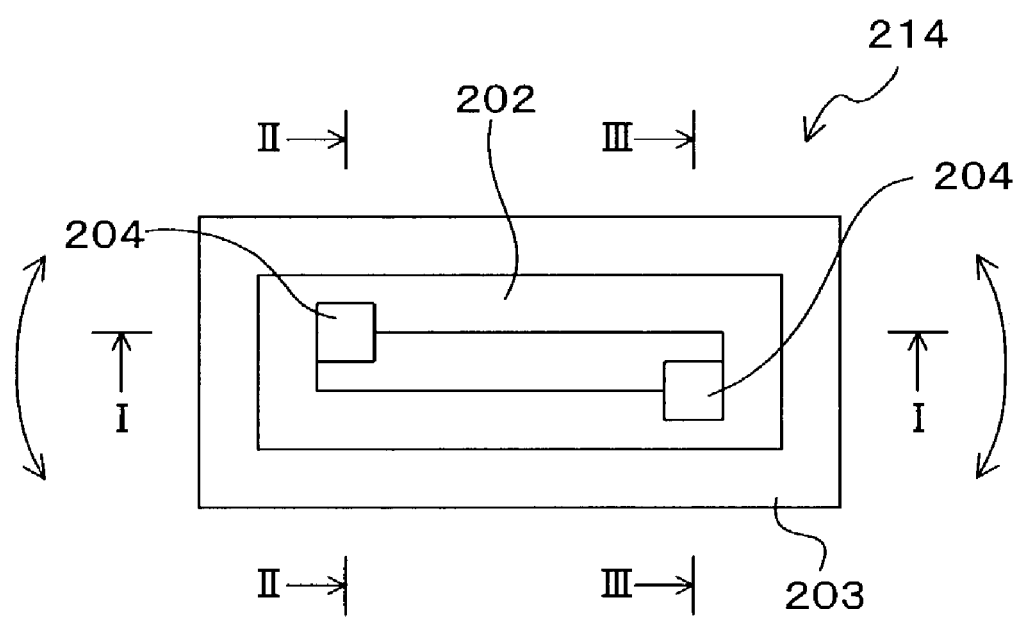
FIG. 53 is a top plan view showing one cell of a monitor pattern of a semiconductor device of a nineteenth embodiment of the present invention.
Figure 54A:
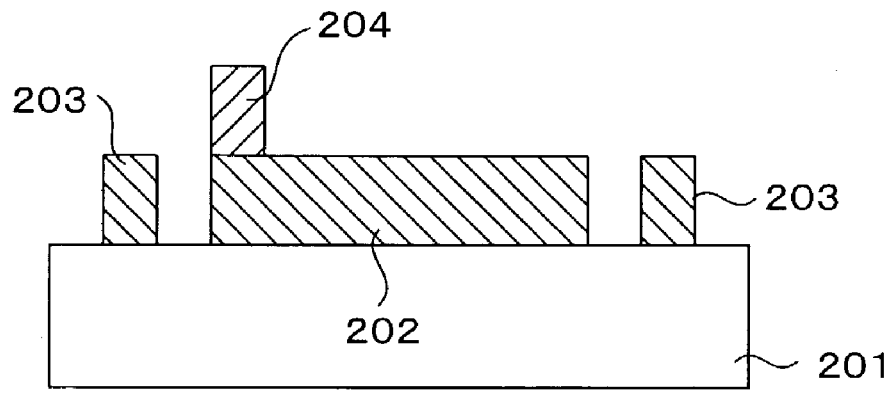
FIG. 54A is a cross-section view along I—I line of FIG. 53.
Figure 54B:
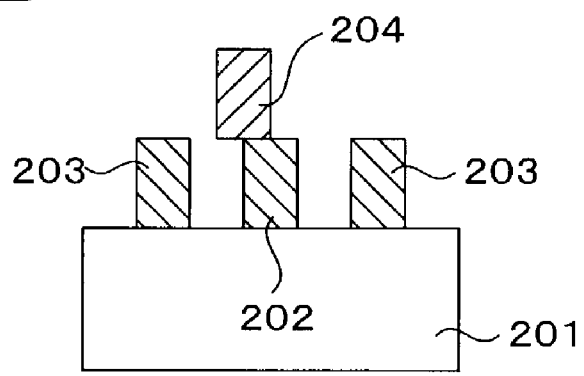
FIG. 54B is a cross-section view along II—II line of FIG. 53
Figure 54C:
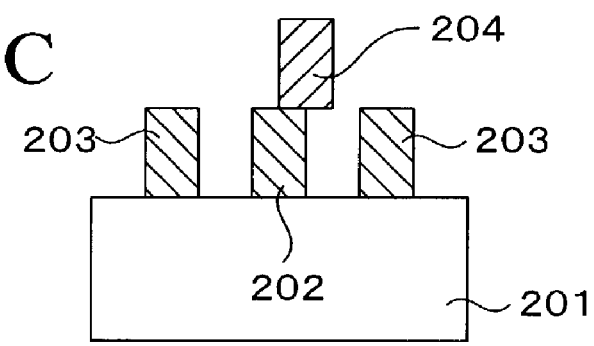
FIG. 54C is a cross-section view along III—III line of FIG. 53.

FIG. 53 is a plan view showing one cell of a monitor pattern 214 of a semiconductor device of a nineteenth embodiment of the present invention, FIG. 54A is a cross-section view along I—I line of FIG. 53, FIG. 54B is a cross-section view along II—II line of FIG. 53 and FIG. 54C is a cross-section view along III—III line of FIG. 53. Note that the monitor pattern shown in FIGS. 53, 54A, 54B and 54C corresponds to the second monitor pattern described in the eighteenth embodiment (see FIGS. 49, 50A and 50B). On the semiconductor substrate 201, the first and third monitor patterns described in the eighteenth embodiment are also formed.

In this embodiment, the contact via 204 at one end of the lower-layer wiring 202 is disposed at a position shifted toward an upper side of the page space of FIG. 53 by a half of the width of the lower-layer wiring 202. Moreover, the contact via 204 at the other end of the lower-layer wiring 202 is disposed at a position shifted toward a lower side of the page space of FIG. 53 by a half of the width of the lower-layer wiring 202.

In this embodiment, the positional changes of the contact vias 204 not only in the up and down directions but also in a rotating direction (a direction indicated by arrows in FIG. 53) can be detected.

(Twentieth Embodiment)

Figure 55:
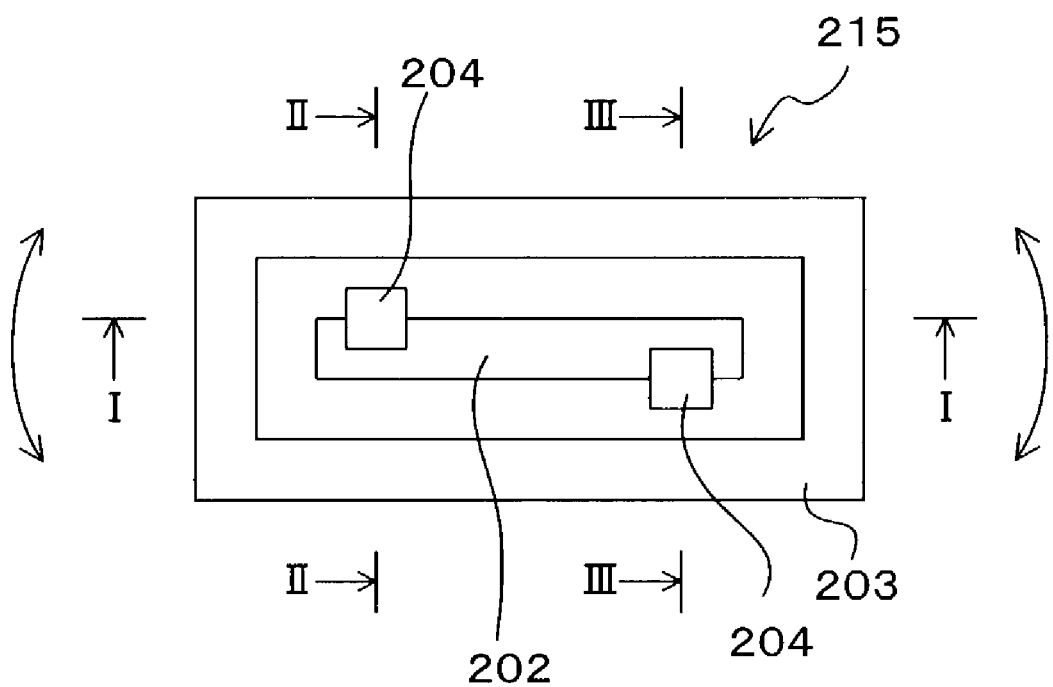
FIG. 55 is a top plan view showing one cell of a monitor pattern of a semiconductor device of a twentieth embodiment of the present invention.
Figure 56A:
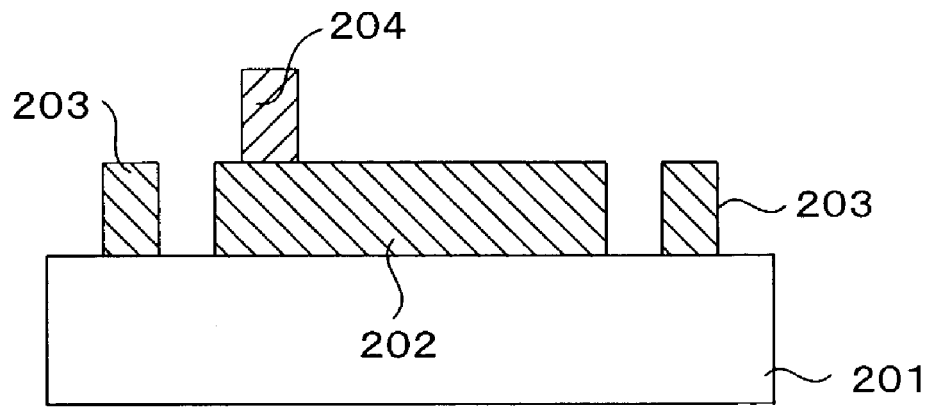
FIG. 56A is a cross-section view along I—I line of FIG. 55.
Figure 56B:
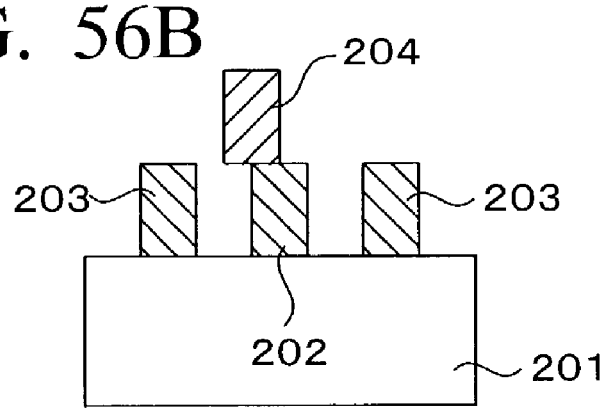
FIG. 56B is a cross-section view along II—II line of FIG. 55
Figure 56C:
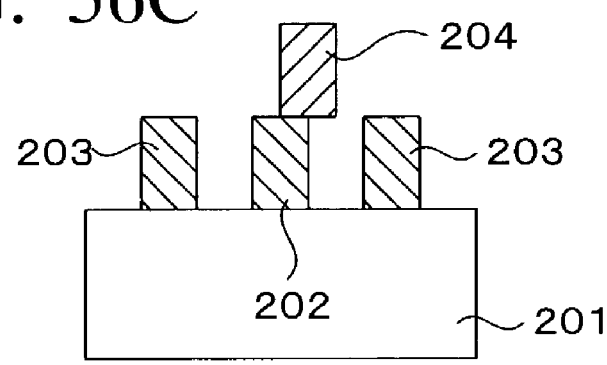
FIG. 56C is a cross-section view along III—III line of FIG. 55.

FIG. 55 is a plan view showing one cell of a monitor pattern of a semiconductor device of a twentieth embodiment of the present invention, FIG. 56A is a cross-section view along I—I line of FIG. 55, FIG. 56B is a cross-section view along II—II line of FIG. 55 and FIG. 56C is a cross-section view along III—III line of FIG. 55. Note that the monitor pattern 215 shown in FIGS. 55, 56A, 56B and 56C corresponds to the first monitor pattern described in the eighteenth embodiment (see FIGS. 47, 48A and 48B). On the semiconductor substrate 201, the second and third monitor patterns described in the eighteenth embodiment are also formed.

In this embodiment, the contact via 204 at one end of the lower-layer wiring 202 is disposed at a position apart from the one end of the wiring 202 by a specific distance, that is, at a position shifted toward an upper side of the page space of FIG. 55 by a half of the width of the lower-layer wiring 202. Moreover, the contact via 204 at the other end of the lower-layer wiring 202 is disposed at a position apart from the other end of the wiring 202 by a specific distance, that is, at a position shifted toward a lower side of the page space of FIG. 55 by a half of the width of the lower-layer wiring 202.

Also in this embodiment, the positional changes of the contact vias 204 not only in the up and down directions but also in a rotating direction (a direction indicated by arrows in FIG. 55) can be detected.

(Twenty-First Embodiment)

Hereinafter, description will be made for a twenty-first embodiment of the present invention. Also in this embodiment, three kinds of monitor patterns, that is, first to third monitor patterns are formed on a semiconductor substrate.

Figure 57:
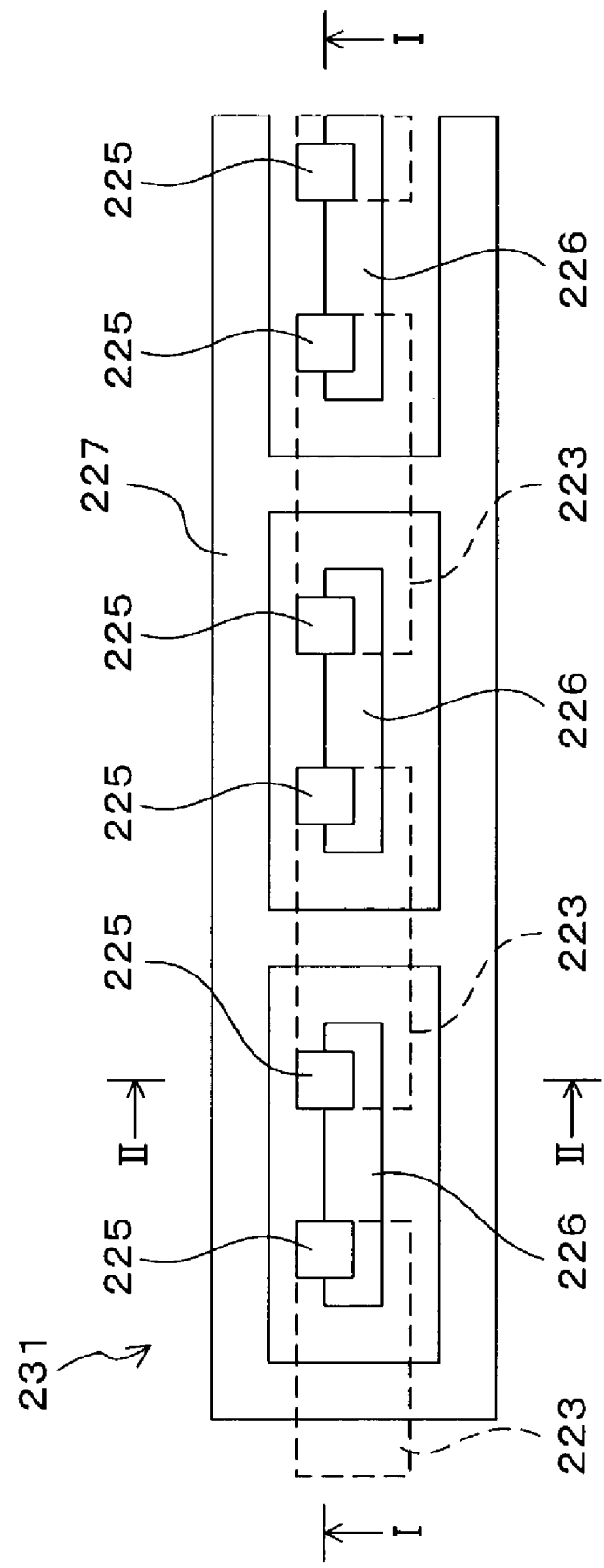
FIG. 57 is a top plan view showing a first monitor pattern 231 of a semiconductor device of a twenty-first embodiment of the present invention.
Figure 58A:
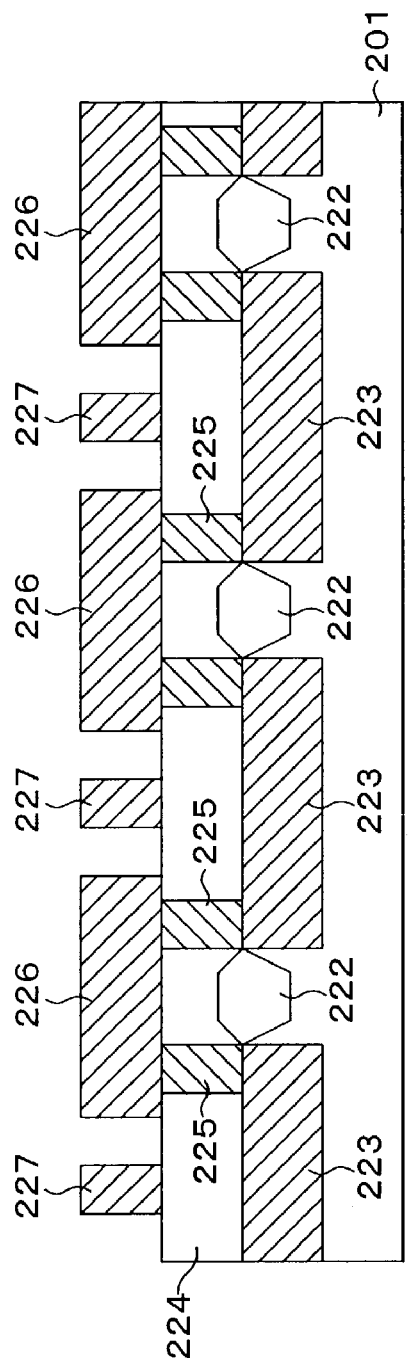
FIG. 58A is a cross-section view along I—I line of FIG. 57.
Figure 58B:
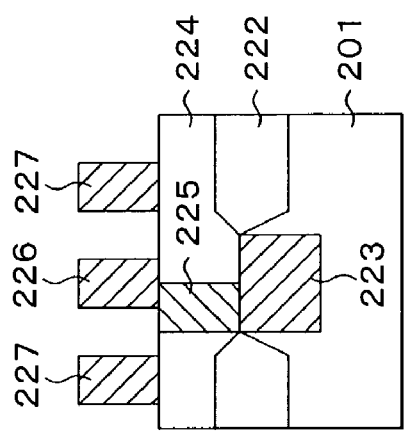
FIG. 58B is a cross-section view along II—II line of FIG. 57.

FIG. 57 is a top plan view showing a first monitor pattern 231 of a semiconductor device of the twenty-first embodiment of the present invention, FIG. 58A is a cross-section view along I—I line of FIG. 57, FIG. 58B is a cross-section view along II—II line of FIG. 57.

The semiconductor substrate 201 is separated into a plurality of element regions by an element separation film 222. In the element regions, a plurality of diffused resistors 223 are provided, which are formed by introducing impurities at high concentration into the semiconductor substrate 201. Moreover, on the semiconductor substrate 201, an interlayer insulation film 224 is formed. On this interlayer insulation film 224, a plurality of wirings (resistive elements) 226 are formed.

These diffused resistors 223 and wirings 226 are alternately disposed along a straight line. Moreover, in the interlayer insulation film 224, a plurality of contact vias 225 are buried, by which the wirings 226 and the diffused resistors 223 are electrically connected in series.

Furthermore, on the interlayer insulation film 224, a lattice dummy pattern 227 is formed, which surrounds the respective wirings 226 independently. This dummy pattern 227 is formed in the same wiring layer as that of the wirings 226.

In the first monitor pattern 231, the contact vias 225 are disposed at positions inward from ends in a longitudinal direction of the wiring 226 by a specific distance, that is, at positions shifted toward an upper side of the page space of FIG. 57 in a width direction of the wiring 226 by a half of the width of the wiring 226.

This first monitor pattern 231 is a pattern for detecting positional changes of the contact vias 225 (positional changes in up and down directions of FIG. 57).

Figure 59:
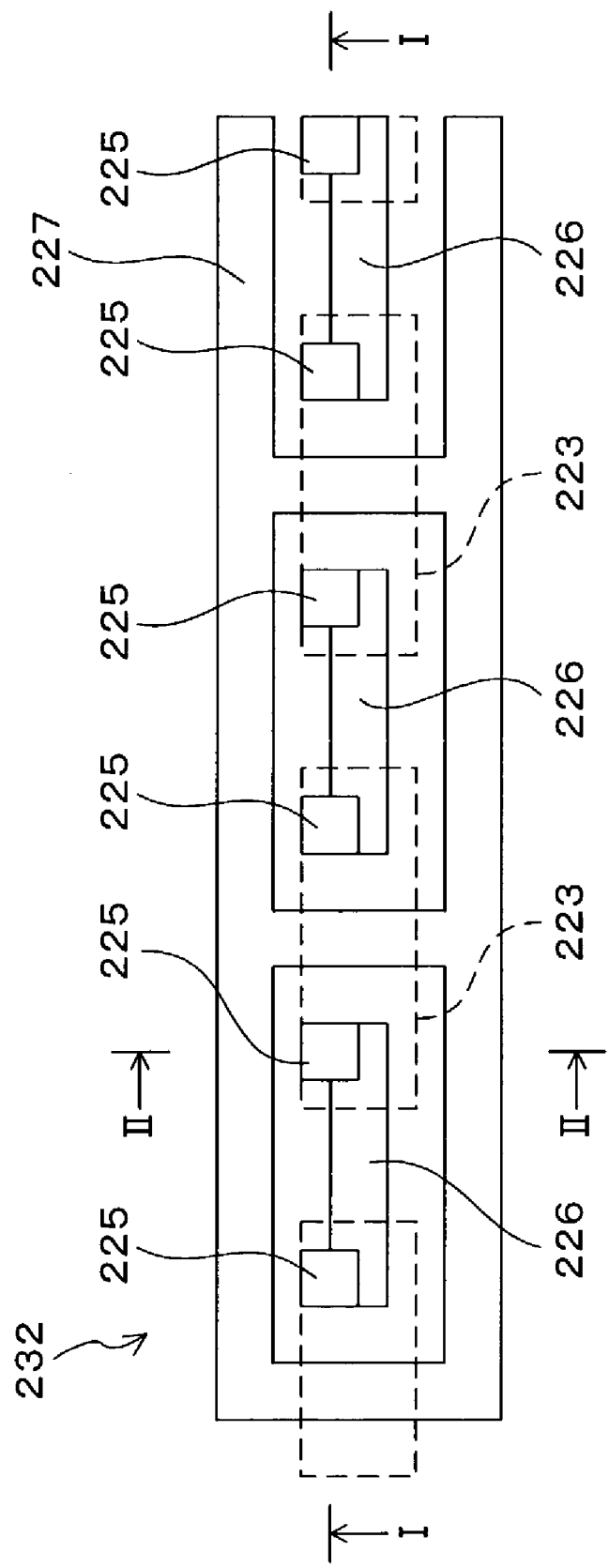
FIG. 59 is a top plan view showing a second monitor pattern of the twenty-first embodiment.
Figure 60A:
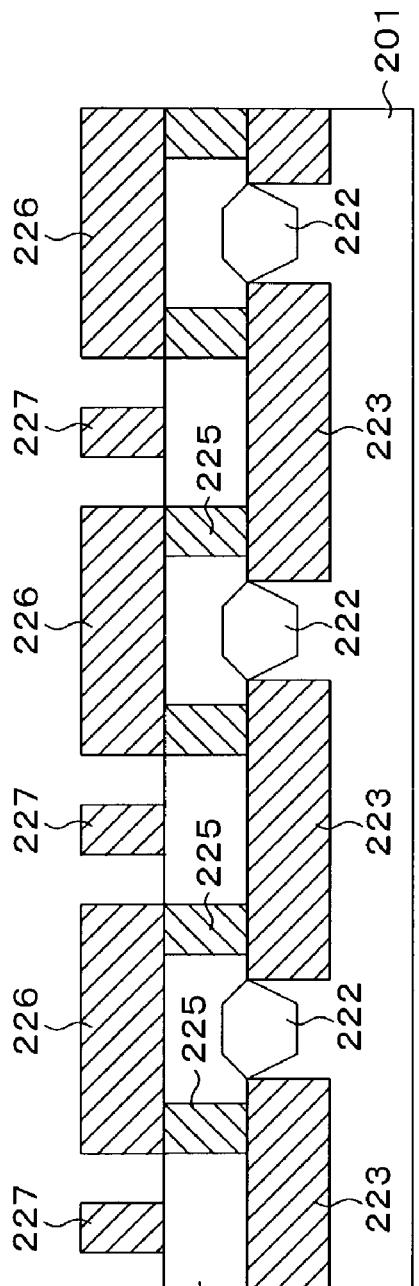
FIG. 60A is a cross-section view along I—I line of FIG. 59.
Figure 60B:
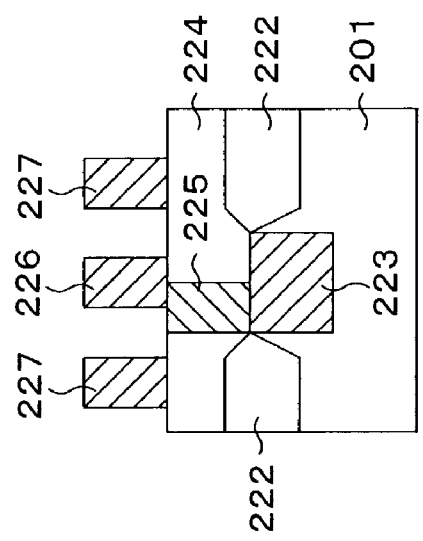
FIG. 60B is a cross-section view along II—II line of FIG. 59.

FIG. 59 is a top plan view showing a second monitor pattern 232 of this embodiment, FIG. 60A is a cross-section view along I—I line of FIG. 59, FIG. 60B is a cross-section view along II—II line of FIG. 59.

The second monitor pattern 232 is also constituted by the diffused resistors 223, the wirings (resistive elements) 226, the contact vias 225 and the dummy pattern 227. The contact vias 225 are disposed at the both ends in the longitudinal direction of the wiring 226, that is, at positions shifted in the width direction of the wiring 226 by a half of the width of the wiring 226.

This second monitor pattern 232 is a pattern for detecting effects of both the positional changes of the contact vias 225 and constrictions.

Figure 61:
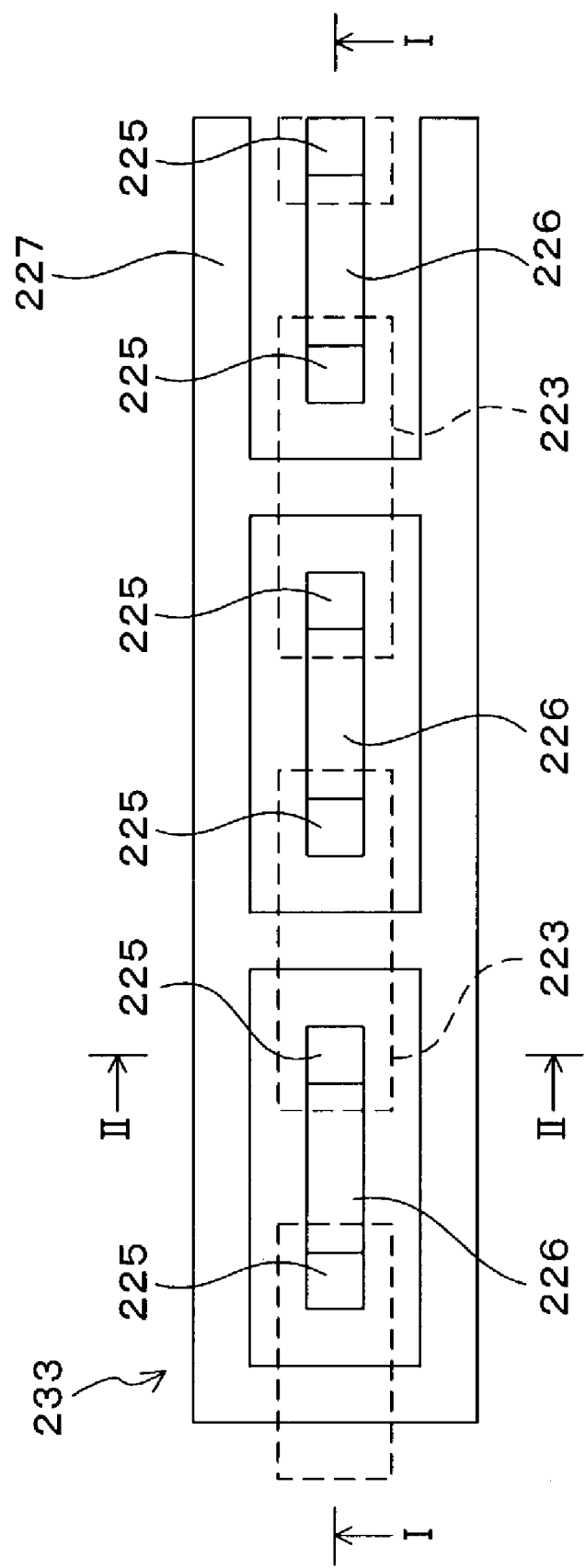
FIG. 61 is a top plan view showing a third monitor pattern of the twenty-first embodiment.
Figure 62A:
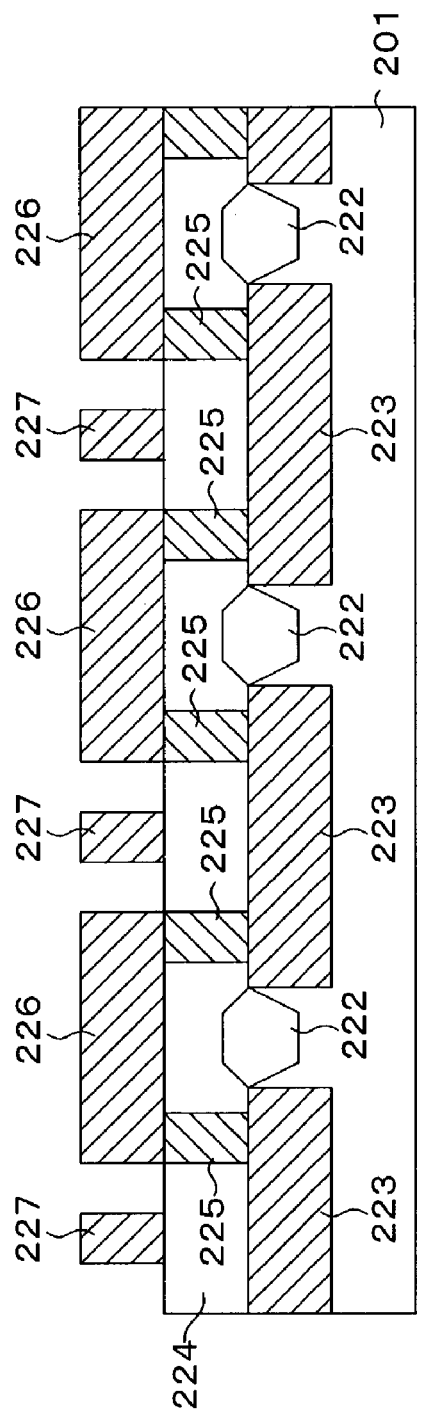
FIG. 62A is a cross-section view along I—I line of FIG. 61.
Figure 62B:
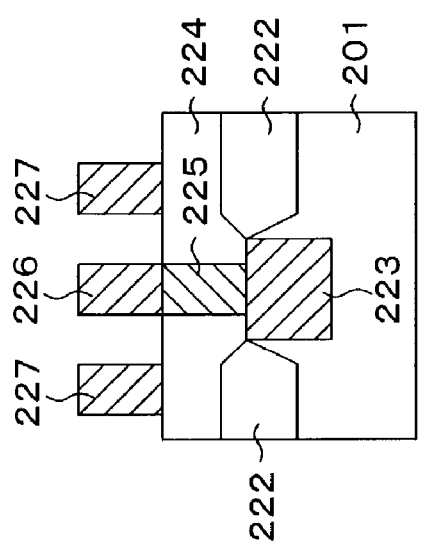
FIG. 62B is a cross-section view along II—II line of FIG. 61.

FIG. 61 is a top plan view showing a third monitor pattern 233 of this embodiment, FIG. 62A is a cross-section view along I—I line of FIG. 61, FIG. 62B is a cross-section view along II—II line of FIG. 61.

The third monitor pattern 233 is also constituted by the diffused resistors 223, the wirings (resistive elements) 226, the contact vias 225 and the dummy pattern 227. The contact vias 225 are disposed at positions aligned with the both ends in the longitudinal direction of the wiring 226. This third monitor pattern 233 is a pattern for detecting constrictions.

In the above first to third monitor patterns 231 to 233, the diffused resistors 223 are formed simultaneously with, for example, an impurity diffusion layer to be source/drain of a transistor. Moreover, the contact vias 225 are formed simultaneously with contact vias in an element formation portion, and the wirings 226 and dummy pattern 227 are formed simultaneously with wirings in the element formation portion. Furthermore, a space between the wirings 226 and the dummy pattern 227 is set in accordance with, for example, a minimum space between wirings in a chip formation portion.

Also in this embodiment, when the examination device detects abnormality in resistance values, it is possible to infer from resistance values of these first to third monitor patterns 231, 232 and 233 that the abnormality results from the positional changes of the contact vias or from the generation of the constrictions.

(Twenty-Second Embodiment)

Hereinafter, description will be made for a twenty-second embodiment of the present invention. Also in this embodiment, three kinds of monitor patterns, that is, first to third monitor patterns are formed on a semiconductor substrate.

Figure 63:
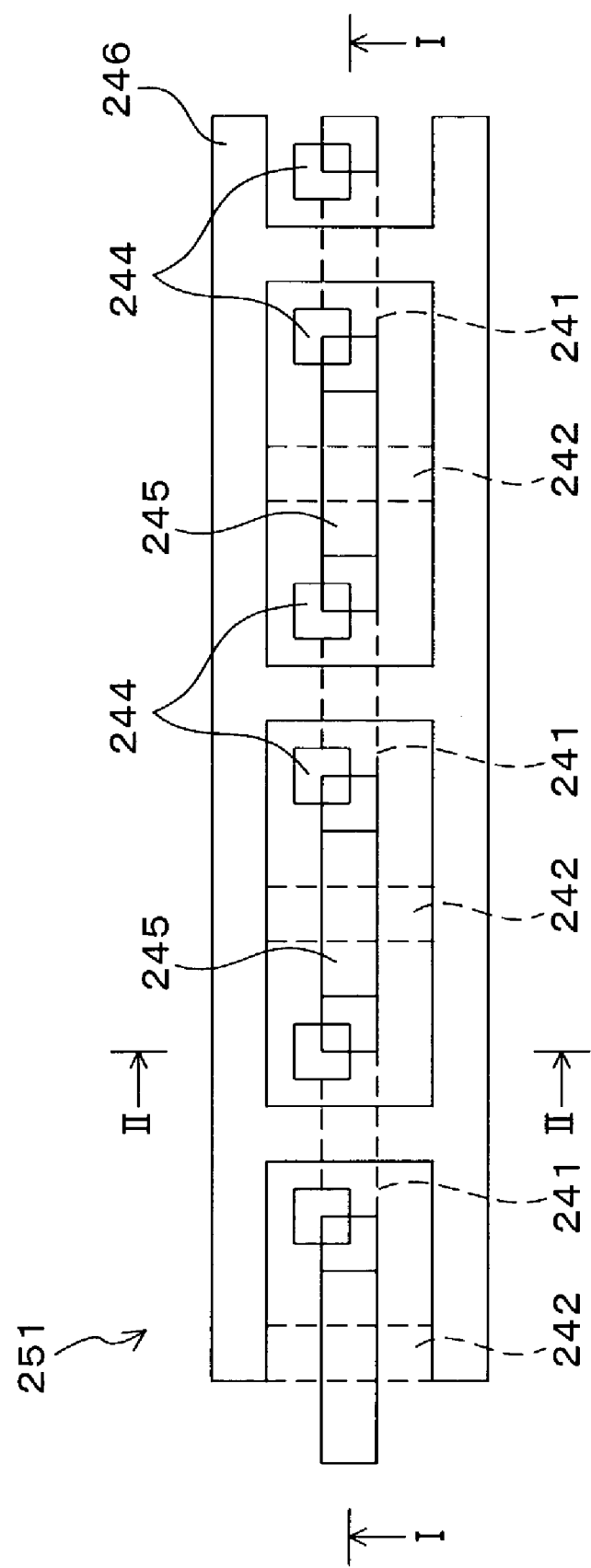
FIG. 63 is a top plan view showing a first monitor pattern of a semiconductor device of a twenty-second embodiment of the present invention.
Figure 64A:
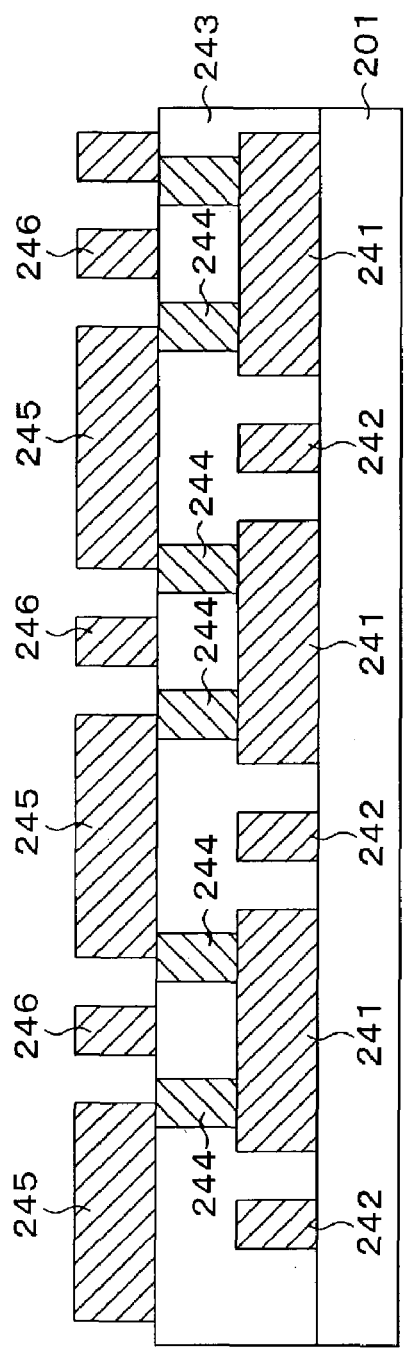
FIG. 64A is a cross-section view along I—I line of FIG. 63.
Figure 64B:
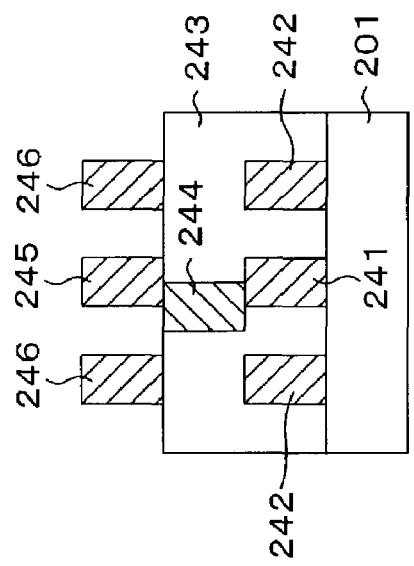
FIG. 64B is a cross-section view along II—II line of FIG. 63.

FIG. 63 is a top plan view showing a first monitor pattern 251 of a semiconductor device of the twenty-second embodiment of the present invention, FIG. 64A is a cross-section view along I—I line of FIG. 63, FIG. 64B is a cross-section view along II—II line of FIG. 63.

On the semiconductor substrate 201, a plurality of lower-layer wirings (resistive elements) 241 on a first interlayer insulation film (not shown) are formed. These lower-layer wirings 241 are covered with a second interlayer insulation film 243, and on the second interlayer insulation film 243, a plurality of upper-layer wirings (resistive elements) 245 are formed.

These lower-layer and upper-layer wirings 241 and 245 are disposed alternately along a virtual line. Moreover, in the second interlayer insulation film 243, a plurality of contact vias 244 are buried, by which the lower-layer wirings 241 and the upper-layer wirings 245 are electrically connected in series. Note that, in the first monitor pattern 251, the contact vias 244 are disposed, as shown in FIG. 63, at positions shifted toward the lower-layer wiring 241 from an overlapping portion of the lower-layer and upper-layer wirings 241 and 245 by a half of a width of the lower-layer wiring 241, that is, at positions shifted toward an upper side of the page space of FIG. 63 by a half of the width of the lower-layer wiring 241.

In the same wiring layer as that of the lower-layer wirings 241, a lattice lower-layer dummy pattern 242 is formed, which surrounds the respective lower-layer wirings 241 independently. Moreover, also in the same wiring layer as that of the upper-layer wirings 245, a lattice upper-layer dummy pattern 246 is formed, which surrounds the respective upper-layer wirings 245 independently.

This first monitor pattern 251 is a pattern for detecting positional changes of the contact vias 244.

Figure 65:
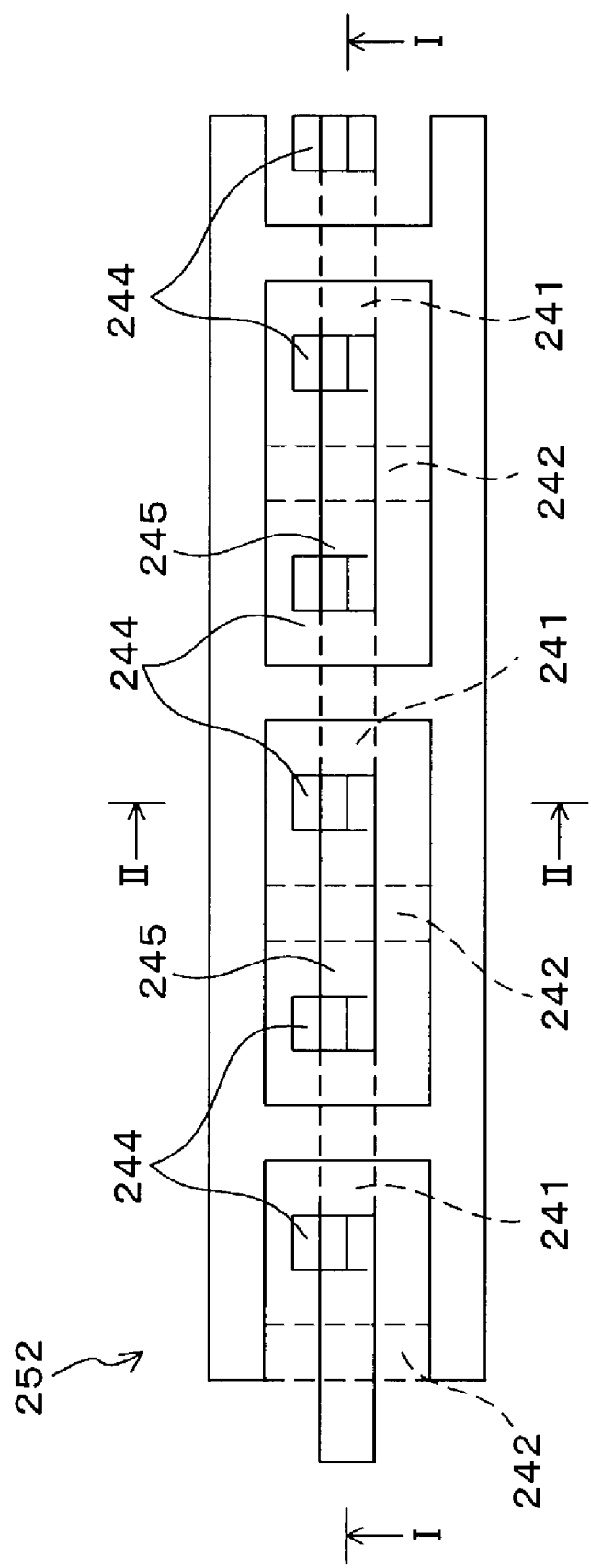
FIG. 65 is a top plan view showing a second monitor pattern of the semiconductor device of the twenty-second embodiment.
Figure 66A:
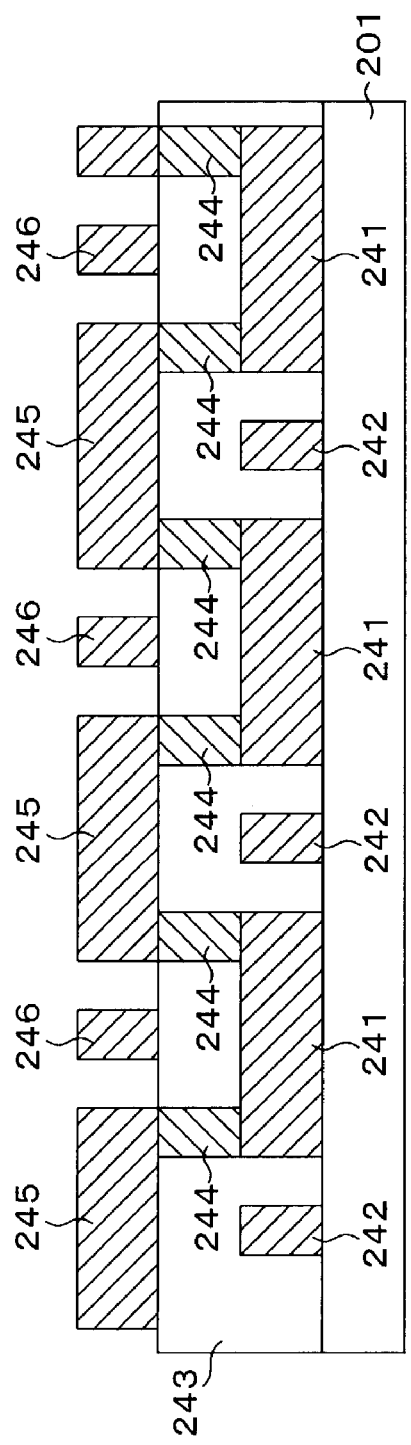
FIG. 66A is a cross-section view along I—I line of FIG. 65.
Figure 66B:
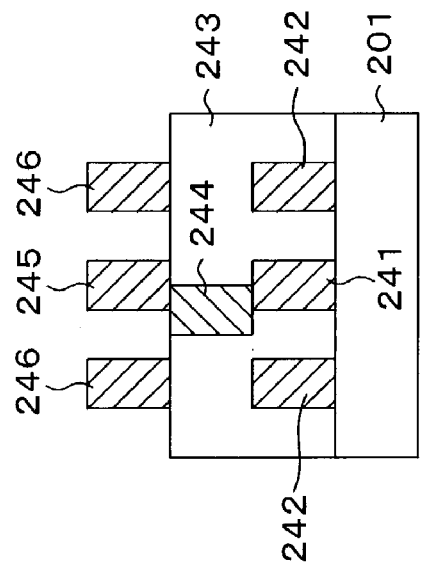
FIG. 66B is a cross-section view along II—II line of FIG. 65.

FIG. 65 is a top plan view showing a second monitor pattern 252 of the semiconductor device of this embodiment, FIG. 66A is a cross-section view along I—I line of FIG. 65, FIG. 66B is a cross-section view along II—II line of FIG. 65.

The second monitor pattern 252 is also constituted by the lower-layer wirings 241, the upper-layer wirings 245, the contact vias 244, the lower-layer dummy pattern 242 and the upper-layer dummy pattern 246. The contact vias 244 are disposed at the both ends of the lower-layer wiring 241, that is, at positions shifted toward an upper side of the page space of FIG. 65 by a half of the width of the lower-layer wiring 241.

This second monitor pattern 252 is a pattern for detecting effects of both the positional changes of the contact vias 244 and constrictions.

Figure 67:
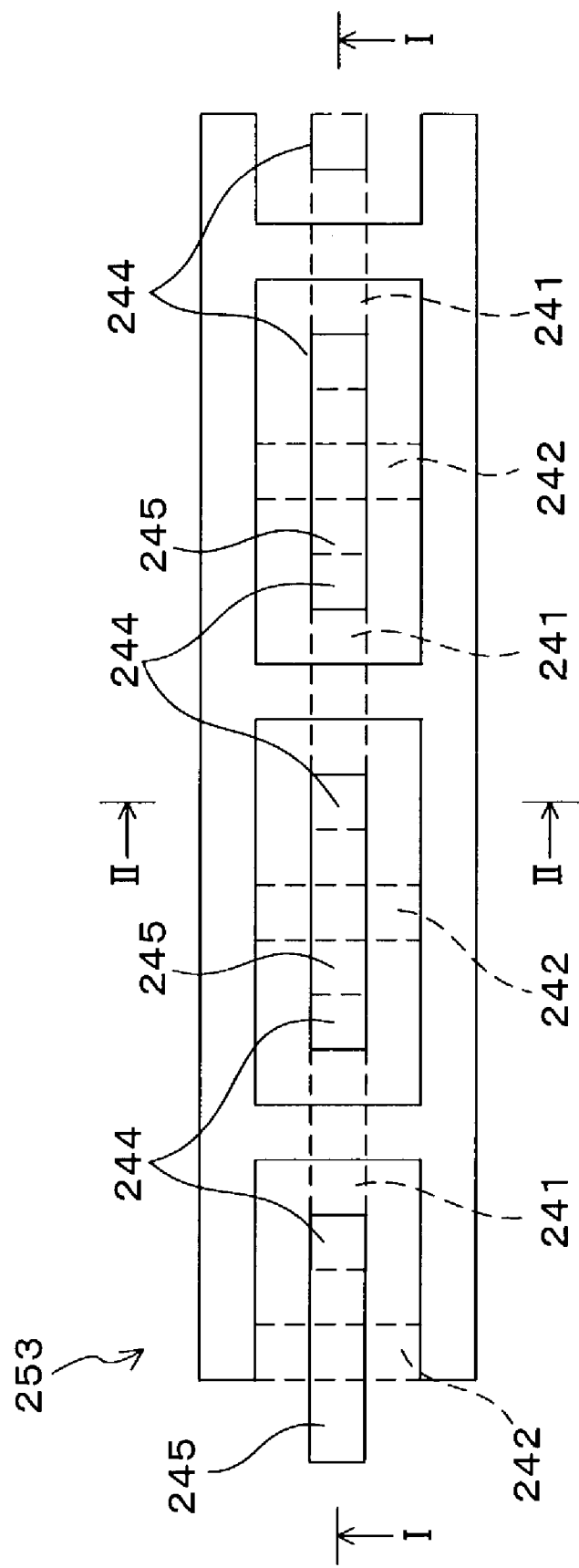
FIG. 67 is a top plan view showing a third monitor pattern of the semiconductor device of the twenty-second embodiment.
Figure 68A:
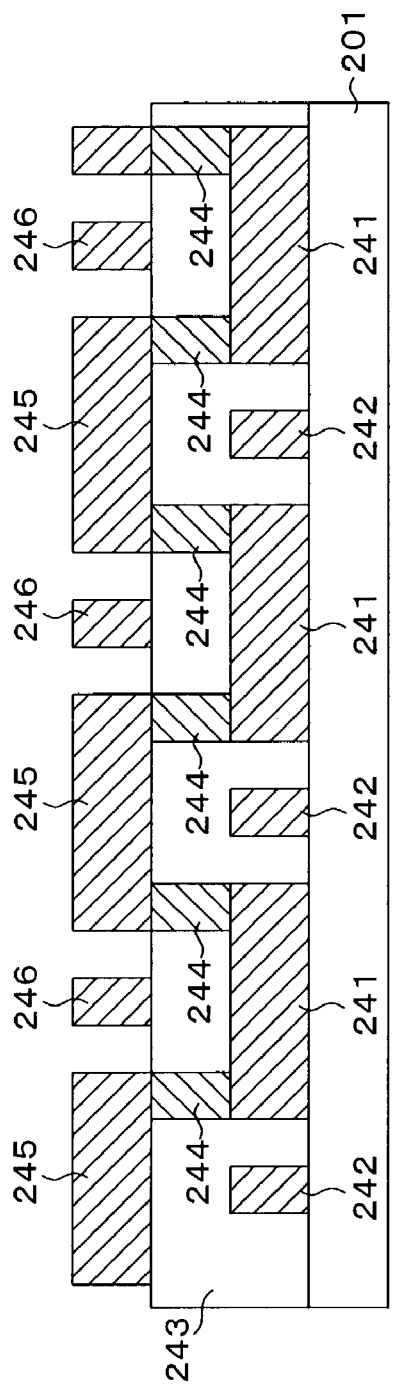
FIG. 68A is a cross-section view along I—I line of FIG. 67.
Figure 68B:
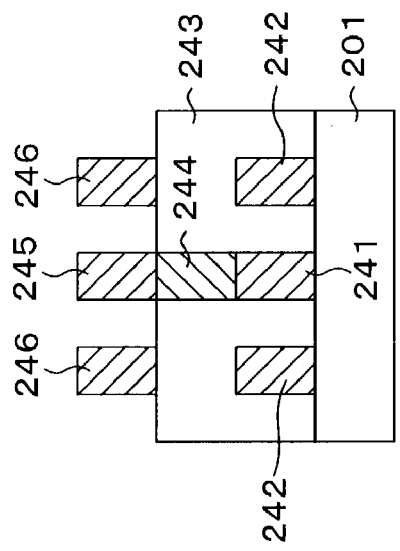
FIG. 68B is a cross-section view along II—II line of FIG. 67.

FIG. 67 is a top plan view showing a third monitor pattern 253 of the semiconductor device of this embodiment, FIG. 68A is a cross-section view along I—I line of FIG. 67, FIG. 68B is a cross-section view along II—II line of FIG. 67.

The third monitor pattern 253 is also constituted by the lower-layer wirings 241, the upper-layer wirings 245, the contact vias 244, the lower-layer dummy pattern 242 and the upper-layer dummy pattern 246. The contact vias 244 are disposed at positions aligned with the both ends of the lower-layer wiring 241. This third monitor pattern 253 is a pattern for detecting constrictions.

In the above first to third monitor patterns 251 to 253, the lower-layer wirings 241 and the lower-layer dummy pattern 242 are formed simultaneously with lower-layer wirings of the chip formation portion, the contact vias 244 are formed simultaneously with contact vias of the chip formation portion, and the upper-layer wirings 245 and the upper-layer dummy pattern 246 are formed simultaneously with upper-layer wirings of the chip formation portion.

Also in this embodiment, when the examination device detects abnormality in resistance values, it is possible to infer from resistance values of these first to third monitor patterns 251, 252 and 253 that the abnormality results from the positional changes of the contact vias or from the generation of the constrictions.

(Twenty-Third Embodiment)

Hereinafter, description will be made for a twenty-third embodiment of the present invention. Also in this embodiment, three kinds of monitor patterns, that is, first to third monitor patterns are formed on a semiconductor substrate.

Figure 69:
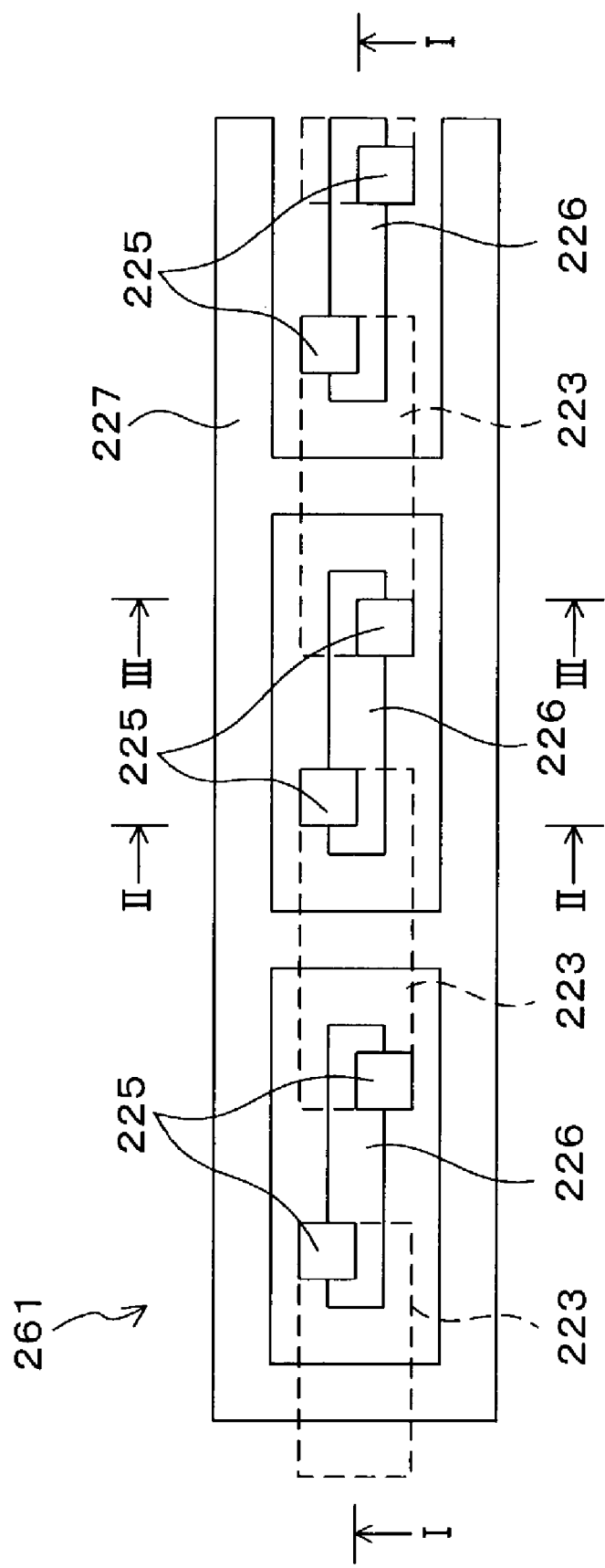
FIG. 69 is a top plan view showing a first monitor pattern of a semiconductor device of a twenty-third embodiment of the present invention.
Figure 70A:
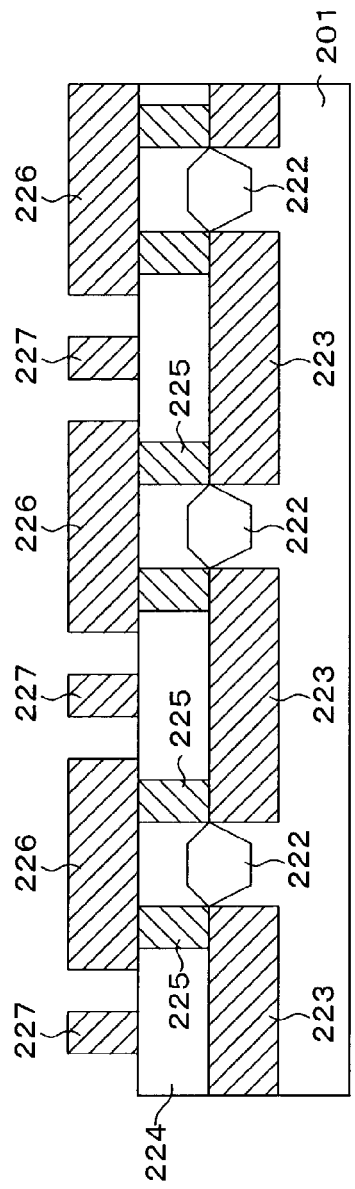
FIG. 70A is a cross-section view along I—I line of FIG. 69.
Figure 70B:
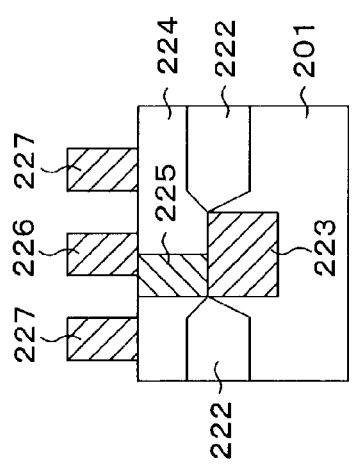
FIG. 70B is a cross-section view along II—II line of FIG. 69
Figure 70C:
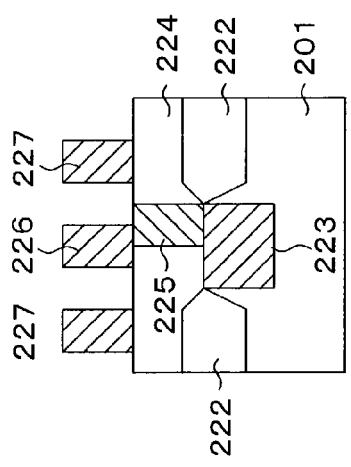
FIG. 70C is a cross-section view along III—III line of FIG. 69.

FIG. 69 is a top plan view showing a first monitor pattern 261 of a semiconductor device of the twenty-third embodiment of the present invention, FIG. 70A is a cross-section view along I—I line of FIG. 69, FIG. 70B is a cross-section view along II—II line of FIG. 69 and FIG. 70C is a cross-section view along III—III line of FIG. 69. Note that identical constituent components to those of FIGS. 57, 58A and 58B are denoted by identical reference numerals.

A first monitor pattern 261 is constituted by: the diffused resistors 223 formed in the semiconductor substrate 201; the wirings (resistive elements) 226 formed on the semiconductor substrate 201; the contact vias 225 buried in the interlayer insulation film 224; and the lattice dummy pattern 227 surrounding the respective wirings 226 independently.

The contact via 225 at one end of the wiring 226 is disposed at a position away inward from the one end of the wiring 226 by a specific distance, that is, at a position shifted toward an upper side of the page space of FIG. 69 by a half of the width of the wiring 226. Moreover, the contact via 225 at the other end of the wiring 226 is disposed at a position away inward from the other end of the wiring 226 by a specific distance, that is, at a position shifted toward a lower side of the page space of FIG. 69 by a half of the width of the wiring 226.

Figure 71:
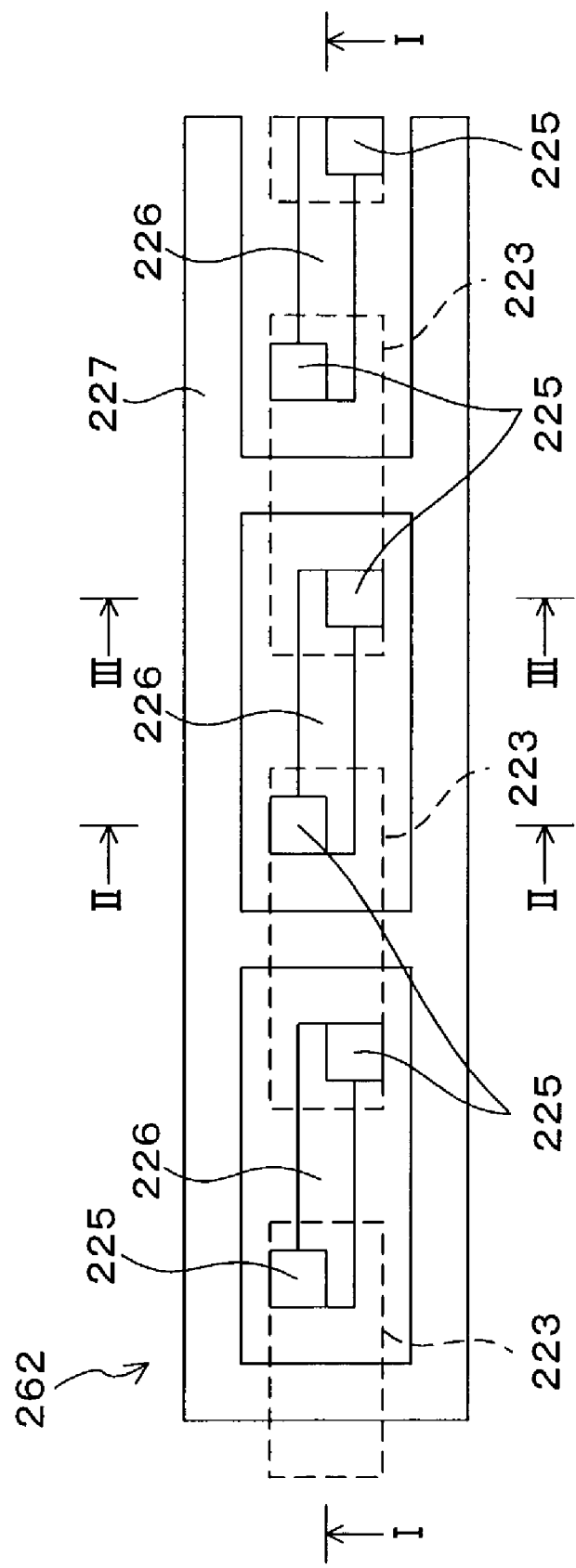
FIG. 71 is a top plan view showing a second monitor pattern of the twenty-third embodiment.
Figure 72A:
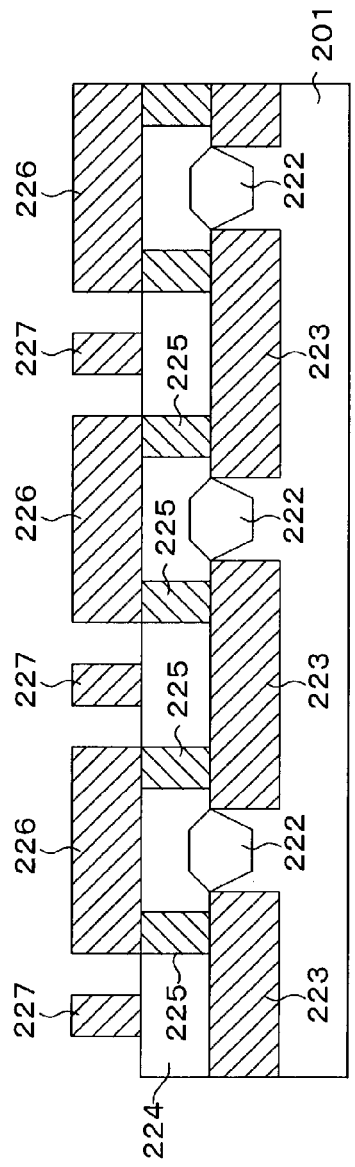
FIG. 72A is a cross-section view along I—I line of FIG. 71.
Figure 72B:
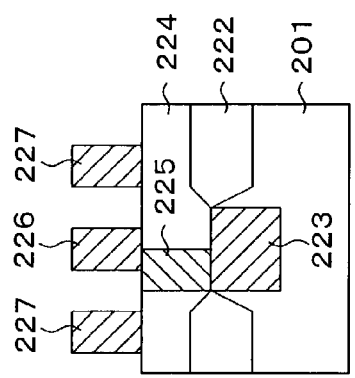
FIG. 72B is a cross-section view along II—II line of FIG. 71
Figure 72C:
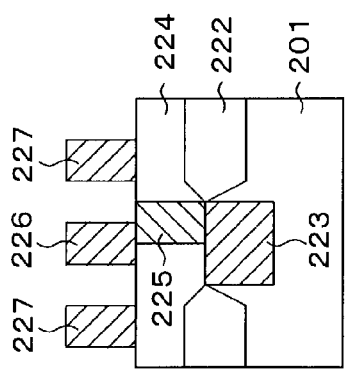
FIG. 72C is a cross-section view along III—III line of FIG. 71.

FIG. 71 is a top plan view showing a second monitor pattern 262, FIG. 72A is a cross-section view along I—I line of FIG. 71, FIG. 72B is a cross-section view along II—II line of FIG. 71, and FIG. 72C is a cross-section view along III—III line of FIG. 71.

The second monitor pattern 262 is also constituted by the diffused resistors 223, the wirings 226, the contact vias 225 and the dummy pattern 227.

The contact via 225 at one end of the wiring 226 is disposed at a position shifted toward an upper side of the page space of FIG. 71 by a half of the width of the wiring 226. Moreover, the contact via 225 at the other end of the wiring 226 is disposed at a position shifted toward a lower side of the page space of FIG. 71 by a half of the width of the wiring 226.

A third monitor pattern is identical to the one shown in FIGS. 61, 62A and 62B, and thus description thereof will be omitted herein.

In this embodiment, in addition to an effect similar to that of the twenty-first embodiment, an effect of detecting positional changes of the contact vias in the rotating direction can be obtained.

(Twenty-Fourth Embodiment)

Hereinafter, description will be made for a twenty-fourth embodiment of the present invention. Also in this embodiment, three kinds of monitor patterns, that is, first to third monitor patterns are formed on a semiconductor substrate.

Figure 73:
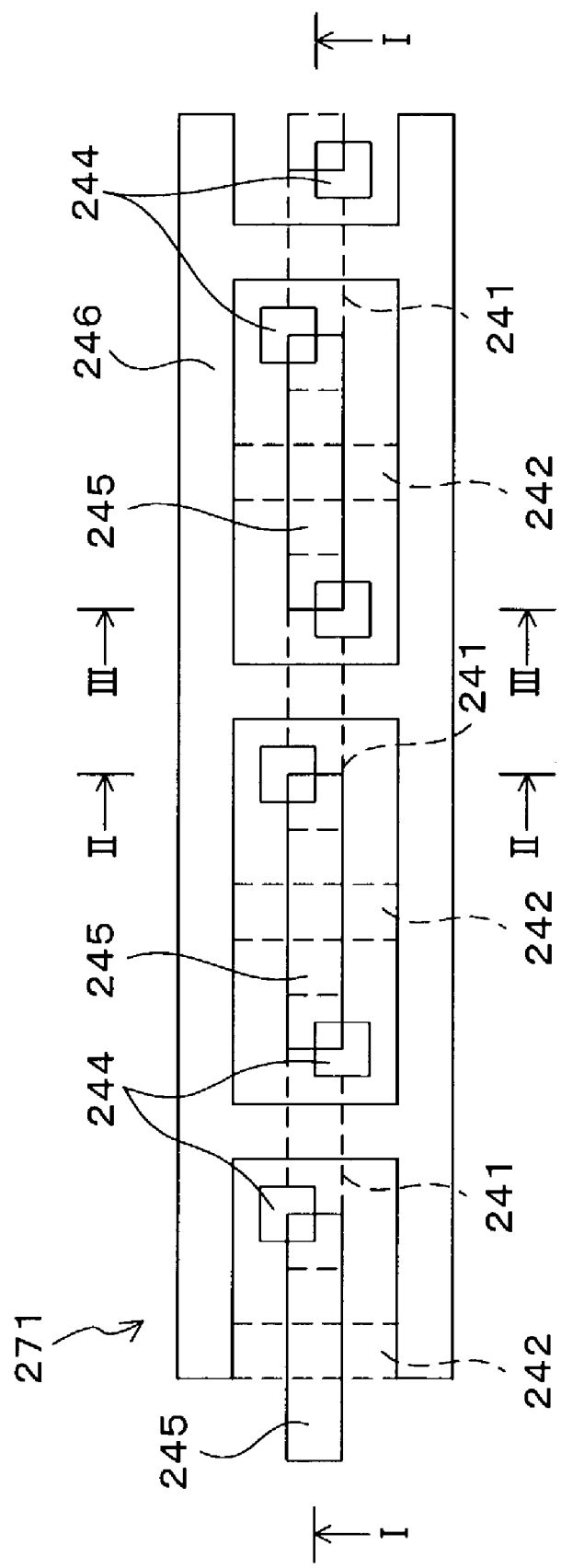
FIG. 73 is a top plan view showing a first monitor pattern of a semiconductor device of a twenty-fourth embodiment of the present invention.
Figure 74A:
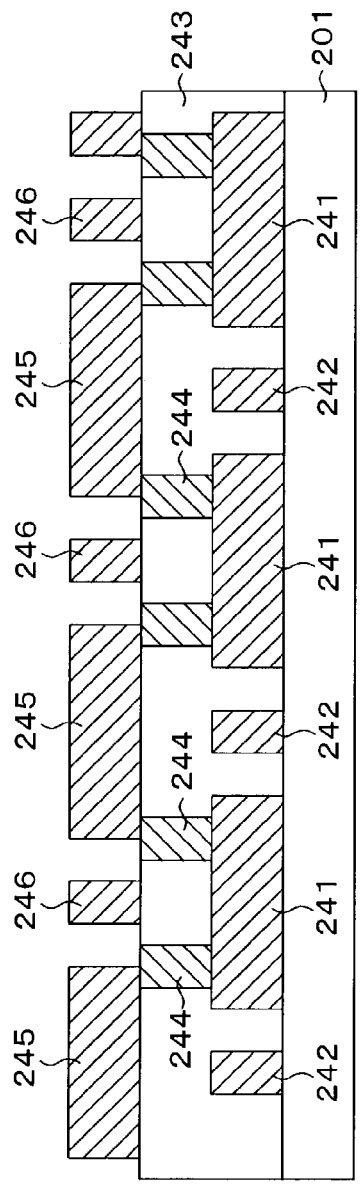
FIG. 74A is a cross-section view along I—I line of FIG. 73.
Figure 74B:
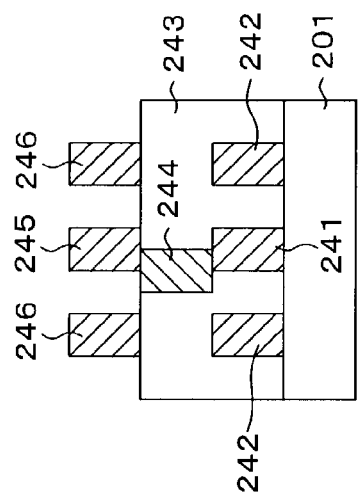
FIG. 74B is a cross-section view along II—II line of FIG. 73
Figure 74C:
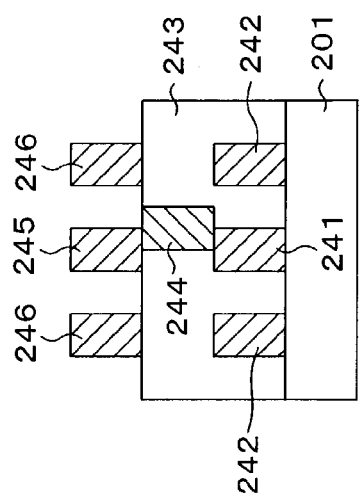
FIG. 74C is a cross-section view along III—III line of FIG. 73.

FIG. 73 is a top plan view showing a first monitor pattern 271 of a semiconductor device of the twenty-fourth embodiment of the present invention, FIG. 74A is a cross-section view along I—I line of FIG. 73, FIG. 74B is a cross-section view along II—II line of FIG. 73 and FIG. 74C is a cross-section view along III—III line of FIG. 73. Note that identical constituent components to those of FIGS. 63, 64A and 64B are denoted by identical reference numerals.

A first monitor pattern 271 is constituted by: the lower-layer wirings (resistive elements) 241 formed on the semiconductor substrate 201; the upper-layer wirings (resistive elements) 245 formed on the interlayer insulation film 243; the contact vias 244 buried in the interlayer insulation film 243; the lattice lower-layer dummy pattern 242 which is formed in the same wiring layer as that of the lower-layer wirings 241 and surrounds the respective lower-layer wirings 241 independently; and the lattice upper-layer dummy pattern 246 which is formed in the same wiring layer as that of the upper-layer wirings 245 and surrounds the respective upper-layer wirings 245 independently.

The contact via 244 at one end of the lower-layer wiring 241 is disposed at a position away inward from the one end of the lower-layer wiring 241 by a specific distance, that is, at a position shifted toward an upper side of the page space of FIG. 73 by a half of the width of the lower-layer wiring 241. Moreover, the contact via 244 at the other end of the lower-layer wiring 241 is disposed at a position away inward from the other end of the lower-layer wiring 241 by a specific distance, that is, at a position shifted toward a lower side of the page space of FIG. 73 by a half of the width of the lower-layer wiring 241.

Figure 75:
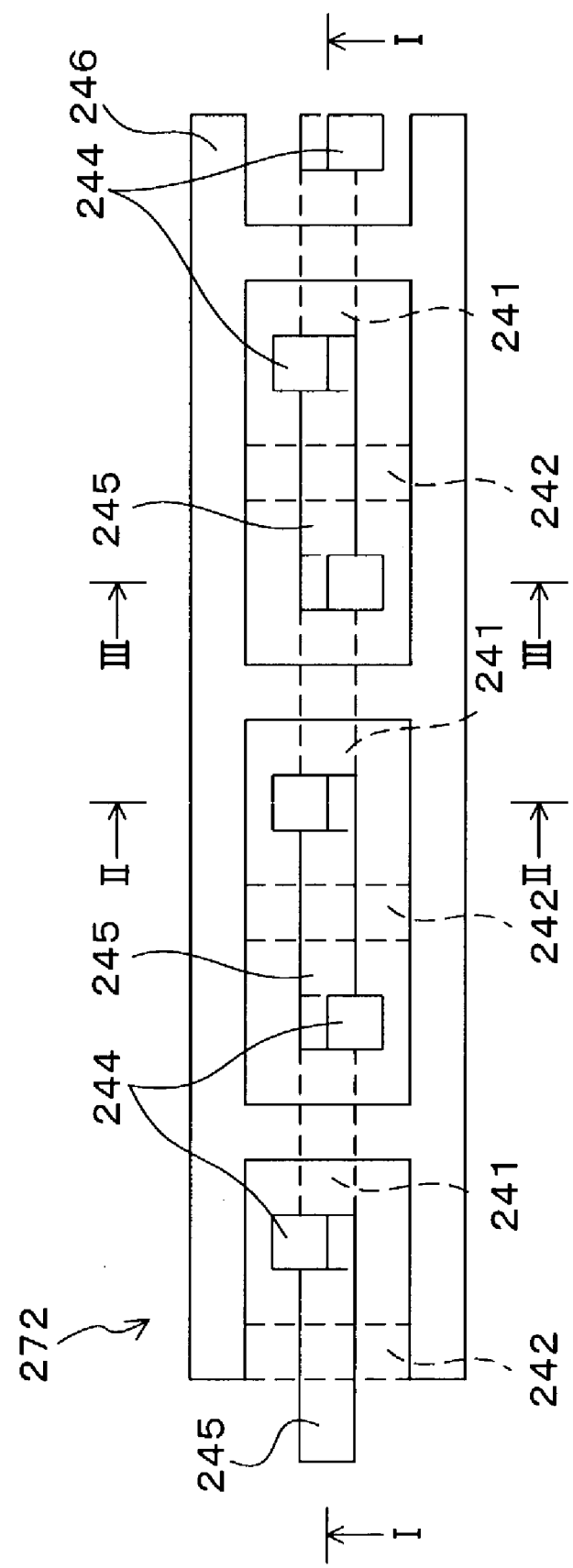
FIG. 75 is a top plan view showing a second monitor pattern of the twenty-fourth embodiment.
Figure 76A:
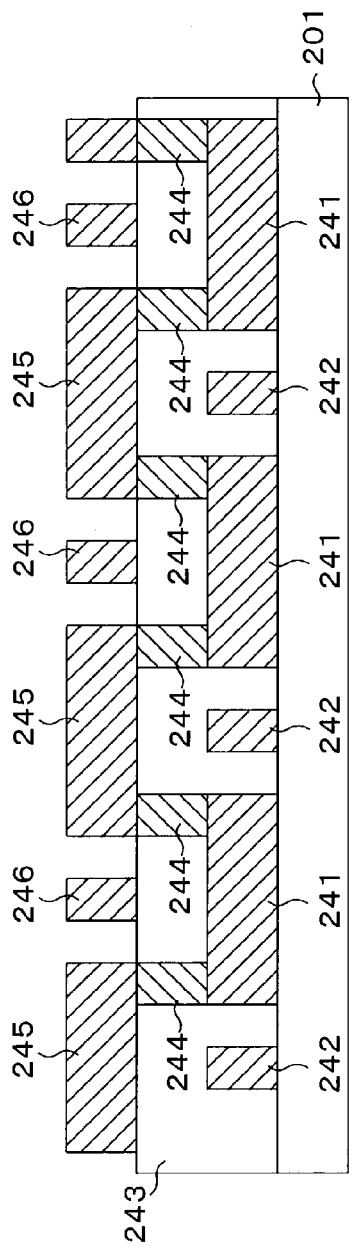
FIG. 76A is a cross-section view along I—I line of FIG. 75.
Figure 76B:
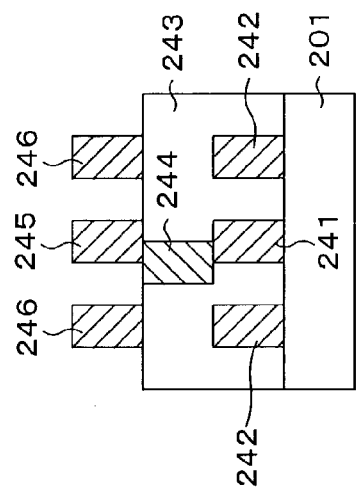
FIG. 76B is a cross-section view along II—II line of FIG. 75
Figure 76C:
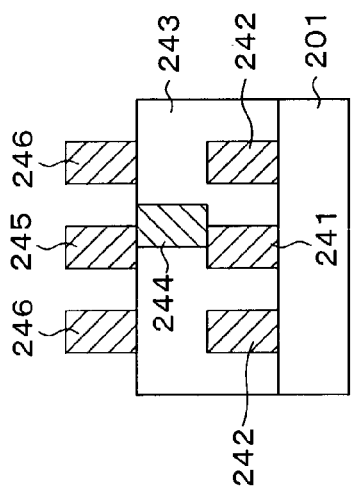
FIG. 76C is a cross-section view along III—III line of FIG. 75.

FIG. 75 is a top plan view showing a second monitor pattern 272, FIG. 76A is a cross-section view along I—I line of FIG. 75, FIG. 76B is a cross-section view along II—II line of FIG. 75 and FIG. 76C is a cross-section view along III—III line of FIG. 75.

The second monitor pattern 272 is also constituted by the lower-layer wirings 241, the upper-layer wirings 245, the contact vias 244, the lower-layer dummy pattern 242 and the upper-layer dummy pattern 246.

The contact via 244 at one end of the lower-layer wiring 241 is disposed at a position shifted toward an upper side of the page space of FIG. 75 by a half of the width of the lower-layer wiring 241. Moreover, the contact via 244 at the other end of the lower-layer wiring 241 is disposed at a position shifted toward a lower side of the page space of FIG. 75 by a half of the width of the lower-layer wiring 241.

A third monitor pattern is identical to the one shown in FIGS. 67, 68A and 68B, and thus description thereof will be omitted herein.

In this embodiment, in addition to an effect similar to that of the twenty-second embodiment, an effect of detecting positional changes of the contact vias in the rotating direction can be obtained.

(Twenty-Fifth Embodiment)

Figure 77:
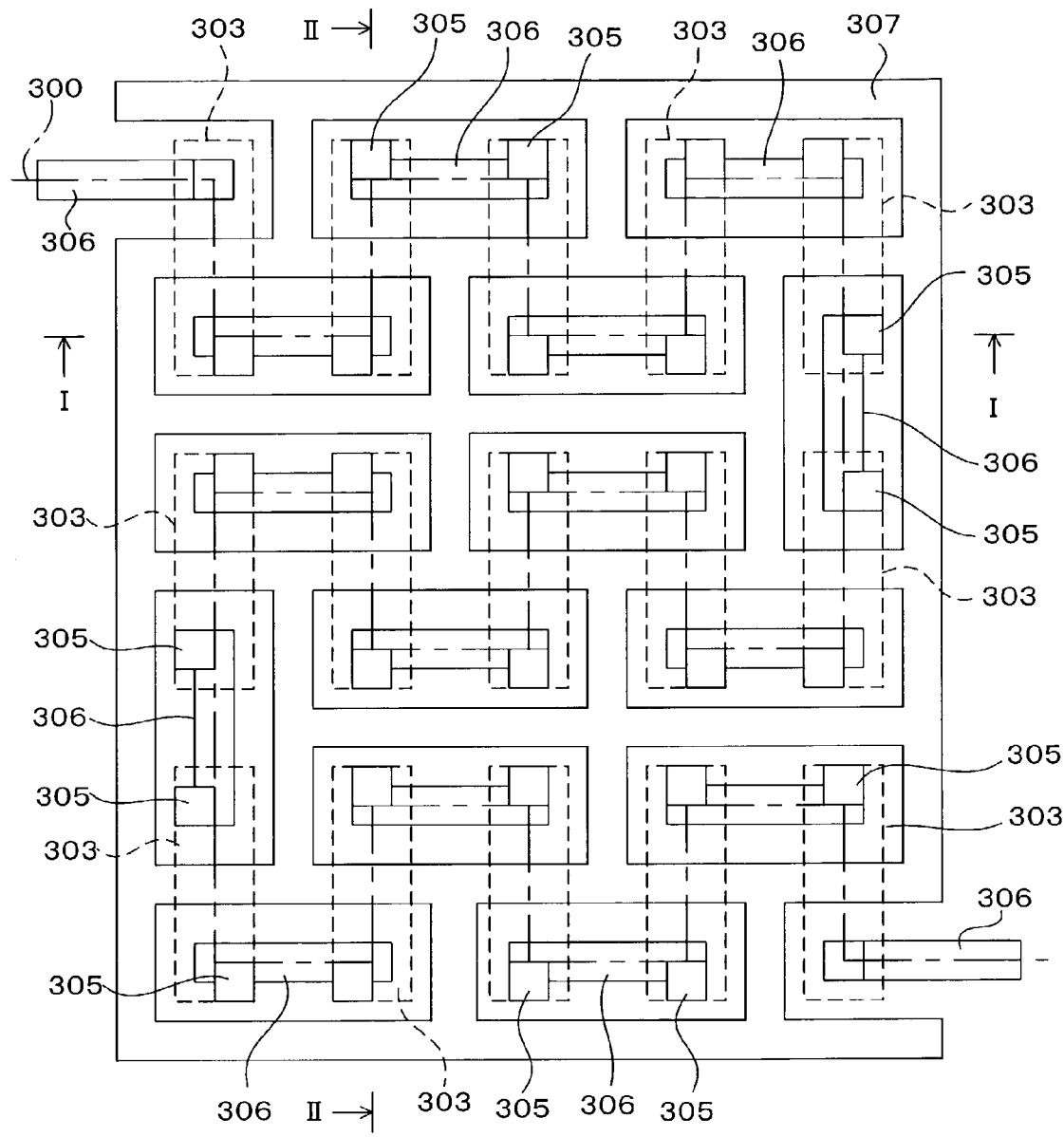
FIG. 77 is a top plan view showing a monitor pattern of a semiconductor device of a twenty-fifth embodiment of the present invention.
Figure 78A:
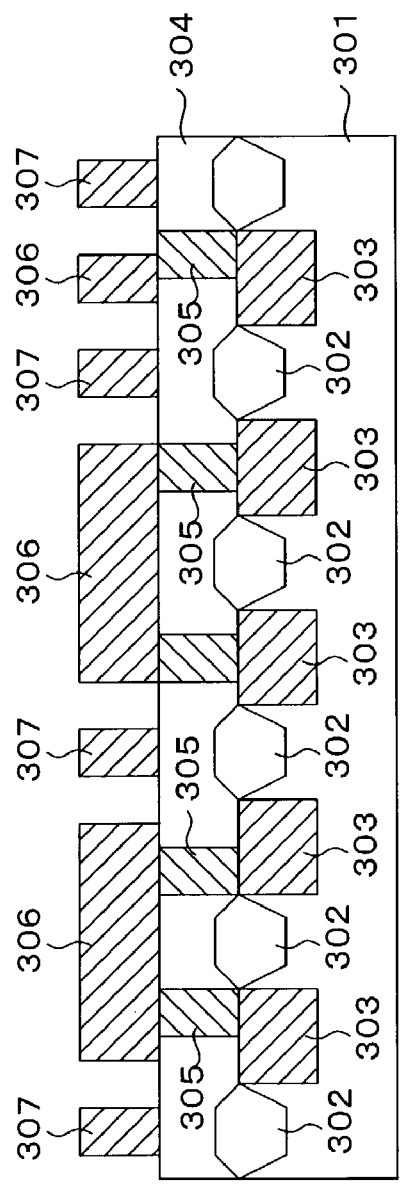
FIG. 78A is a cross-section view along I—I line of FIG. 77.
Figure 78B:
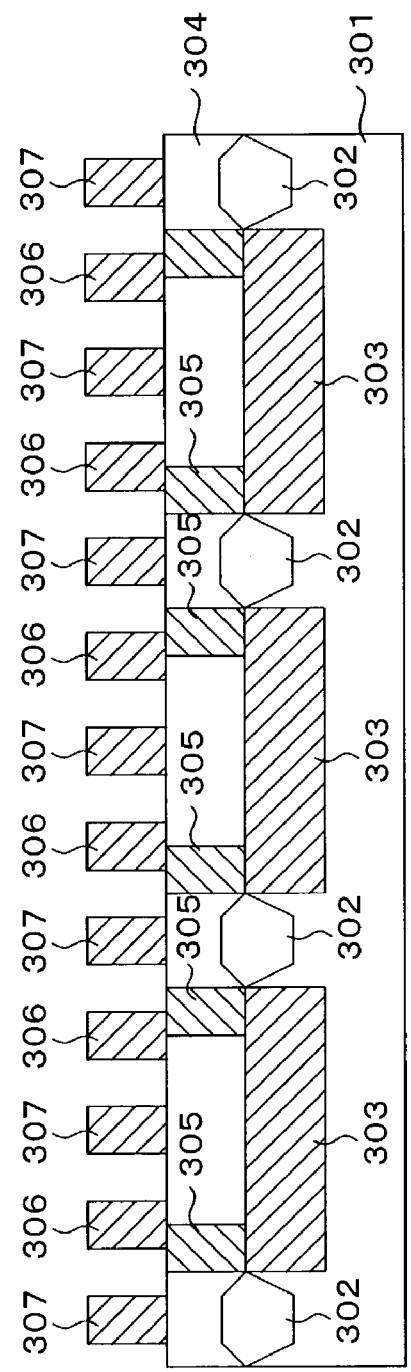
FIG. 78B is a cross-section view along II—II line of FIG. 77.

FIG. 77 is a top plan view showing a monitor pattern of a semiconductor device of a twenty-fifth embodiment of the present invention, FIG. 78A is a cross-section view along I—I line of FIG. 77 and FIG. 78B is a cross-section view along II—II line of FIG. 77.

In this embodiment, one monitor pattern is constituted by combining the cells of the first to third monitor patterns 231 to 233 shown in FIGS. 57 to 62. Specifically, a semiconductor substrate 301 is separated into a plurality of element regions by an element separation film 302. In the element regions, a plurality of diffused resistors 303 are provided, which are formed by introducing impurities at high concentration into the semiconductor substrate 301. Moreover, on the semiconductor substrate 301, an interlayer insulation film 304 is formed. On this interlayer insulation film 304, a plurality of wirings 306 are formed.

These diffused resistors 303 and wirings 306 are alternately disposed along one virtual line 300 having a number of flections. Moreover, in the interlayer insulation film 304, a plurality of contact vias 305 are buried, by which the wirings 306 and the diffused resistors 303 are electrically connected in series. Note that, in this embodiment, one monitor pattern is obtained by combining the first to third monitor patterns 231 to 233 described in the twenty-first embodiment.

(Twenty-Sixth Embodiment)

Figure 79:
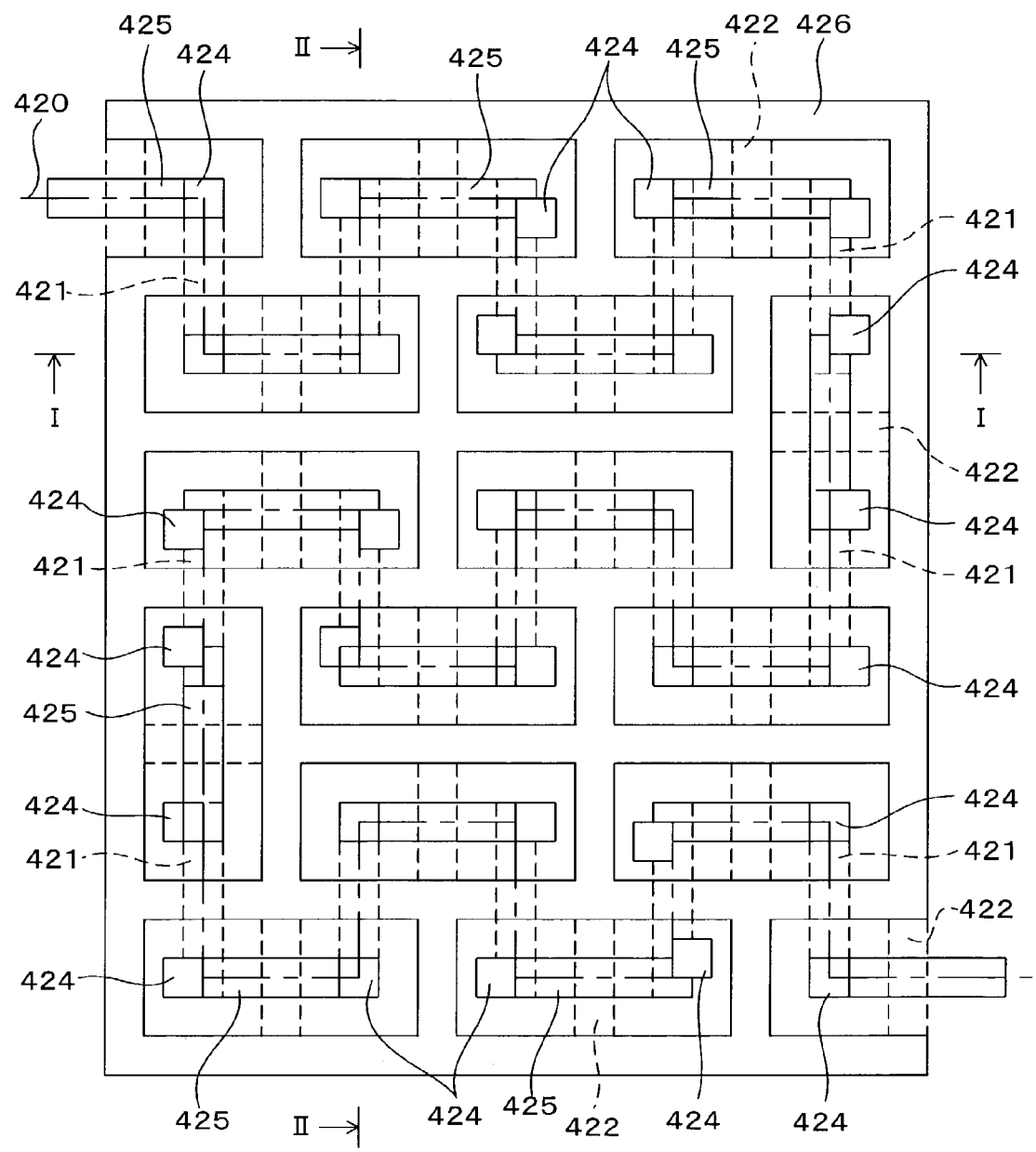
FIG. 79 is a top plan view showing a monitor pattern of a semiconductor device of a twenty-sixth embodiment of the present invention.

FIG. 79 is a top plan view showing a monitor pattern of a semiconductor device of a twenty-sixth embodiment of the present invention, FIG. 80A is a cross-section view along I—I line of FIG. 79 and FIG. 80B is a cross-section view along II—II line of FIG. 79.

In this embodiment, one monitor pattern is constituted by combining the cells of the first to third monitor patterns 251 to 253 shown in FIGS. 63 to 68. Specifically, on a semiconductor substrate 401, a plurality of lower-layer wirings (resistive elements) 421 on a first interlayer insulation film (not shown) are formed. These lower-layer wirings 421 are covered with a second interlayer insulation film 423, and on the second interlayer insulation film 423, a plurality of upper-layer wirings (resistive elements) 425 are formed.

These lower-layer wirings 421 and upper-layer wirings 425 are alternately disposed along one virtual line 420 having a number of flections. Moreover, in the second interlayer insulation film 423, a plurality of contact vias 424 are buried, by which the lower-layer wirings 421 and the upper-layer wirings 425 are electrically connected in series. Note that, in this embodiment, one monitor pattern is obtained by combining the first to third monitor patterns 251 to 253 described in the twenty-second embodiment.

In the same wiring layer as that of the lower-layer wirings 421, a lattice lower-layer dummy pattern 422 is formed, which surrounds the respective lower-layer wirings 421 independently. Moreover, in the same wiring layer as that of the upper-layer wirings 425, a lattice upper-layer dummy pattern 426 is formed, which surrounds the respective upper-layer wirings 425 independently. Note that the upper-layer wirings 425 positioned at ends of the monitor pattern extend out of the upper-layer dummy pattern 426 from notched portions of the upper-layer dummy pattern 426.

(Twenty-Seventh Embodiment)

Hereinafter, description will be made for a monitor pattern of a semiconductor device of a twenty-seventh embodiment of the present invention.

Figure 81:
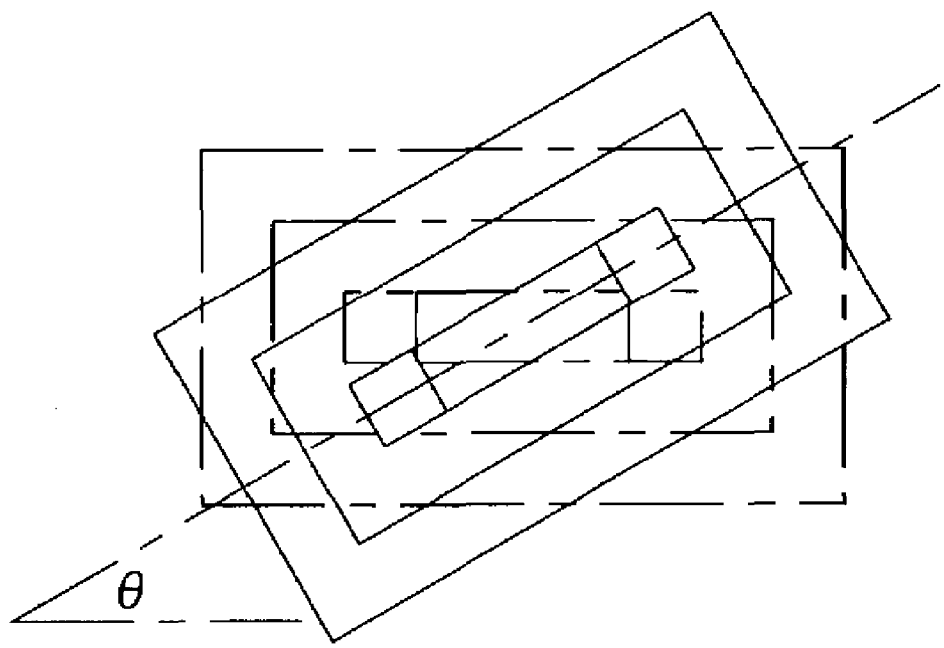
FIG. 81 is a top plan view showing a cell of a monitor pattern of a semiconductor device of a twenty-seventh embodiment of the present invention.

For example, in the sixth embodiment, the monitor pattern is constituted by linearly arranging cells. Contrary to the above, in this embodiment, as shown in a top plan view of a cell in FIG. 81, cells are arranged by being tilted in an extension direction of the monitor pattern by an angle θ.

Figure 82:
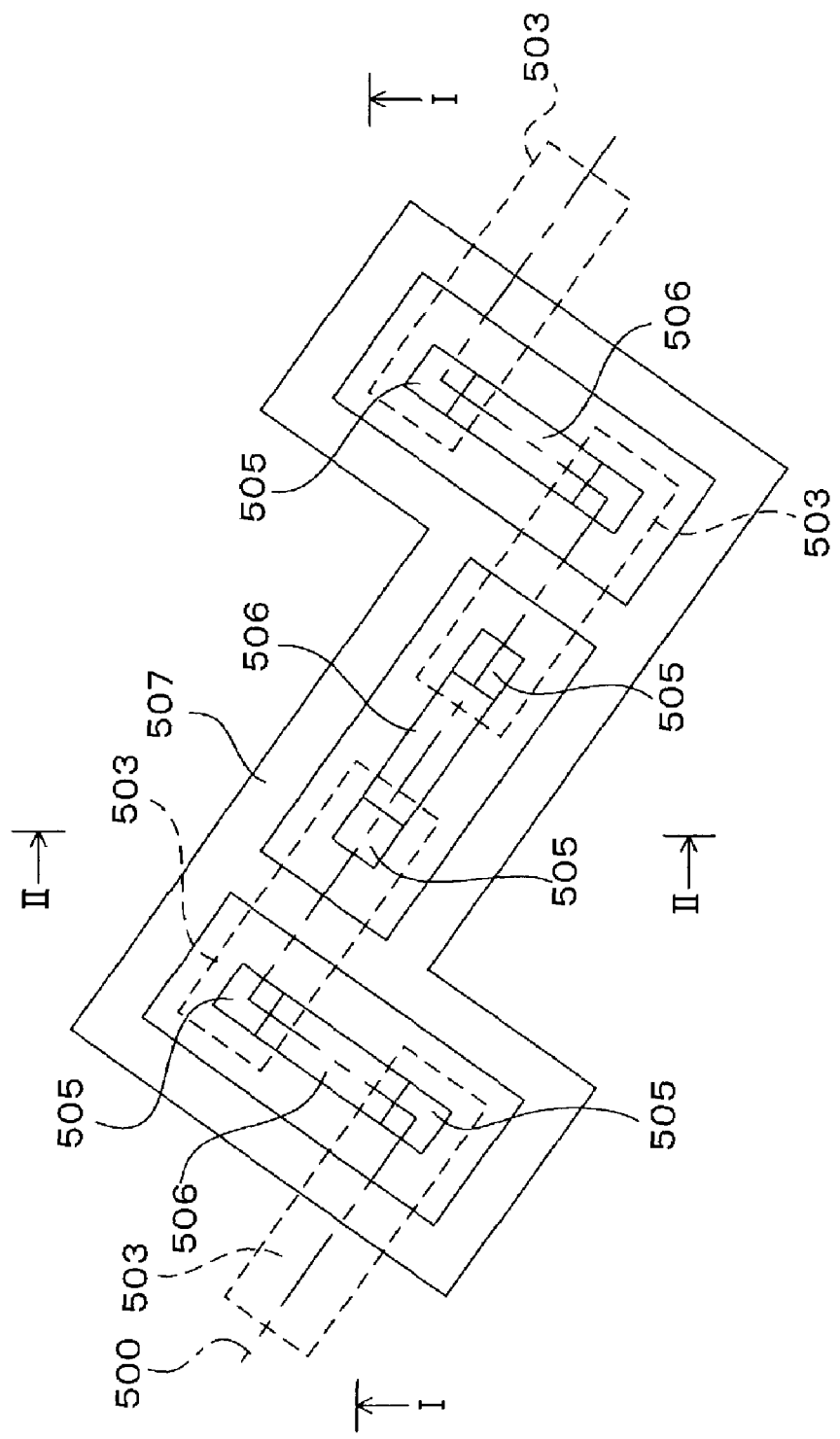
FIG. 82 is a top plan view showing the monitor pattern of the semiconductor device of the twenty-seventh embodiment.
Figure 83A:
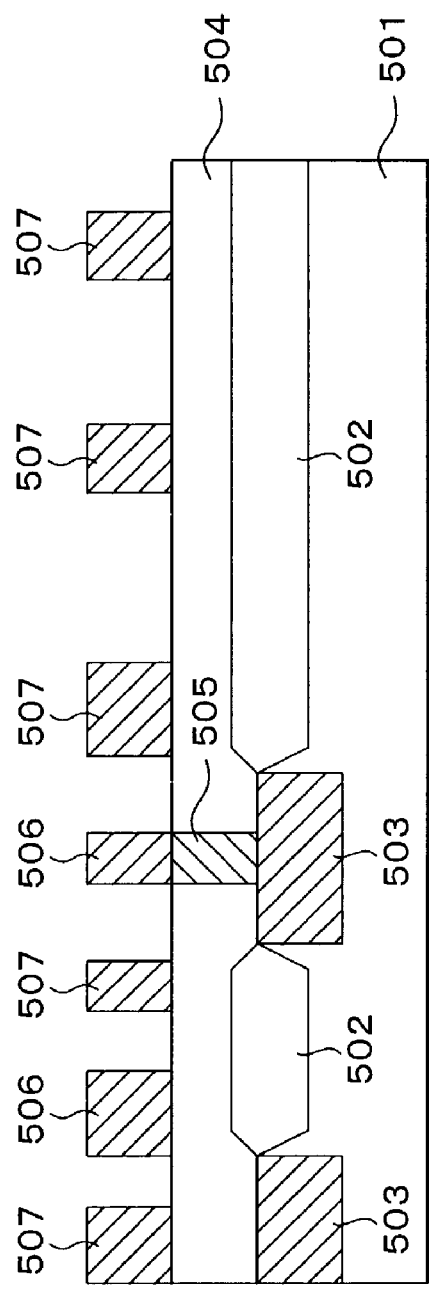
FIG. 83A is a cross-section view along I—I line of FIG. 82.
Figure 83B:
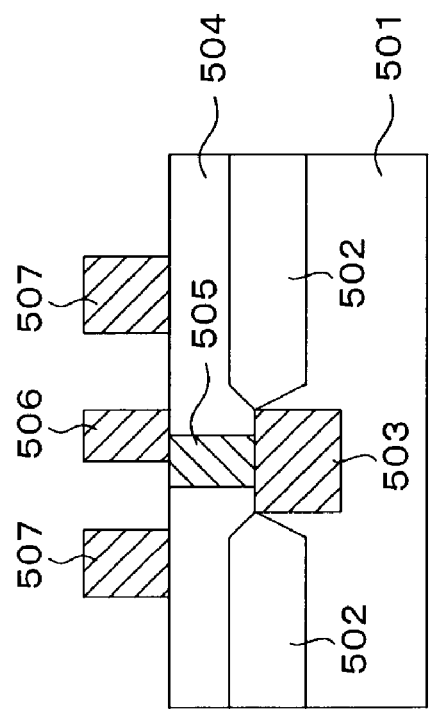
FIG. 83B is a cross-section view along II—II line of FIG. 82.

FIG. 82 is a top plan view showing a monitor pattern of the semiconductor device of the twenty-seventh embodiment of the present invention, FIG. 83A is a cross-section view along I—I line of FIG. 82 and FIG. 83B is a cross-section view along II—II line of FIG. 82.

A semiconductor substrate 501 is separated into a plurality of element regions by an element separation film 502. In the element regions, a plurality of diffused resistors 503 are provided, which are formed by introducing impurities at high concentration into the semiconductor substrate 501. Moreover, on the semiconductor substrate 501, an interlayer insulation film 504 is formed. On this interlayer insulation film 504, a plurality of wirings (resistive elements) 506 are formed.

These diffused resistors 503 and wirings 506 are alternately disposed along one virtual line 500 extending in the extension direction of the monitor pattern while turning zigzag. Note that the wirings 506 mutually adjacent to each other are disposed in such a manner that their center lines intersect at 90° angle. Moreover, in the interlayer insulation film 504, a plurality of contact vias 505 are buried, by which the wirings 506 and the diffused resistors 503 are electrically connected in series.

Furthermore, on the interlayer insulation film 504, a lattice dummy pattern 507 is formed, which surrounds the respective wirings 506 independently. This dummy pattern 507 is formed in the same wiring layer as that of the wirings 506, and a space between the dummy pattern 507 and the wirings 506 is set to, for example, 0.3 μm.

Also in this embodiment, the diffused resistors 503 are formed simultaneously with source/drain of a transistor of a chip formation portion, the contact vias 505 are formed simultaneously with contact vias of the chip formation portion, and the wirings 506 and the dummy pattern 507 are formed simultaneously with wirings of the chip formation portion.

Also in this embodiment, the space between the wirings 506 and the dummy pattern 507 is set in accordance with, for example, the minimum space between the wirings of the chip formation portion. Thus, an effect similar to that of the first embodiment can be obtained.

(Twenty-Eighth Embodiment)

Figure 84:
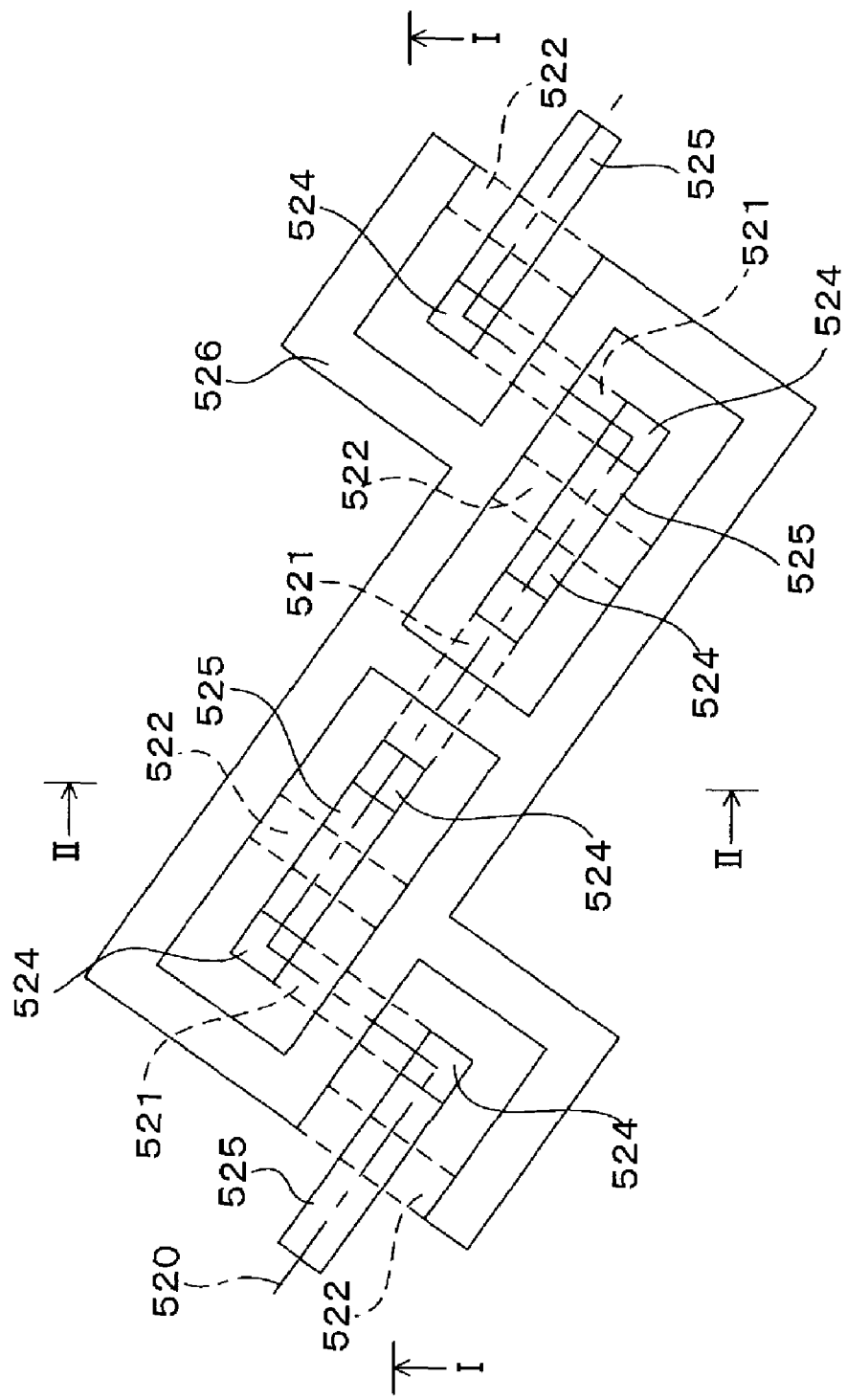
FIG. 84 is a top plan view showing the monitor pattern of the semiconductor device of the twenty-seventh embodiment of the present invention.
Figure 85A:
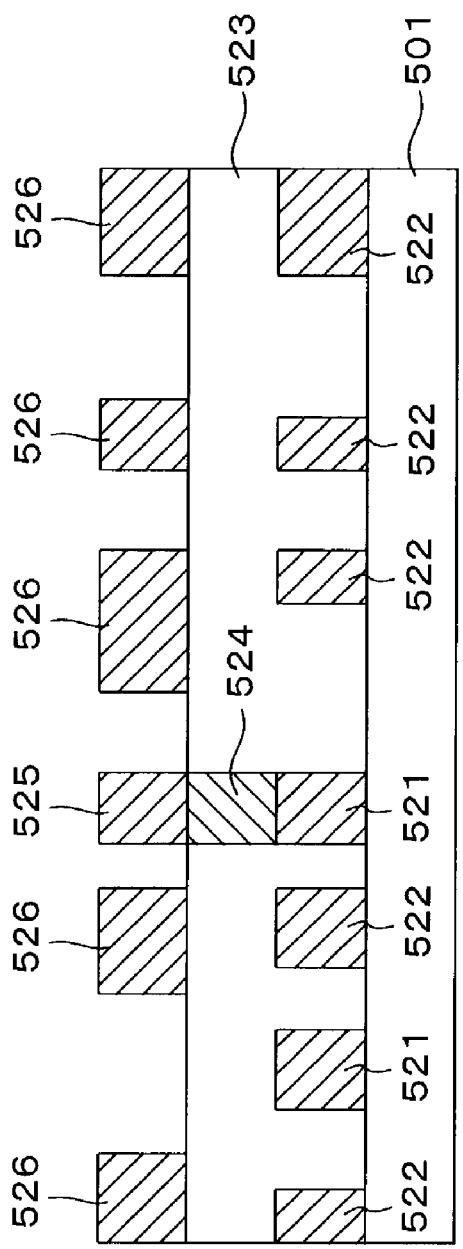
FIG. 85A is a cross-section view along I—I line of FIG. 84.
Figure 85B:
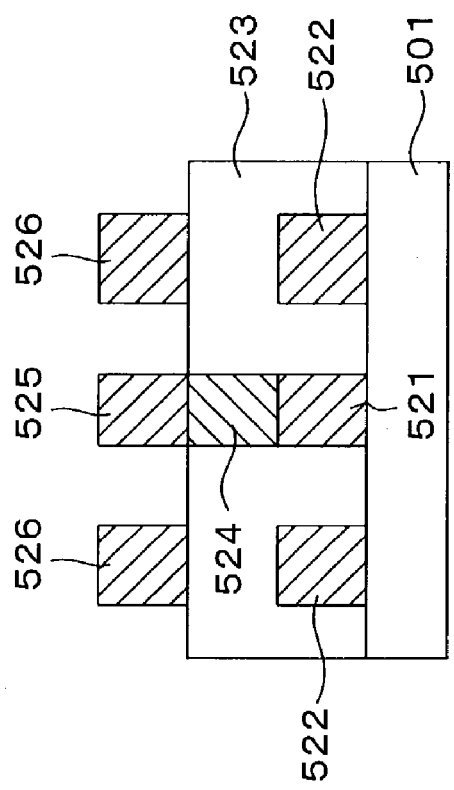
FIG. 85B is a cross-section view along II—II line of FIG. 84.

FIG. 84 is a top plan view showing a monitor pattern of a semiconductor device of a twenty-eighth embodiment of the present invention, FIG. 85A is a cross-section view along I—I line of FIG. 84, and FIG. 85B is a cross-section view along II—II line of FIG. 84.

On the semiconductor substrate 501, a plurality of lower-layer wirings (resistive elements) 521 on a first interlayer insulation film (not shown) are formed. These lower-layer wirings 521 are covered with a second interlayer insulation film 523, and on the second interlayer insulation film 523, a plurality of upper-layer wirings (resistive elements) 525 are formed.

These lower-layer and upper-layer wirings 521 and 525 are disposed alternately along one virtual line 520 extending in the extension direction of the monitor pattern while turning zigzag. Note that the lower-layer wirings 521 mutually adjacent to each other are disposed in such a manner that their center lines intersect at 90° angle.

In the second interlayer insulation film 523, a plurality of contact vias 524 are buried, by which the lower-layer wirings 521 and the upper-layer wirings 525 are electrically connected in series.

In the same wiring layer as that of the lower-layer wirings 521, a lattice lower-layer dummy pattern 522 is formed, which surrounds the respective lower-layer wirings 521 independently. Moreover, also in the same wiring layer as that of the upper-layer wirings 525, an upper-layer dummy pattern 526 is formed, which surrounds the respective upper-layer wirings 525 independently. Note that the upper-layer wirings 525 positioned at ends of the monitor pattern extend out of the upper-layer dummy pattern 526 through notched portions of the upper-layer dummy pattern 526.

Also in this embodiment, the lower-layer wirings 521 and the lower-layer dummy pattern 522 are formed simultaneously with lower-layer wirings of the chip formation portion, the contact vias 524 are formed simultaneously with contact vias of the chip formation portion, and the upper-layer wirings 525 and the upper-layer dummy pattern 526 are formed simultaneously with upper-layer wirings of the chip formation portion.

Also in this embodiment, the space between the lower-layer wirings 521 and the lower-layer dummy pattern 522 and the space between the upper-layer wirings 525 and the upper-layer dummy pattern 526 are set in accordance with, for example, the minimum space between the wirings of the chip formation portion. Thus, an effect similar to that of the first embodiment can be obtained.

What is claimed is:

1. A monitor pattern of a semiconductor device, which is formed together with elements constituting the semiconductor device and detects presence of failure occurring in manufacturing steps, comprising:

a plurality of diffused resistors formed by introducing impurities into a semiconductor substrate;

a plurality of resistive elements on an insulation film formed above the semiconductor substrate;

a plurality of contact vias buried in the insulation film, which connect the plurality of diffused resistors and the plurality of resistive elements in series; and a dummy pattern formed close to the resistive elements in the same wiring layer as that of the resistive elements.

2. The monitor pattern of the semiconductor device according to claim 1, wherein the resistive elements and the dummy pattern are formed by use of the same material as that of wirings connected to the elements of the semiconductor device.

3. The monitor pattern of the semiconductor device according to claim 1, wherein a space between the resistive elements and the dummy pattern is set equivalent to a minimum space between wirings, which is decided based on design criteria.

4. The monitor pattern of the semiconductor device according to claim 1, wherein a space between the resistive elements and the dummy pattern is set in accordance with a minimum space between wirings of a chip formation portion.

5. The monitor pattern of the semiconductor device according to claim 1, wherein an aspect ratio in etching between the resistive elements and the dummy pattern (a thickness of a resistive element material+a thickness of a mask material/a distance between a resistive element and a dummy pattern) is 3 or more.

6. The monitor pattern of the semiconductor device according to claim 1, wherein the dummy pattern extends from a tip of the resistive element by ½ of a width of the resistive element or more.

7. The monitor pattern of the semiconductor device according to claim 1, wherein the dummy pattern is formed in a lattice shape surrounding the plurality of resistive elements individually.

8. The monitor pattern of the semiconductor device according to claim 1, wherein the dummy pattern is formed in a shape surrounding a tip of the resistive element from three directions and the resistive element and the dummy pattern overlap with each other by ½ or more of a width of the resistive element.

9. The monitor pattern of the semiconductor device according to claim 1, wherein the contact vias are disposed at ends of the resistive element.

10. The monitor pattern of the semiconductor device according to claim 1, wherein the contact vias are disposed at positions away inward from ends of the resistive elements by a specific distance.

11. The monitor pattern of the semiconductor device according to claim 1, wherein the contact vias are disposed at positions shifted in a width direction of the resistive element from a center line of the resistive element.

12. The monitor pattern of the semiconductor device according to claim 1, wherein the dummy pattern is constituted by a first cell in which the contact vias are disposed away inward from ends of the resistive element by a certain distance and at a position shifted in a width direction of the resistive element from a center line of the resistive element, a second cell in which the contact vias are disposed at the ends of the resistive element and at a position shifted in the width direction of the resistive element from the center line of the resistive element and a third cell in which the contact vias are disposed at the ends of the resistive element.

13. The monitor pattern of the semiconductor device according to claim 1, wherein a center line of the resistive element obliquely intersects with an extension direction of a monitor pattern.

* * * * *